(12) United States Patent
Lee et al.

(10) Patent No.: US 11,100,968 B2
(45) Date of Patent: Aug. 24, 2021

(54) MEMORY SYSTEMS HAVING A PLURALITY OF MEMORY DEVICES AND METHODS OF TRAINING THE MEMORY SYSTEMS

(71) Applicant: SK hynix Inc., Icheon-si (KR)

(72) Inventors: Seong Ju Lee, Hwaseong-si (KR); Yun Tack Han, Anyang-si (KR); Byung Deuk Jeon, Seongnam-si (KR); Kyu Tae Park, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/722,521

(22) Filed: Dec. 20, 2019

(65) Prior Publication Data

US 2020/0342923 A1    Oct. 29, 2020

(30) Foreign Application Priority Data

Apr. 24, 2019    (KR) .......... 10-2019-0048089

(51) Int. Cl.
| | |
|---|---|
| *G11C 8/00* | (2006.01) |
| *G11C 7/22* | (2006.01) |
| *G11C 7/10* | (2006.01) |
| *G01R 31/317* | (2006.01) |
| *G11C 29/44* | (2006.01) |
| *G11C 8/18* | (2006.01) |

(52) U.S. Cl.
CPC ........ *G11C 7/222* (2013.01); *G01R 31/31725* (2013.01); *G11C 7/1066* (2013.01); *G11C 8/18* (2013.01); *G11C 29/44* (2013.01)

(58) Field of Classification Search
CPC ......... G11C 7/222; G11C 7/1066; G11C 8/18; G11C 29/44; G01R 31/31725
See application file for complete search history.

(56) References Cited

U.S. PATENT DOCUMENTS

| | | | | |
|---|---|---|---|---|
| 6,166,990 A | * | 12/2000 | Ooishi ..................... | G11C 7/22 365/194 |
| 8,520,455 B2 | * | 8/2013 | Ross ........................ | G11C 8/18 365/193 |
| 9,620,183 B2 | * | 4/2017 | Jeddeloh ............... | G11C 7/1006 |
| 2010/0103746 A1 | * | 4/2010 | Ma ........................ | H03L 7/0812 365/189.05 |
| 2012/0242385 A1 | * | 9/2012 | Tokuhiro ............ | G06F 13/1689 327/158 |

* cited by examiner

*Primary Examiner* — Tuan T Nguyen
(74) *Attorney, Agent, or Firm* — William Park & Associates Ltd.

(57) ABSTRACT

A memory system includes a representative memory device directly outputting a representative data strobe signal, at least one non-representative memory device outputting a non-representative data strobe signal through the representative memory device, and a controller generating an internal delay clock signal synchronized with the representative data strobe signal. The controller outputs a test mode code defining a delay time using the internal delay clock signal as a reference signal. The at least one non-representative memory device adjusts a phase of the non-representative data strobe signal such that the non-representative data strobe signal has a delay time corresponding to the test mode code.

21 Claims, 53 Drawing Sheets

| TM<11> | TM<10> | TM<9> | TM<8> | TM<7> | TM<6> | TM<5> | TM<4> | TM<3> | TM<2> | TM<1> | TM<0> | |
|---|---|---|---|---|---|---|---|---|---|---|---|---|
| 1 | 1 | 1 | 1 | 1 | 0 | 0 | 0 | 0 | 0 | 0 | 1 | TM code +N (Delay +420ps) |
| 1 | 1 | 1 | 1 | 0 | 0 | 0 | 1 | 0 | 0 | 0 | 1 | TM code +2 (Delay +60ps) |
| 1 | 1 | 0 | 1 | 0 | 0 | 0 | 1 | 0 | 0 | 0 | 1 | TM code +1 (Delay +30ps) |
| 1 | 0 | 0 | 0 | 0 | 0 | 0 | 1 | 0 | 0 | 0 | 1 | TM code 0 (Default) |
| 0 | 0 | 0 | 1 | 0 | 0 | 0 | 1 | 0 | 0 | 0 | 1 | TM code -1 (Delay -30ps) |
| 0 | 0 | 0 | 0 | 0 | 0 | 0 | 1 | 0 | 0 | 0 | 1 | TM code -2 (Delay -60ps) |
| 0 | 0 | 0 | 0 | 0 | 0 | 0 | 0 | 0 | 0 | 1 | 1 | TM code -N (Delay -420ps) |

| DLL Replica Delay TM | | | | | | |
|---|---|---|---|---|---|---|
| Delay amount | B5 | B4 | B3 | B2 | B1 | B0 |
| +630 | 0 | 0 | 0 | 0 | 0 | 0 |
| +610 | 0 | 0 | 0 | 0 | 0 | 1 |
| +590 | 0 | 0 | 0 | 0 | 1 | 0 |
| +570 | 0 | 0 | 0 | 0 | 1 | 1 |
| +550 | 0 | 0 | 0 | 1 | 0 | 0 |
| +530 | 0 | 0 | 0 | 1 | 0 | 1 |
| +510 | 0 | 0 | 0 | 1 | 1 | 0 |
| +490 | 0 | 0 | 0 | 1 | 1 | 1 |
| +470 | 0 | 0 | 1 | 0 | 0 | 0 |
| +450 | 0 | 0 | 1 | 0 | 0 | 1 |
| ⋮ | ⋮ | ⋮ | ⋮ | ⋮ | ⋮ | ⋮ |
| +190 | 0 | 1 | 0 | 1 | 1 | 0 |
| +170 | 0 | 1 | 0 | 1 | 1 | 1 |
| +150 | 0 | 1 | 1 | 0 | 0 | 0 |
| +130 | 0 | 1 | 1 | 0 | 0 | 1 |
| +110 | 0 | 1 | 1 | 0 | 1 | 0 |
| +90 | 0 | 1 | 1 | 0 | 1 | 1 |
| +70 | 0 | 1 | 1 | 1 | 0 | 0 |
| +50 | 0 | 1 | 1 | 1 | 0 | 1 |
| +30 | 0 | 1 | 1 | 1 | 1 | 0 |
| +10 | 0 | 1 | 1 | 1 | 1 | 1 |
| -10 | 1 | 0 | 0 | 0 | 0 | 0 |
| -30 | 1 | 0 | 0 | 0 | 0 | 1 |
| -50 | 1 | 0 | 0 | 0 | 1 | 0 |
| -70 | 1 | 0 | 0 | 0 | 1 | 1 |
| -90 | 1 | 0 | 0 | 1 | 0 | 0 |
| -110 | 1 | 0 | 0 | 1 | 0 | 1 |
| -130 | 1 | 0 | 0 | 1 | 1 | 0 |
| -150 | 1 | 0 | 0 | 1 | 1 | 1 |
| -170 | 1 | 0 | 1 | 0 | 0 | 0 |
| -190 | 1 | 0 | 1 | 0 | 0 | 1 |
| ⋮ | ⋮ | ⋮ | ⋮ | ⋮ | ⋮ | ⋮ |
| -450 | 1 | 1 | 0 | 1 | 1 | 0 |
| -470 | 1 | 1 | 0 | 1 | 1 | 1 |
| -490 | 1 | 1 | 1 | 0 | 0 | 0 |
| -510 | 1 | 1 | 1 | 0 | 0 | 1 |
| -530 | 1 | 1 | 1 | 0 | 1 | 0 |
| -550 | 1 | 1 | 1 | 0 | 1 | 1 |
| -570 | 1 | 1 | 1 | 1 | 0 | 0 |
| -590 | 1 | 1 | 1 | 1 | 0 | 1 |
| -610 | 1 | 1 | 1 | 1 | 1 | 0 |
| -630 | 1 | 1 | 1 | 1 | 1 | 1 |

FIG.47

| delay time | TM code |
|---|---|
| TM code +630 | 000000 |
| TM code +610 | 000001 |
| ... | ... |
| TM code +30 | 011110 |
| TM code +10 | 011111 |
| TM code −10 | 100000 |
| TM code −30 | 100001 |
| ... | ... |
| TM code −610 | 111110 |
| TM code −630 | 111111 |

<- FIRST GROUP OF TEST MODE CODES (rows 000000 through 011111)

<- SECOND GROUP OF TEST MODE CODES (rows 100000 through 111111)

FIG.48

| delay time | TM code |  |  |  |  |  |  |  |  |
|---|---|---|---|---|---|---|---|---|---|
| TM code -10 | 100000 | | | | | | | | ← Initial TM code |
| TM code -30 | 100001 | | | | | | | | |
| ... | ... | | | | | | | | |
| TM code -310 | 101111 | | | | | | | | |
| TM code -330 | 110000 | | | | | | | | ← 1st TM code (TM<5>=1) |
| TM code -360 | 110001 | | | | | | | | |
| ... | ... | | | | | | | | |
| TM code -610 | 111110 | | | | | | | | |
| TM code -630 | 111111 | | | | | | | | |

SECOND GROUP OF TEST MODE CODES

FIG.49

| delay time | TM code |                |
|------------|---------|----------------|
| -10ps      | 100000  | <- Initial TM code |
| -30ps      | 100001  |                |
| -170ps     | 101000  |                |
| -360ps     | 110001  | <- 1st TM code (TM<5>=1) |
| -390ps     | 110010  |                |
| -490ps     | 111000  | <- 2nd TM code (TM<5>=1, TM<4>=1) |
| -610ps     | 111110  |                |
| -630ps     | 111111  | <- max- TM code |

SECOND GROUP OF TEST MODE CODES

FIG.50

| delay time | TM code | |
|---|---|---|
| -10ps | 100000 | <- Initial TM code |
| -30ps | 100001 | |
| -360ps | 110001 | <- 1st TM code (TM<5>=1) |
| -390ps | 110011 | |
| -410ps | 110100 | <- 3rd TM code (TM<5>=1, TM<4>=1, TM<3>=0) |
| -430ps | 110101 | |
| -490ps | 111000 | <- 2nd TM code (TM<5>=1, TM<4>=1) |
| -610ps | 111110 | |
| -630ps | 111111 | <- max- TM code |

SECOND GROUP OF TEST MODE CODES

FIG.51

| delay time | TM code | |
|---|---|---|
| -10ps | 100000 | <- Initial TM code |
| -30ps | 100001 | |
| -360ps | 110001 | <- 1st TM code (TM<5>=1) |
| -390ps | 110011 | |
| -410ps | 110100 | <- 3rd TM code (TM<5>=1, TM<4>=1, TM<3>=0) |
| -430ps | 110101 | |
| -450ps | 110110 | <- 4th TM code (TM<5>=1, TM<4>=1, TM<3>=0, TM<2>=1) |
| -470ps | 110111 | |
| -490ps | 111000 | <- 2nd TM code (TM<5>=1, TM<4>=1) |
| -630ps | 111111 | <- max- TM code |

SECOND GROUP OF TEST MODE CODES (spans rows from 110001 to 111000)

FIG.52

| delay time | TM code | |
|---|---|---|
| -10ps | 100000 | <- Initial TM code |
| -30ps | 100001 | |
| -360ps | 110001 | <- 1st TM code (TM<5>=1) |
| -390ps | 110011 | <- 3rd TM code (TM<5>=1, TM<4>=1, TM<3>=0) |
| -410ps | 110100 | <- 4th TM code (TM<5>=1, TM<4>=1, TM<3>=0, TM<2>=1) |
| -430ps | 110101 | |
| -450ps | 110110 | <- 5th TM code (TM<5>=1, TM<4>=1, TM<3>=0, TM<2>=1, TM<1>=1) |
| -470ps | 110111 | |
| -490ps | 111000 | <- 2nd TM code (TM<5>=1, TM<4>=1) |
| -630ps | 111111 | <- max- TM code |

SECOND GROUP OF TEST MODE CODES

FIG.53

| delay time | TM code | |
|---|---|---|
| -10ps | 100000 | <- Initial TM code |
| -30ps | 100001 | |
| -360ps | 110001 | |
| -390ps | 110011 | |
| -410ps | 110100 | |
| -430ps | 110101 | |
| -450ps | 110110 | <- 6th TM code (TM<5>=1, TM<4>=1, TM<3>=0, TM<2>=1, TM<1>=1, TM<0>=0) |
| -470ps | 110111 | <- 5th TM code (TM<5>=1, TM<4>=1, TM<3>=0, TM<2>=1, TM<1>=1) |
| -490ps | 111000 | |
| -630ps | 111111 | <- max- TM code |

SECOND GROUP OF TEST MODE CODES

MEMORY SYSTEMS HAVING A PLURALITY OF MEMORY DEVICES AND METHODS OF TRAINING THE MEMORY SYSTEMS

CROSS-REFERENCE TO RELATED APPLICATIONS

The present application claims priority under 35 U.S.C 119(a) to Korean Application No. 10-2019-0048089, filed on Apr. 24, 2019, which is incorporated herein by references in its entirety.

BACKGROUND

1. Technical Field

Various embodiments of the disclosed technology generally relate to memory systems and, more particularly, to memory systems having a plurality of memory devices and methods of training the memory systems.

2. Related Art

Semiconductor memory devices are memory devices that are realized using semiconductor materials such as silicon, germanium, gallium arsenide, indium phosphide, or the like. The semiconductor memory devices may be typically categorized as either volatile memory devices or nonvolatile memory devices. The volatile memory devices lose their stored data when their power supplies are interrupted. For example, the volatile memory devices may include static random access memory (SRAM) devices, dynamic random access memory (DRAM) devices and synchronous dynamic random access memory (SDRAM) devices. In contrast, the nonvolatile memory devices retain their stored data even when their power supplies are interrupted. The nonvolatile memory devices may include read only memory (ROM) devices, programmable read only memory (PROM) devices, erasable programmable read only memory (EPROM) devices, electrically erasable programmable read only memory (EEPROM) devices, flash memory devices, phase change random access memory (PRAM) devices, magnetic random access memory (MRAM) devices, resistive random access memory (RRAM) devices, ferroelectric random access memory (FRAM) devices and etc.

In general, accessing the memory devices may be achieved using a controller. For example, in order to perform a read operation from a memory device, a host may output a read command and an address to a controller and the controller may transmit data to the host after reading out the data from the memory device. In addition, in order to perform a write operation to the memory device, the host outputs a write command, write data, and an address to the controller, and the controller may store the write data into the memory device. While accessing the memory device, a data strobe signal (also, denoted by an abbreviated term "DQS") outputted from the memory device might not be synchronized with an internal clock signal in the controller and cause occurrence of a timing skew. Thus, it may be necessary to execute a training operation of the memory device in order to minimize the timing skew. The training operation of the memory device may be executed by delaying the internal clock signal using the data strobe signal DQS outputted from the memory device as a reference signal. In order to delay the internal clock signal for execution of the training operation, the controller may be designed to include a delay block that delays the internal clock signal used in the controller to synchronize the internal clock signal with the data strobe signal DQS.

In the event that a memory system includes a plurality of memory devices, the plurality of memory devices may have different timing skews due to variation of process/voltage/temperature (PVT) conditions of the memory devices and an environment difference between channels of the memory devices. Accordingly, it may be necessary to execute the training operations for all of the plurality of the memory devices. In such a case, in order to suppress occurrence of the timing skew of the memory device to be accessed among the plurality of the memory devices, a plurality of delay blocks, the number of which is equal to the number of the memory devices, may be required to delay the internal clock signal in the controller. This may cause increase of an area of the controller.

SUMMARY

According to an embodiment, a memory system includes a representative memory device configured to directly output a representative data strobe signal, at least one non-representative memory device configured to output a non-representative data strobe signal through the representative memory device, and a controller configured to generate an internal delay clock signal which is synchronized with the representative data strobe signal. The controller is configured to output a test mode code defining a delay time using the internal delay clock signal as a reference signal. The at least one non-representative memory device adjusts a phase of the non-representative data strobe signal such that the non-representative data strobe signal has a delay time corresponding to the test mode code.

According to another embodiment, there is provided a method of training a memory system including a representative memory device directly outputting a representative data strobe signal, at least one non-representative memory device outputting a non-representative data strobe signal through the representative memory device, and a controller synchronized with an internal delay clock signal to process the representative data strobe signal or the non-representative data strobe signal. The method includes controlling a delay time of the internal delay clock signal such that a phase of the internal delay clock signal is consistent with a phase of the representative data strobe signal and controlling a delay time of the non-representative data strobe signal inputted to the controller through the representative memory device such that a phase of the non-representative data strobe signal is consistent with a phase of the internal delay clock signal whose delay time is controlled.

BRIEF DESCRIPTION OF THE DRAWINGS

Certain features of the disclosed technology are illustrated by various embodiments with reference to the attached drawings, in which:

FIG. 14 is an example of a test mode code table stored in a delay code register of the controller shown in FIG. 6 in case that the delay circuit shown in FIGS. 12 and 13 is employed;

FIG. 26 is a block diagram more fully illustrating steps 230-1 to 230-4 of FIG. 23;

FIG. 41 illustrates an example of a test mode code table included in the controller of FIG. 39;

FIGS. 47 to 53 illustrate a process of selecting a test mode code using a successive approximation register (SAR) method in an example shown in FIG. 46.

DETAILED DESCRIPTION OF THE EMBODIMENTS

In the following description of the embodiments, it will be understood that the terms "first" and "second" are intended to identify an element, but not used to define only the element itself or to mean a particular sequence. In addition, when an element is referred to as being located "on", "over", "above", "under" or "beneath" another element, it is intended to mean relative position relationship, but not used to limit certain cases that the element directly contacts the other element, or at least one intervening element is present therebetween. Accordingly, the terms such as "on", "over", "above", "under", "beneath", "below" and the like that are used herein are for the purpose of describing particular embodiments only and are not intended to limit the scope of the present disclosure. Further, when an element is referred to as being "connected" or "coupled" to another element, the element may be electrically or mechanically connected or coupled to the other element directly, or may form a connection relationship or coupling relationship by replacing the other element therebetween.

Various embodiments are directed to memory systems having a plurality of memory devices and methods of training the memory systems.

Figure 1:
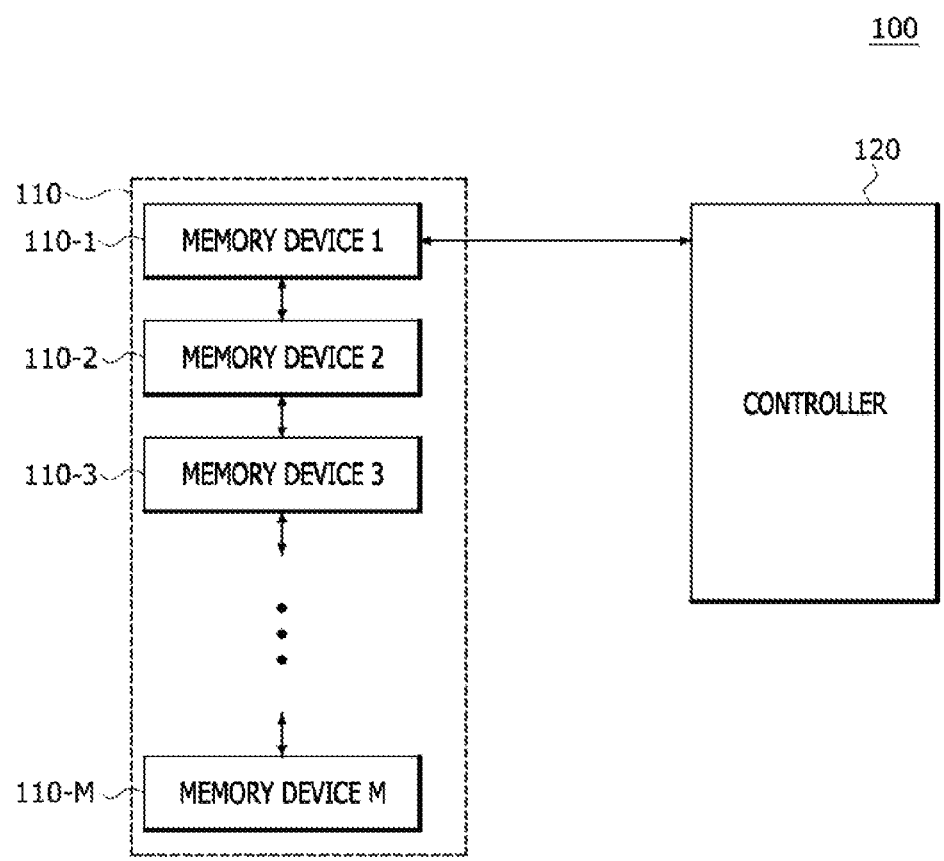
FIG. 1 is a block diagram illustrating a memory system according to an embodiment of the present disclosure.

FIG. 1 is a block diagram illustrating a memory system 100 according to an embodiment of the present disclosure. Referring to FIG. 1, the memory system 100 is configured to include a memory medium 110 and a controller 120. The memory medium 110 may include a plurality of memory devices 110-1, 110-2, 110-3, . . . , and 110-M. In an embodiment, each of the plurality of memory devices 110-1, 110-2, 110-3, . . . , and 110-M may be realized in a chip form. The plurality of memory devices 110-1, 110-2, 110-3, . . . , and 110-M having a chip form may be vertically stacked, and the stacked memory devices 110-1, 110-2, 110-3, . . . , and 110-M may be mounted on a package substrate to constitute one memory package. The controller 120 may perform a control operation for the plurality of memory devices 110-1, 110-2, 110-3, . . . , and 110-M. In the present embodiment, the controller 120 may directly communicate with any one of the plurality of memory devices 110-1, 110-2, 110-3, . . . , and 110-M, and each of the remaining memory devices may communicate with the controller 120 through at least one of the other memory devices. For example, the controller 120 may directly communicate with a first memory device 110-1 of the plurality of memory devices 110-1, 110-2, 110-3, . . . , and 110-M, and a second memory device 110-2 of the plurality of memory devices 110-1, 110-2, 110-3, . . . , and 110-M may communicate with the controller 120 through the first memory device 110-1. A third memory device 110-3 of the plurality of memory devices 110-1, 110-2, 110-3, . . . , and 110-M may communicate with the controller 120 through the second memory device 110-2 and the first memory device 110-1. Similarly, an $M^{th}$ memory device of the plurality of memory devices 110-1, 110-2, 110-3, . . . , and 110-M may communicate with the controller 120 through the other memory devices including the first to $(M-1)^{th}$ memory devices 110-1, 110-2, 110-3, . . . , and 110-(M-1). Hereinafter, a memory device directly communicating with the controller 120 will be referred to as "a representative memory device", and the other memory devices indirectly communicating with the controller 120 through the representative memory device will be referred to as "non-representative memory devices".

Figure 2:
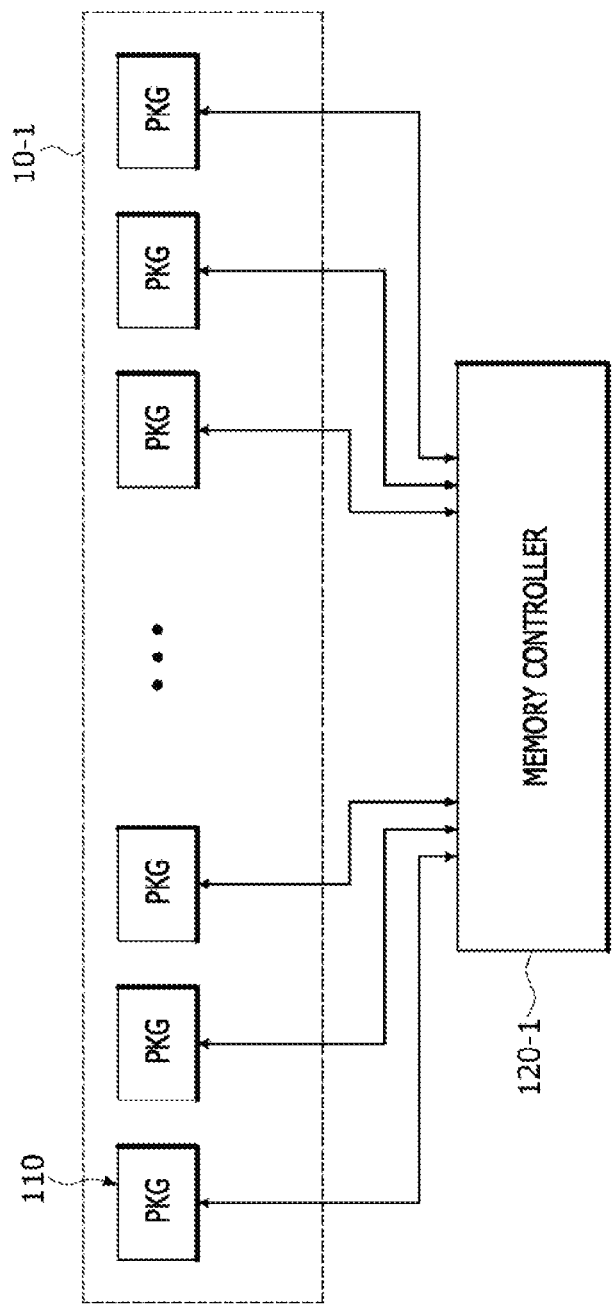
FIG. 2 is a block diagram illustrating an example of a memory module employing the memory system of FIG. 1 and a memory controller controlling the memory module.

FIG. 2 is a block diagram illustrating a memory module 10-1 employing the plurality of memory devices 110-1, . . . , and 110-M of FIG. 1 and a memory controller 120-1 controlling the memory module 10-1. Referring to FIGS. 1 and 2, the memory module 10-1 may include a plurality of memory packages 110. The plurality of memory packages 110 may have the same configuration. For example, each of the memory packages 110 may include the plurality of memory devices 110-1, 110-2, 110-3, . . . , and 110-M described with reference to FIG. 1. The memory controller 120-1 may perform various control operations for access to the plurality of memory devices 110-1, 110-2, 110-3, . . . , and 110-M of the memory packages 110 included in the memory module 10-1. Although not shown in the drawings, the memory module 10-1 may include a plurality of data buffers. In such a case, the memory controller 120-1 may communicate with the plurality of memory devices 110-1, 110-2, 110-3, . . . , and 110-M of the memory packages 110 through the data buffers. The memory controller 120-1 may also perform a control operation for training the plurality of memory devices 110-1, 110-2, 110-3, . . . , and 110-M included in each of the memory packages 110.

Figure 3:
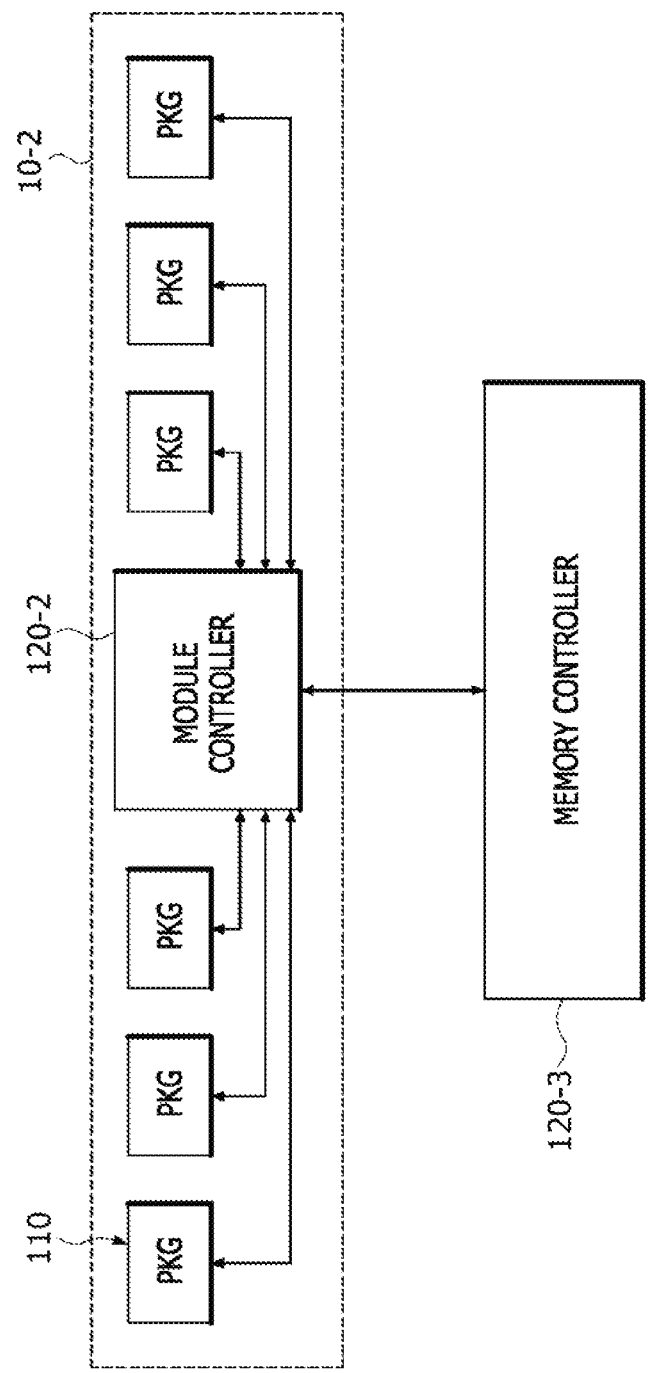
FIG. 3 is a block diagram illustrating another example of a memory module employing the memory system of FIG. 1 and a memory controller controlling the memory module.

FIG. 3 is a block diagram illustrating a memory module 10-2 employing the plurality of memory devices 110-1, 110-2, 110-3, . . . , and 110-M of FIG. 1 and a memory controller 120-3 controlling the memory module 10-2. Referring to FIGS. 1 and 3, the memory module 10-2 may include the plurality of memory packages 110 and a module controller 120-2. Each of the memory packages 110 may include the plurality of memory devices 110-1, 110-2, 110-3, . . . , and 110-M described with reference to FIG. 1. The module controller 120-2 may perform various control operations for access to the plurality of memory devices 110-1, 110-2, 110-3, . . . , and 110-M of the memory packages 110. The memory controller 120-3 may perform a control operation for the memory module 10-2 while communicating with the module controller 120-2. The plurality of memory devices 110-1, 110-2, 110-3, . . . , and 110-M of the memory packages 110 may indirectly communicate with the memory controller 120-3 through the module controller 120-2. Although not shown in the drawings, the memory module 10-2 may include a plurality of data buffers. In such a case, the memory controller 120-3 may communicate with the module controller 120-2 through the data buffers. A control operation for training the plurality of memory devices 110-1, 110-2, 110-3, . . . , and 110-M included in each of the memory packages 110 may be performed by the module controller 120-2 or the memory controller 120-3.

Figure 4:
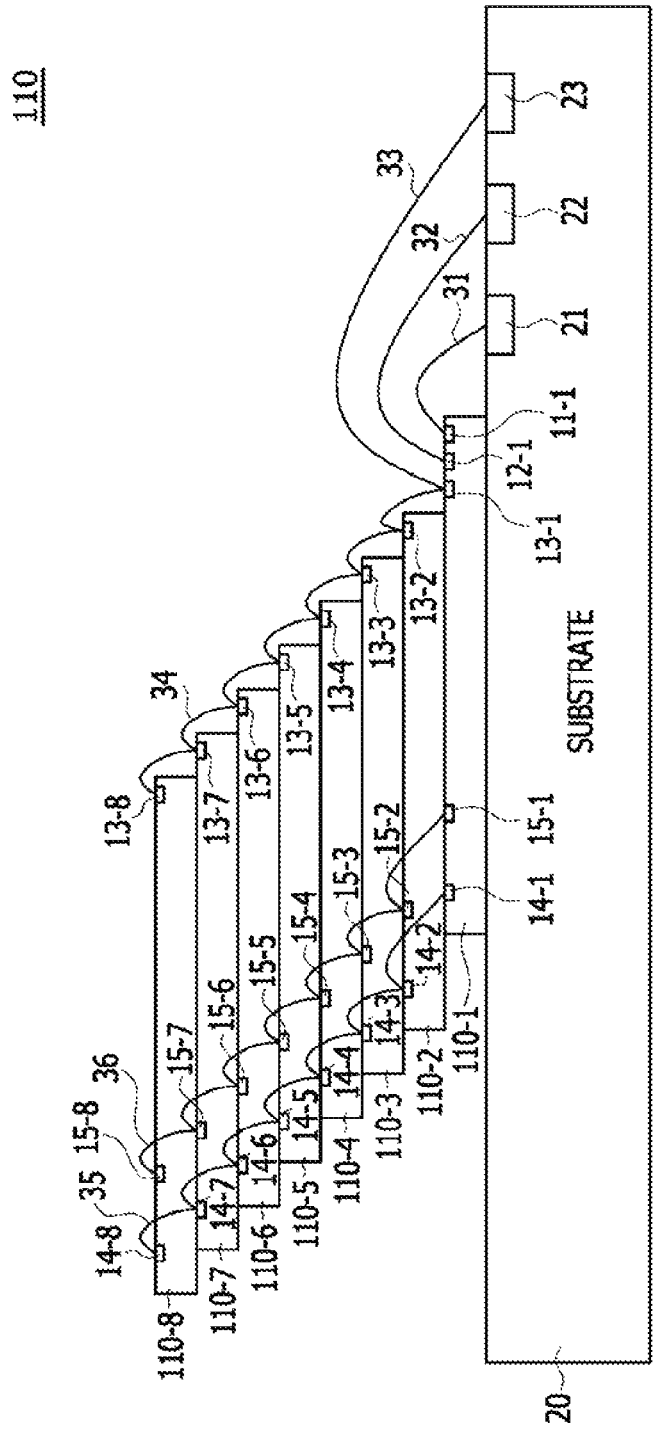
FIG. 4 is a cross-sectional view illustrating an example of a memory package shown in FIGS. 2 and 3.

FIG. 4 is a cross-sectional view illustrating an example of the memory package 110 including the plurality of memory devices 110-1, 110-2, 110-3, . . . , and 110-M. Referring to FIG. 4, the memory package 110 may be configured to include the plurality of memory devices 110-1, 110-2, 110-3, . . . , and 110-M that are vertically stacked on a substrate 20 to provide a step structure. That is, the plurality of memory devices 110-1, 110-2, 110-3, . . . , and 110-M may be stacked to be offset in a lateral direction. The first memory device 110-1 may be disposed on the substrate 20 to act as a representative memory device. A plurality of memory devices, for example, the second to eighth memory devices 110-2, 110-3, . . . , and 110-8 may be stacked on the representative memory device 110-1 to act as first to seventh non-representative memory devices. The substrate 20 may include first to third bonding pads 21, 22, and 23 which are disposed on a top surface thereof. Each of the memory devices 110-1, 110-2, 110-3, . . . , and 110-8 may be realized in a chip form. The representative memory device 110-1 may include first to fifth chip pads 11-1, 12-1, 13-1, 14-1, and 15-1 which are disposed on a top surface thereof. The first to third chip pads 11-1, 12-1, and 13-1 of the representative memory device 110-1 may be used as chip pads for communicating with an external device, for example, a controller for controlling the memory package 110. The fourth and fifth chip pads 14-1 and 15-1 of the representative memory device 110-1 may be used as chip pads for communicating with the non-representative memory devices 110-2, 110-3, . . . , and 110-8.

The first chip pad 11-1, the second chip pad 12-1 and the third chip pad 13-1 of the representative memory device 110-1 may be electrically connected to the first bonding pad 21, the second bonding pad 22 and the third bonding pad 23 through a first wire 31, a second wire 32 and a third wire 33, respectively. In an embodiment, during a normal operation such as a normal read operation and a normal write operation, the first chip pad 11-1 may be used to transmit a data strobe signal DQS, the second chip pad 12-1 may be used to transmit a data signal DQ, and the third chip pad 13-1 may be used to receive a command and an address. The data strobe signal DQS outputted through the first chip pad 11-1 of the representative memory device 110-1 may be transmitted to an external controller (e.g., the controller 120 of FIG. 1) through the first wire 31 and the first bonding pad 21 of the substrate 20. The data signal DQ outputted from the representative memory device 110-1 through the second chip pad 12-1 may be transmitted to the external controller through the second wire 32 and the second bonding pad 22 of the substrate 20. The command and the address outputted from the external controller may be transmitted to the representative memory device 110-1 through the third bonding pad 23 of the substrate 20, the third wire 33, and the third chip pad 13-1 of the representative memory device 110-1. The fourth chip pad 14-1 and the fifth chip pad 15-1 of the representative memory device 110-1 may be used to receive the data strobe signal DQS and the data signal DQ from the non-representative memory devices 110-2, 110-3, . . . , and 110-8, respectively. The fourth chip pad 14-1 and the fifth chip pad 15-1 of the representative memory device 110-1 may be electrically connected to the first chip pad 11-1 and the second chip pad 11-1 and 12-1 through interconnection lines disposed in the representative memory device 110-1, respectively.

Each of the non-representative memory devices 110-2, 110-3, . . . , and 110-8 may also include first to fifth chip pads like the representative memory device 110-1. The first and second chip pads of each of the non-representative memory devices 110-2, 110-3, . . . , and 110-8 are not used in communicating with the external controller as well as in training operations of the first to eighth memory devices 110-1, . . . , and 110-8. Thus, the first and second chip pads of each of the non-representative memory devices 110-2, 110-3, . . . , and 110-8 are not illustrated in the drawings. The third chip pads 13-1, 13-2, . . . , and 13-8 of the representative memory device 110-1 and the non-representative memory devices 110-2, 110-3, . . . , and 110-8 may be electrically connected to each other through a fourth wire 34. For example, the third chip pad 13-8 of the seventh non-representative memory device 110-8 may be electrically connected to the third chip pad 13-7 of the sixth non-representative memory device 110-7 immediately beneath the seventh non-representative memory device 110-8 through the fourth wire 34, and the third chip pad 13-7 of the sixth non-representative memory device 110-7 may be electrically connected to the third chip pad 13-6 of the fifth non-representative memory device 110-6 immediately beneath the sixth non-representative memory device 110-7 through the fourth wire 34. In the same way, the third chip pad 13-3 of the second non-representative memory device 110-3 may be electrically connected to the third chip pad 13-2 of the first non-representative memory device 110-2 immediately beneath the second non-representative memory device 110-3 through the fourth wire 34, and the third chip pad 13-2 of the first non-representative memory device 110-2 may be electrically connected to the third chip pad 13-1 of the representative memory device 110-1 immediately beneath the first non-representative memory device 110-2 through the fourth wire 34.

The fourth chip pads 14-1, 14-2, . . . , and 14-8 of the representative memory device 110-1 and the non-representative memory devices 110-2, 110-3, . . . , and 110-8 may be electrically connected to each other through a fifth wire 35. For example, the fourth chip pad 14-8 of the seventh non-representative memory device 110-8 may be electrically connected to the fourth chip pad 14-7 of the sixth non-representative memory device 110-7 immediately beneath the seventh non-representative memory device 110-8 through the fifth wire 35, and the fourth chip pad 14-7 of the sixth non-representative memory device 110-7 may be electrically connected to the fourth chip pad 14-6 of the fifth non-representative memory device 110-6 immediately beneath the sixth non-representative memory device 110-7 through the fifth wire 35. In the same way, the fourth chip pad 14-3 of the second non-representative memory device 110-3 may be electrically connected to the fourth chip pad 14-2 of the first non-representative memory device 110-2 immediately beneath the second non-representative memory device 110-3 through the fifth wire 35, and the fourth chip pad 14-2 of the first non-representative memory device 110-2 may be electrically connected to the fourth chip pad 14-1 of the representative memory device 110-1 immediately beneath the first non-representative memory device 110-2 through the fifth wire 35.

The fifth chip pads 15-1, 15-2, . . . , and 15-8 of the representative memory device 110-1 and the non-representative memory devices 110-2, 110-3, . . . , and 110-8 may be electrically connected to each other through a sixth wire 36. For example, the fifth chip pad 15-8 of the seventh non-representative memory device 110-8 may be electrically connected to the fifth chip pad 15-7 of the sixth non-representative memory device 110-7 immediately beneath the seventh non-representative memory device 110-8 through the sixth wire 36, and the fifth chip pad 15-7 of the sixth non-representative memory device 110-7 may be electrically connected to the fifth chip pad 15-6 of the fifth non-representative memory device 110-6 immediately beneath the sixth non-representative memory device 110-7 through the sixth wire 36. In the same way, the fifth chip pad 15-3 of the second non-representative memory device 110-3 may be electrically connected to the fifth chip pad 15-2 of the first non-representative memory device 110-2 immediately beneath the second non-representative memory device 110-3 through the sixth wire 36, and the fifth chip pad 15-2 of the first non-representative memory device 110-2 may be electrically connected to the fifth chip pad 15-1 of the representative memory device 110-1 immediately beneath the first non-representative memory device 110-2 through the sixth wire 36.

In each memory package 110, each of the non-representative memory devices 110-2, 110-3, . . . , and 110-8 may transmit data to the external controller through the representative memory device 110-1 or may receive the data from the external controller through the representative memory device 110-1. In an embodiment, the data strobe signal DQS outputted from the first non-representative memory device 110-2 may be transmitted to the representative memory device 110-1 through the fourth chip pad 14-2 of the first non-representative memory device 110-2, the fifth wire 35, and the fourth chip pad 14-1 of the representative memory device 110-1. The data strobe signal DQS of the first non-representative memory device 110-2 transmitted to the fourth chip pad 14-1 of the representative memory device 110-1 may be transmitted to the first chip pad 11-1 of the representative memory device 110-1, and the data strobe signal DQS of the first non-representative memory device 110-2 transmitted to the first chip pad 11-1 of the representative memory device 110-1 may be transmitted to the external controller through the first wire 31 and the first bonding pad 21 of the substrate 20.

The data strobe signal DQS outputted from the seventh non-representative memory device 110-8 may be transmitted from the fourth chip pad 14-8 of the seventh non-representative memory device 110-8 to the fourth chip pad 14-7 of the sixth non-representative memory device 110-7 immediately beneath to the seventh non-representative memory device 110-8 through the fifth wire 35. Next, the data strobe signal DQS may be transmitted to the fourth chip pad 14-6 of the fifth non-representative memory device 110-6 through the fifth wire 35. In the same way, the data strobe signal DQS may then be sequentially transmitted to the fourth chip pads 14-5, 14-4, 14-3 and, 14-2 through the fifth wire 35. Subsequently, the data strobe signal DQS of the seventh non-representative memory device 110-8 transmitted to the fourth chip pad 14-2 of the first non-representative memory device 110-2 may be transmitted into the representative memory device 110-1 through the fifth wire 35 and the fourth chip pad 14-1 of the representative memory device 110-1. The data strobe signal DQS of the seventh non-representative memory device 110-8 transmitted into the representative memory device 110-1 through the fourth chip pad 14-1 may be transmitted to the first chip pad 11-1 of the representative memory device 110-1 through an interconnection line disposed in the representative memory device 110-1. Thereafter, the data strobe signal DQS of the seventh non-representative memory device 110-8 may be transmitted to the external controller through the first wire 31 and the first bonding pad 21 of the substrate 20. The data strobe signal DQS of each of the first to sixth non-representative memory devices 110-1, . . . , and 110-7 may also be transmitted to the external controller in the same way as described above.

Figure 5:
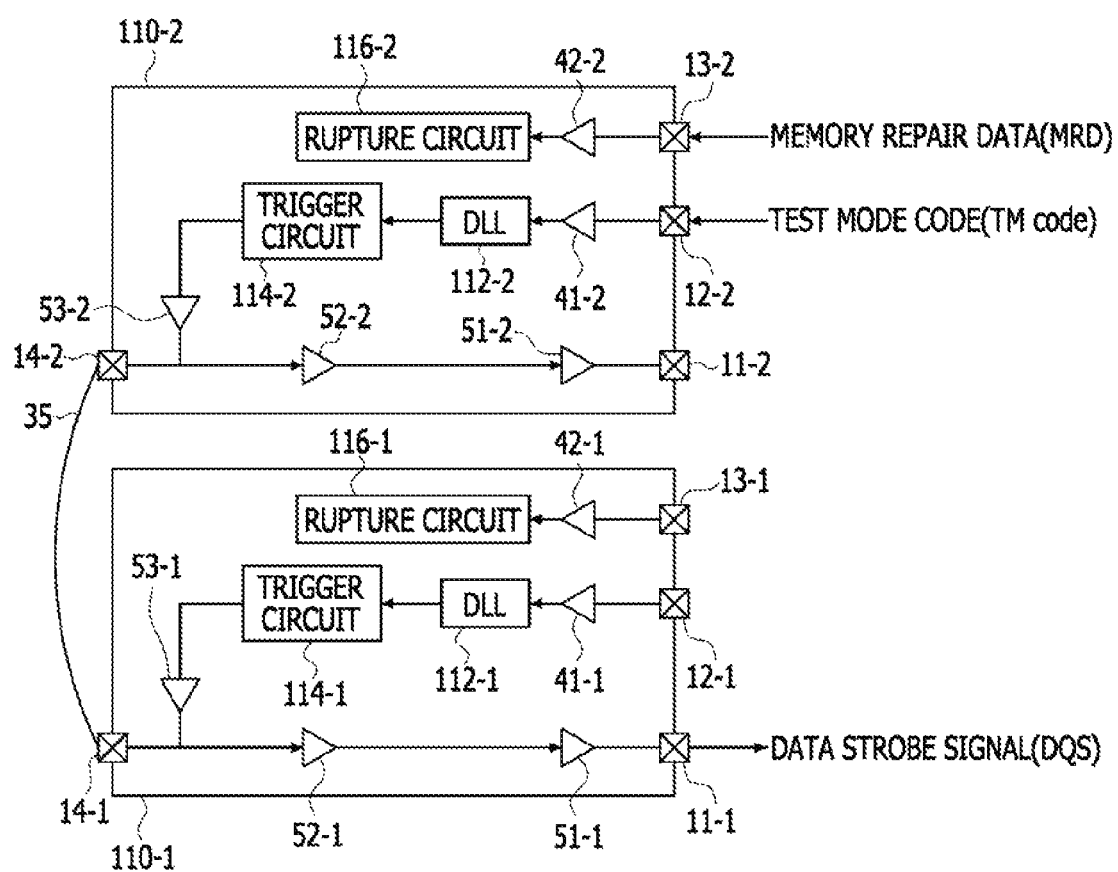
FIG. 5 is a schematic view illustrating a representative memory device and a first non-representative memory device included in the memory system of FIG. 1.

FIG. 5 is a schematic view illustrating the representative memory device 110-1 and the first non-representative memory device 110-2 included in the memory system 100 of FIG. 1. Referring to FIG. 5, the representative memory device 110-1 may include the first to fourth chip pads 11-1, 12-1, 13-1, and 14-1. The fifth chip pad 15-1 of the representative memory device 110-1 shown in FIG. 4 is unused in the training operation which is performed according to the present embodiment. Thus, the fifth chip pad 15-1 of the representative memory device 110-1 is not illustrated in FIG. 5. As described with reference to FIG. 4, during the normal operation such as the normal read operation and the normal write operation of each of the first to eighth memory devices 110-1, . . . , and 110-8, the first to third chip pads 11-1, 12-1, and 13-1 of the representative memory device 110-1 may be chip pads for transmitting the data strobe signal DQS, the data signal DQ and a command/address signal, respectively. However, during the training operation, the first to third chip pads 11-1, 12-1, and 13-1 of the representative memory device 110-1 may be used in transmission of the data strobe signal DQS, a test mode code TM_code and memory repair data MRD, respectively. The representative memory device 110-1 may include first and second receivers 41-1 and 42-1 and first to third drivers 51-1, 52-1, and 53-1. In addition, the representative memory device 110-1 may be configured to include a delay lock loop (DLL) circuit 112-1, a trigger circuit 114-1, and a rupture circuit 116-1.

The first and second receivers 41-1 and 42-1 and the first to third drivers 51-1, 52-1, and 53-1 may function as input/output (I/O) buffers of the representative memory device 110-1. The first receiver 41-1 may receive the test mode code TM_code from the external controller through the second chip pad 12-1 and may output the test mode code TM_code to an input terminal of the delay lock loop (DLL) circuit 112-1. The test mode code TM_code outputted from the external controller may be defined as data regarding delay information of a clock signal. In an embodiment, the test mode code TM_code may be binary data. The second receiver 42-1 may receive the memory repair data MRD from the external controller through third chip pad 13-1 and may output the memory repair data MRD to an input terminal of the rupture circuit 116-1. The first driver 51-1 may receive the data strobe signal DQS from the second driver 52-1 to output the data strobe signal DQS to the external controller through the first chip pad 11-1. The second driver 52-1 may receive the data strobe signal DQS of the representative memory device 110-1 from the third receiver 53-1 and may output the data strobe signal DQS of the representative memory device 110-1 to an input terminal of the first driver 51-1. When the data strobe signal DQS of the non-representative memory device, for example, the first non-representative memory device 110-2 is transmitted to the representative memory device 110-1, the second driver 52-1 may receive the data strobe signal DQS of the first non-representative memory device 110-2 from the first non-representative memory device 110-2 through the fourth chip pad 14-1 and may output the data strobe signal DQS of the first non-representative memory device 110-2 to an input terminal of the first driver 51-1. The third driver 53-1 may receive the data strobe signal DQS outputted from the trigger circuit 114-1 and may output the data strobe signal DQS to an input terminal of the second driver 52-1.

The delay lock loop (DLL) circuit 112-1 may output a delay lock loop (DLL) clock signal to the trigger circuit 114-1. The DLL clock signal outputted from the delay lock loop (DLL) circuit 112-1 may have a phase preceding by a replica delay time to be synchronized with an external clock signal, for example, an internal clock signal of the external controller. The delay lock loop (DLL) circuit 112-1 may additionally control a delay time of the DLL clock signal based on the test mode code TM_code inputted through the first receiver 41-1. The trigger circuit 114-1 may output the data strobe signal DQS that is synchronized with the DLL clock signal which is outputted from the delay lock loop (DLL) circuit 112-1 to have a controlled delay time. The data strobe signal DQS outputted from the trigger circuit 114-1 may be transmitted to the first chip pad 11-1 through the third driver 53-1, the second driver 52-1 and the first driver 51-1 included in the representative memory device 110-1. The rupture circuit 116-1 may perform a rupture operation using fuses of the representative memory device 110-1 according to the memory repair data MRD outputted from the second receiver 42-1.

Each of the first to seventh non-representative memory devices 110-2, . . . , and 110-8 may have the same configuration as the representative memory device 110-1. The configuration of the first non-representative memory device 110-2, which is described hereinafter, may be equally applicable to each of the second to seventh non-representative memory devices 110-3, . . . , and 110-8. Specifically, the first non-representative memory device 110-2 may include the first to fourth chip pads 11-2, 12-2, 13-2 and 14-2, first and second receivers 41-2 and 42-2, first to third drivers 51-2, 52-2 and 53-2, a delay lock loop (DLL) circuit 112-2, a trigger circuit 114-2 and a rupture circuit 116-2. As described with reference to FIG. 4, the data strobe signal DQS of the first non-representative memory device 110-2 may be outputted to the external controller through the representative memory device 110-1. Thus, the first and second drivers 51-2 and 52-2 and the first chip pad 11-2 of the first non-representative memory device 110-2 are not be used in transmission of the data strobe signal DQS of the first non-representative memory device 110-2. The data strobe signal DQS outputted from the trigger circuit 114-2 of the first non-representative memory device 110-2 may be transmitted to the fourth chip pad 14-1 of the representative memory device 110-1 through the third driver 53-2 and the fourth chip pad 14-2 of the first non-representative memory device 110-2 as well as the fifth wire 35. The data strobe signal DQS of the first non-representative memory device 110-2, which is transmitted to the fourth chip pad 14-1 of the representative memory device 110-1, may be transmitted to the external controller through the second driver 52-1, the first driver 51-1 and the first chip pad 11-1 of the representative memory device 110-1. Although not shown in the drawings, the data strobe signal DQS outputted from the third memory device (i.e., the second non-representative memory device 110-3) may be transmitted to the external controller through the fourth chip pad 14-2 of the first non-representative memory device 110-2, the fourth chip pad 14-1 of the representative memory device 110-1, the second driver 52-1 of the representative memory device 110-1, the first driver 51-1 of the representative memory device 110-1, and the first chip pad 11-1 of the representative memory device 110-1.

Figure 6:
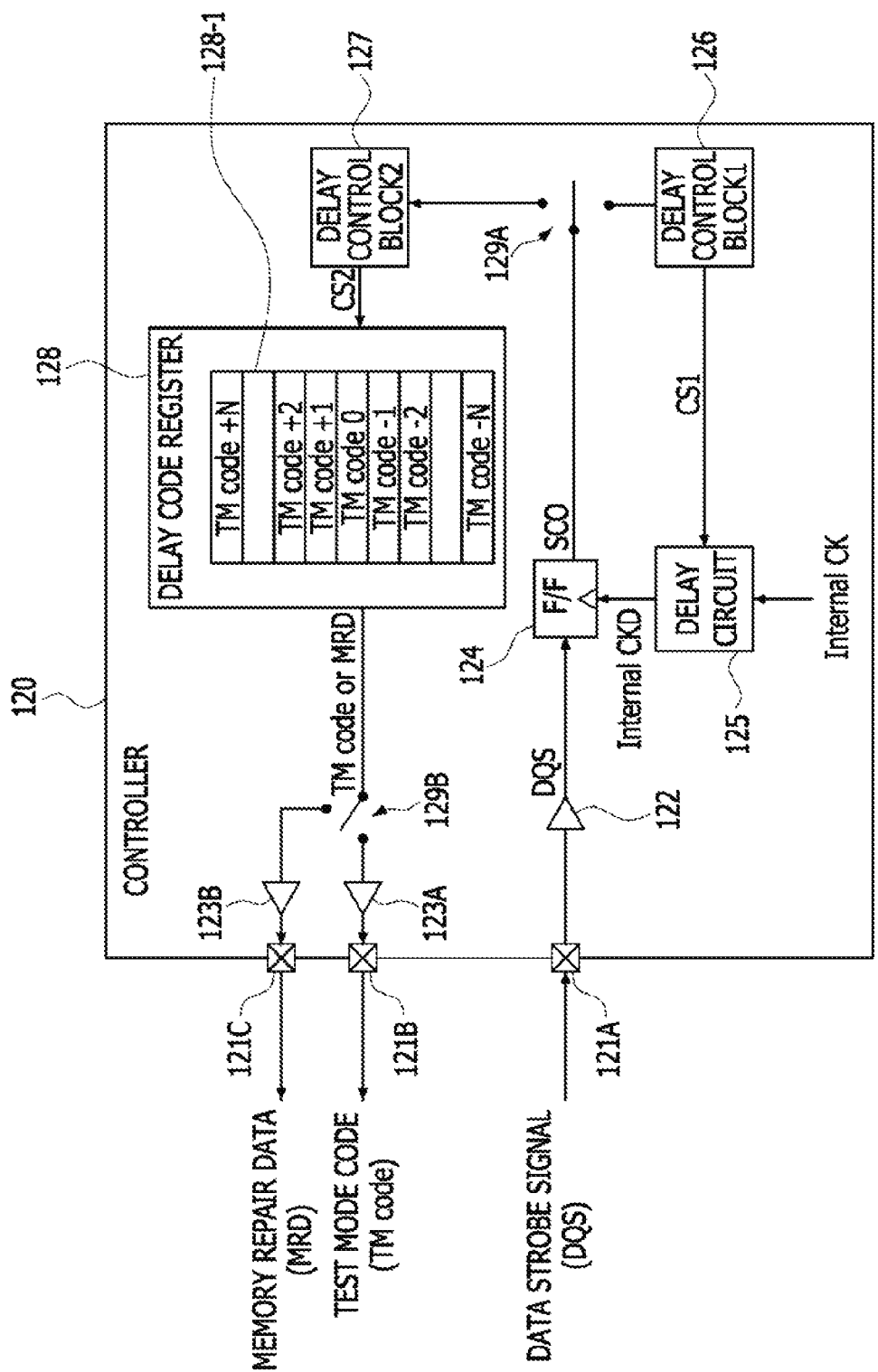
FIG. 6 is a block diagram illustrating an example of a controller included in the memory system of FIG. 1.

FIG. 6 is a block diagram illustrating an example of the controller 120 included in the memory system 100 of FIG. 1. The controller 120 may be configured to include at least three controller pads (e.g., first to third controller pads 121A, 121B and 121C), a receiver 122, two drivers (i.e., first and second drivers 123A and 123B), a sampling circuit 124, a delay circuit 125, a first delay control block 126, a second delay control block 127, a delay code register 128, and first and second switches 129A and 129B. In an embodiment, the first controller pad 121A may be a pad for transmitting the data strobe signal DQS during the normal operation of the memory devices. The second controller pad 121B may be a pad for transmitting the data signal DQ during the normal operation of the memory devices. The third controller pad 121C may be a pad for transmitting the command/address signal during the normal operation of the memory devices. During the training operation of the memory devices, the first controller pad 121A may be used to receive the data strobe signal DQS from the memory device performing the training operation and the second controller pad 121B may be used to transmit the test mode code TM_code to the memory device. In addition, the third controller pad 121C may be used to transmit the memory repair data MRD to the memory device during the training operation of the memory devices.

The receiver 122 and the first and second drivers 123A and 123B may function as I/O buffers of the controller 120. The receiver 122 may receive the data strobe signal DQS from the memory device performing the training operation and may apply the data strobe signal DQS to the sampling circuit 124. The sampling circuit 124 may perform a sampling operation of the data strobe signal DQS outputted from the receiver 122 and may output the result of the sampling operation. In an embodiment, the sampling circuit 124 may include a D-flip-flop. In such a case, the sampling circuit 124 may have an input terminal, an output terminal and a clock input terminal. An internal delay clock signal Internal_CKD of the controller 120 may be inputted to the sampling circuit 124 through the clock input terminal of the sampling circuit 124. A signal to be sampled, that is, the data strobe signal DQS transmitted through the receiver 122 may be inputted to the sampling circuit 124 through the input terminal of the sampling circuit 124. If the data strobe signal DQS is inputted to the sampling circuit 124 through the input terminal of the sampling circuit 124, the sampling circuit 124 may perform a sampling operation of the data strobe signal DQS using the internal delay clock signal Internal_CKD and may output a sampling circuit output signal SCO obtained by the sampling operation of the data strobe signal DQS through the output terminal of the sampling circuit 124. The sampling circuit output signal SCO may be a low level signal (having a value of "0" corresponding to a logic "low" level) or a high level signal (having a value of "1" corresponding to a logic "high" level).

In an embodiment, the sampling operation performed by the sampling circuit 124 may be executed using a rising edge of the internal delay clock signal Internal_CKD as a reference point in time. In such a case, if the data strobe signal DQS is a high level signal at a rising edge of the internal delay clock signal Internal_CKD, the sampling circuit 124 may output a high level signal as the sampling circuit output signal SCO. In contrast, if the data strobe signal DQS is a low level signal at a rising edge of the internal delay clock signal Internal_CKD, the sampling circuit 124 may output a low level signal as the sampling circuit output signal SCO. When a phase of the data strobe signal DQS is consistent with a phase of the internal delay clock signal Internal_CKD, that is, a rising edge of the data strobe signal DQS is consistent with a rising edge of the internal delay clock signal Internal_CKD, the sampling circuit output signal SCO may be changed from a low level signal into a high level signal or from a high level signal into a low level signal.

The delay circuit 125 may receive a first control signal CS1 from the first delay control block 126 and may output the internal delay clock signal Internal_CKD obtained by delaying an internal clock signal Internal_CK by a certain time. The internal delay clock signal Internal_CKD generated by the delay circuit 125 may be applied to the sampling circuit 124. The first delay control block 126 may apply the first control signal CS1 for delaying the internal clock signal Internal_CK to the delay circuit 125 according to the sampling circuit output signal SCO. The delay circuit 125 may output the internal delay clock signal Internal_CKD obtained by delaying the internal clock signal Internal_CK or may terminate an operation for delaying the internal clock signal Internal_CK, based on the first control signal CS1. The first switch 129A may perform a switching operation for connecting an output terminal of the sampling circuit 124 to one of the first delay control block 126 and the second delay control block 127. The first switch 129A may connect an output terminal of the sampling circuit 124 to the first delay control block 126 until the internal delay clock signal Internal_CKD generated by the delay circuit 125 is synchronized with the data strobe signal DQS inputted to the sampling circuit 124. After the internal delay clock signal Internal_CKD generated by the delay circuit 125 is synchronized with the data strobe signal DQS inputted to the sampling circuit 124, the first switch 129A may connect an output terminal of the sampling circuit 124 to the second delay control block 127.

The second delay control block 127 may output a second control signal CS2 based on the sampling circuit output signal SCO outputted from the sampling circuit 124. The second control signal CS2 may be inputted to the delay code register 128. In an embodiment, the second control signal CS2 may be a signal for increasing a delay time, a signal for reducing a delay time, or a signal for storing data or information. The delay code register 128 may include a test mode code table 128-1 having a plurality of storage regions in which test mode codes representing different delay times are respectively stored. In an embodiment, a default test mode code TM_code_0 without any delay time, positive test mode codes TM_code+1, TM_code+2, . . . , and TM_code+N for increasing the delay time by a predetermined time, and negative test mode codes TM_code−1, TM_code−2, . . . , and TM_code−N for reducing the delay time by a predetermined time may be stored in the test mode code table 128-1. "The word "predetermined" as used herein with respect to a parameter, such as a predetermined time period by which the output clock signal is delayed, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm." In an embodiment, each of the test mode codes TM_code+N, TM_code+1, TM_code_0, TM_code−1, . . . , and TM_code−N may have information on a delay time which is increased or reduced by a certain time as compared with another test mode code which is immediately adjacent thereto.

The delay code register 128 may output any one of the default test mode code TM_code_0, the positive test mode codes TM_code+1, TM_code+2, . . . , and TM_code+N, and the negative test mode codes TM_code−1, TM_code−2, . . . , and TM_code−N or may store a previous test mode code outputted from the delay code register 128, based on the second control signal CS2 outputted from the second delay control block 127. The test mode code TM_code outputted from the delay code register 128 may be inputted to the first driver 123A through the second switch 1298. The first driver 123A may transmit the test mode code TM_code to the memory device through the second controller pad 121B. In the event that the test mode code TM_code is stored in the delay code register 128 according to the second control signal CS2 outputted from the second delay control block 127, the delay code register 128 may output the memory repair data MRD including information of the test mode code TM_code that is stored in the delay code register 128. The memory repair data MRD may be inputted to the second driver 123B through the second switch 1298. The second driver 123B may transmit the memory repair data MRD to the memory device through the third controller pad 121C. While the test mode code TM_code is outputted from the delay code register 128, the second switch 1298 may connect an output terminal of the delay code register 128 to an input terminal of the first driver 123A. In contrast, while the memory repair data MRD are outputted from the delay code register 128, the second switch 1298 may connect an output terminal of the delay code register 128 to an input terminal of the second driver 123B.

Figure 7:
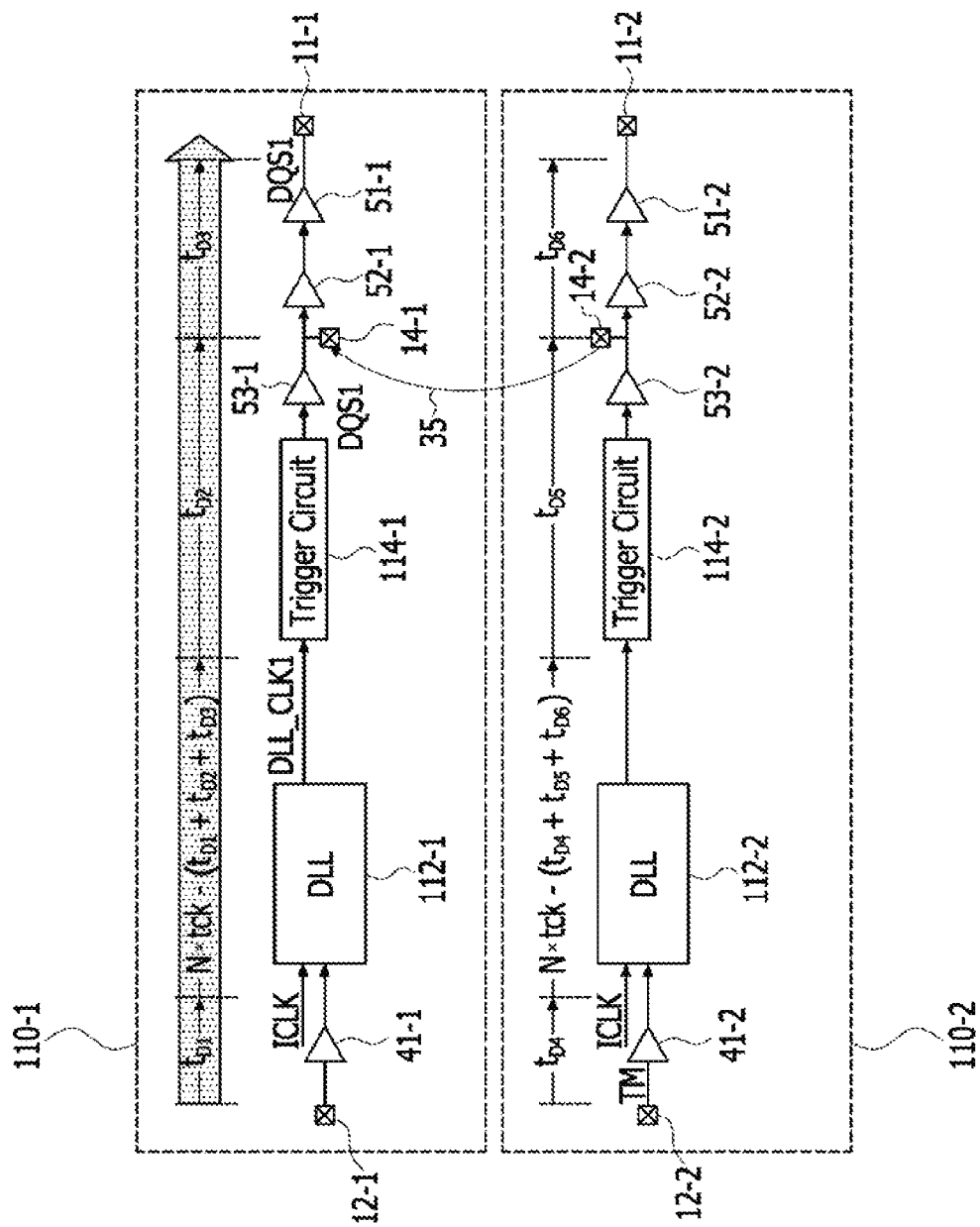
FIGS. 7 and 8 are a schematic view and a timing diagram illustrating a replica delay time and a real delay time of the representative memory device while a data strobe signal of the representative memory device of FIG. 5 is outputted, respectively.
Figure 8:
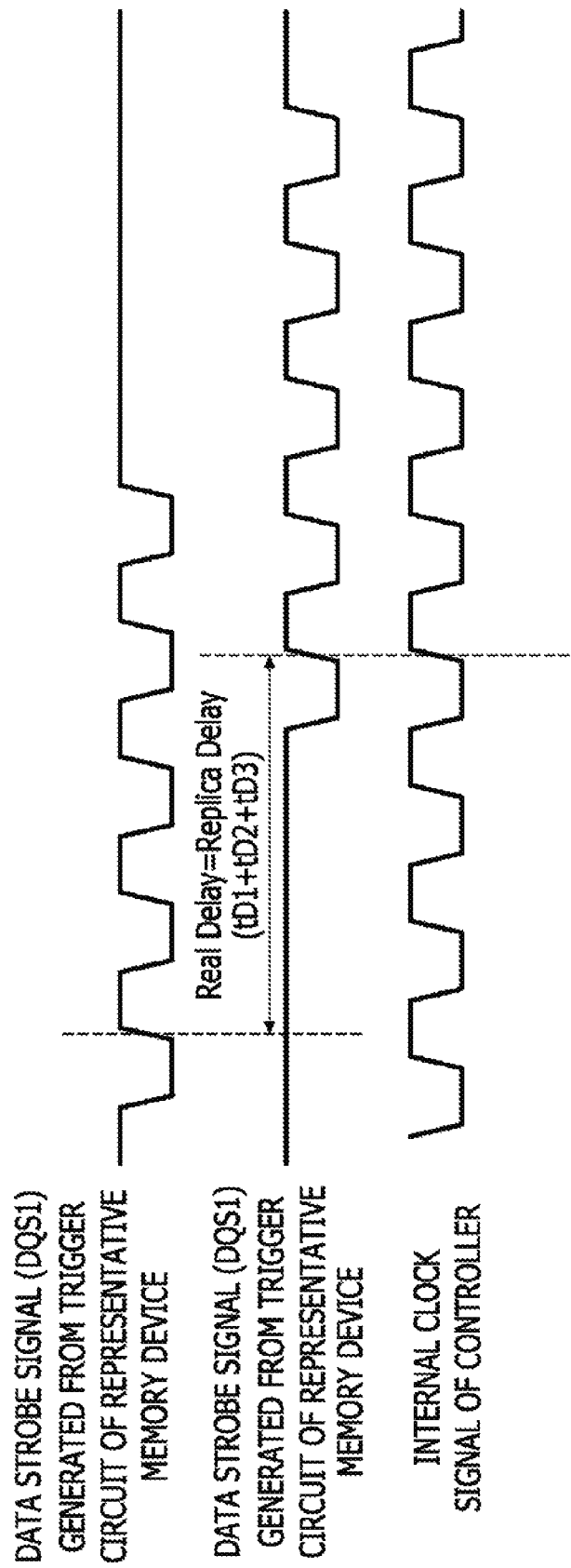

FIGS. 7 and 8 are a schematic view and a timing diagram illustrating a replica delay time and a real delay time of the representative memory device 110-1 while the data strobe signal DQS of the representative memory device 110-1 of FIG. 5 is outputted, respectively. Referring to FIGS. 7 and 8, a data strobe signal DQS1 of the representative memory device 110-1 may be generated by the trigger circuit 114-1 in synchronization with a DLL clock signal DLL_CLK1 outputted from the delay lock loop (DLL) circuit 112-1 of the representative memory device 110-1. The data strobe signal DQS1 generated by the trigger circuit 114-1 may be outputted through the third driver 53-1, the second driver 52-1, the first driver 51-1, and the first chip pad 11-1 of the representative memory device 110-1. As such, the data strobe signal DQS1 generated in the representative memory device 110-1 may be outputted from the representative memory device 110-1 after a total delay time of "tD1+tD2+tD3" elapses. The term "tD1" denotes a delay time of an input clock signal ICLK inputted to the delay lock loop (DLL) circuit 112-1, and the term "tD2" denotes a delay time corresponding to a time it takes the trigger circuit 114-1 and the third driver 53-1 to process the DLL clock signal DLL_CLK1. In addition, the term "tD3" denotes a delay time corresponding to a time it takes the second driver 52-1 and the first driver 51-1 to process an output signal of the third driver 53-1. Thus, when no phase is controlled by the delay lock loop (DLL) circuit 112-1 of the representative memory device 110-1, the data strobe signal DQS1 outputted from the representative memory device 110-1 may be delayed by a total delay time of "tD1+tD2+tD3" as compared with the data strobe signal DQS1 generated in the representative memory device 110-1. In such a case, a replica delay time of "tD1+tD2+tD3" may be generated between the input clock signal ICLK and the data strobe signal DQS1 outputted from the representative memory device 110-1.

In order to remove the replica delay time between the input clock signal ICLK and the data strobe signal DQS1 outputted from the representative memory device 110-1, the delay lock loop (DLL) circuit 112-1 of the representative memory device 110-1 may generate the DLL clock signal DLL_CLK1 in advance by the replica delay time of "tD1+tD2+tD3". In addition, the trigger circuit 114-1 may generate the data strobe signal DQS1 which is synchronized with the DLL clock signal DLL_CLK1 outputted from the delay lock loop (DLL) circuit 112-1. Accordingly, as illustrated in the timing diagram of FIG. 8, the trigger circuit 114-1 of the representative memory device 110-1 may generate the data strobe signal DQS1 in advance by the replica delay time of "tD1+tD2+tD3". In an ideal case, the replica delay time of the representative memory device 110-1 may be equal to a real delay time of the representative memory device 110-1. Thus, the data strobe signal DQS1 outputted from the representative memory device 110-1 may have a phase which is consistent with a phase of the internal clock signal of the controller at a specific point in time, for example, at a point in time when the data are read out.

Figure 9:
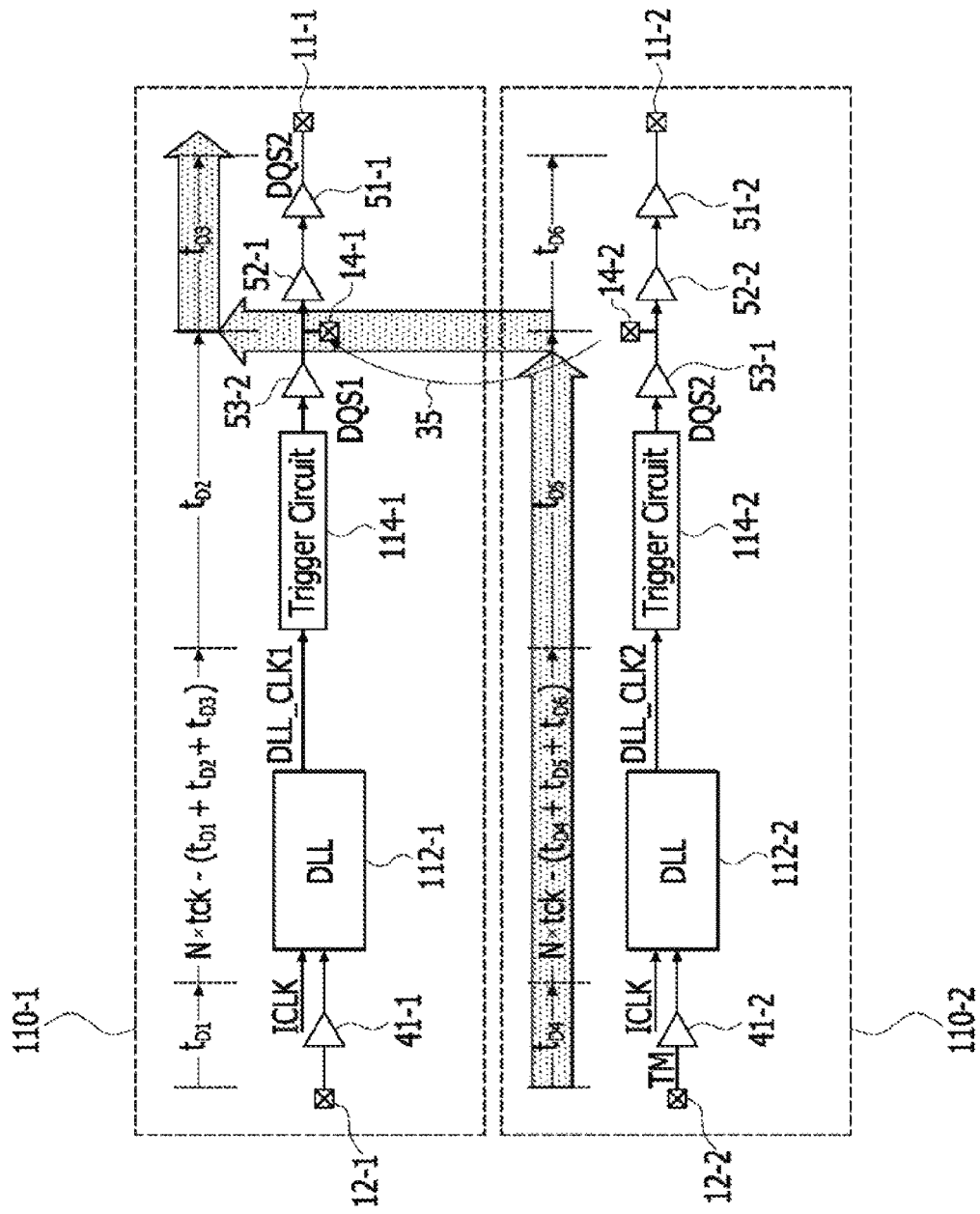
FIGS. 9 to 11 illustrate a replica delay time and a real delay time of the first non-representative memory device while a data strobe signal of the first non-representative memory device of FIG. 5 is outputted.
Figure 10:
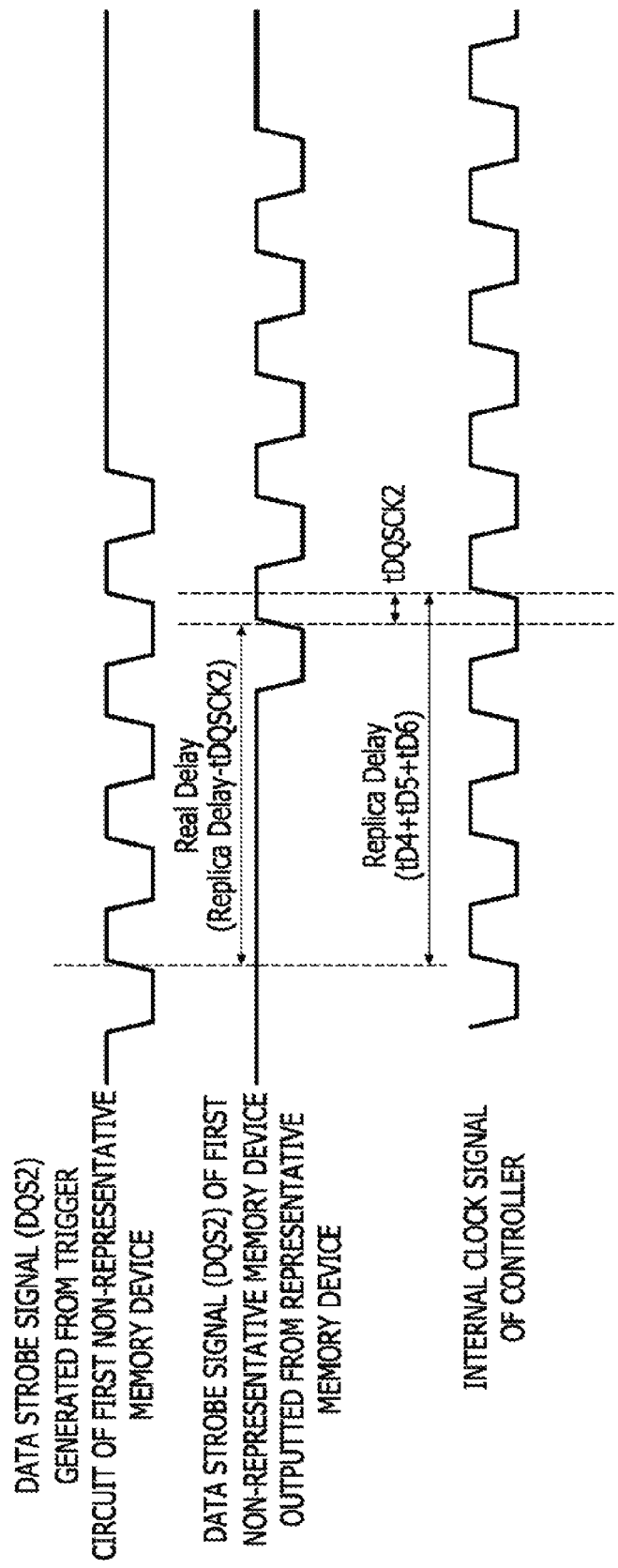
Figure 11:
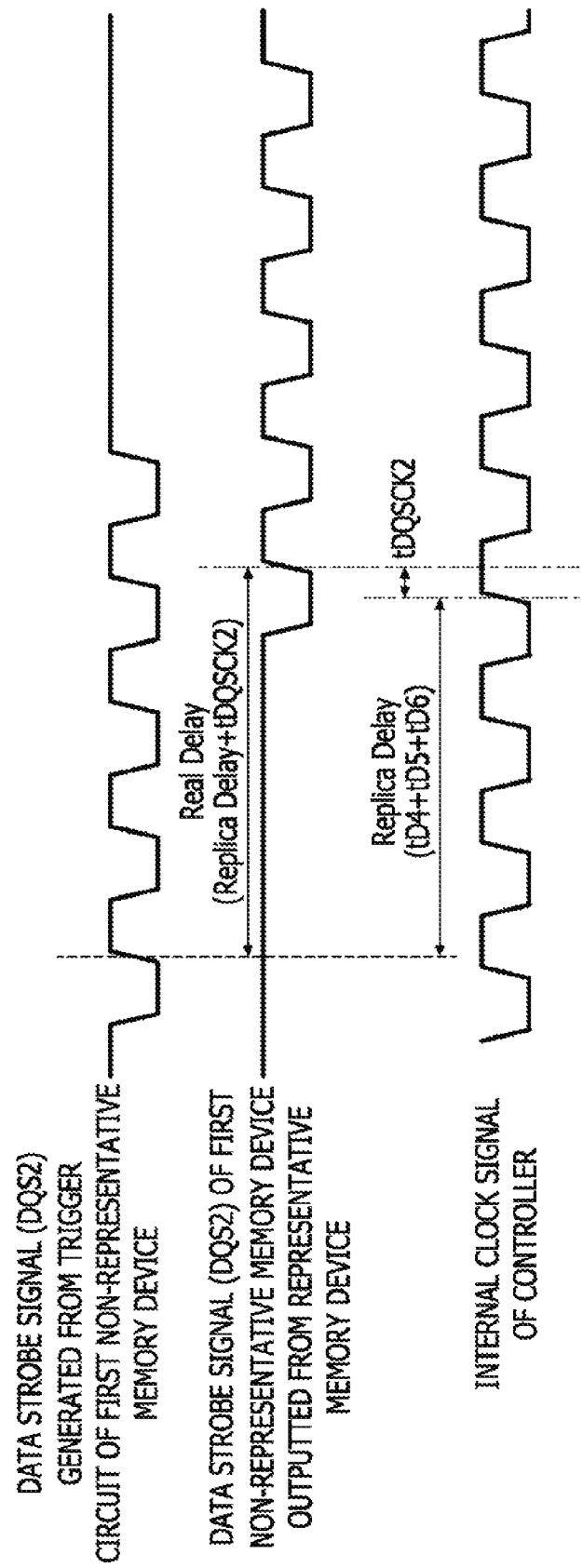

FIGS. 9 to 11 illustrate a replica delay time and a real delay time of the first non-representative memory device 110-2 while the data strobe signal DQS of the first non-representative memory device 110-2 shown in FIG. 5 is outputted. Referring to FIGS. 9 to 11, a data strobe signal DQS2 of the first non-representative memory device 110-2 may be generated by the trigger circuit 114-2 of the first non-representative memory device 110-2 in synchronization with a DLL clock signal DLL_CLK2 outputted from the delay lock loop (DLL) circuit 112-2 of the first non-representative memory device 110-2. The data strobe signal DQS2 generated by the trigger circuit 114-2 of the first non-representative memory device 110-2 may be transmitted to the fourth chip pad 14-2 of the first non-representative memory device 110-2 through the third driver 53-2 of the first non-representative memory device 110-2 and may then be transmitted to the fourth chip pad 14-1 of the representative memory device 110-1 through the fifth wire 35. The data strobe signal DQS2 of the first non-representative memory device 110-2 transmitted to the representative memory device 110-1 may be outputted through the second driver 52-1, the first driver 51-1 and the first chip pad 11-1 of the representative memory device 110-1.

As such, while the data strobe signal DQS2 of the first non-representative memory device 110-2 is outputted through the representative memory device 110-1, a phase of the DLL clock signal DLL_CLK2 outputted from the delay lock loop (DLL) circuit 112-2 of the first non-representative memory device 110-2 may be determined by a replica delay time of the first non-representative memory device 110-2. Specifically, a replica delay time of "tD4+tD5+tD6" may exist between the data strobe signal DQS2 generated by the trigger circuit 114-2 of the first non-representative memory device 110-2 and the data strobe signal DQS2 outputted through the first chip pad 11-2 of the first non-representative memory device 110-2. The term "tD4" denotes a delay time corresponding to a time that is necessary for transmission of the input clock signal ICLK which is inputted to the delay lock loop (DLL) circuit 112-2 of the first non-representative memory device 110-2, and the term "tD5" denotes a delay time corresponding to a time it takes the trigger circuit 114-2 and the third driver 53-2 to process the DLL clock signal DLL_CLK2. In addition, the term "tD6" denotes a delay time corresponding to a time it takes the second driver 52-2 and the first driver 51-2 to process an output signal of the third driver 53-2.

Accordingly, the delay lock loop (DLL) circuit 112-2 of the first non-representative memory device 110-2 may control a timing of the DLL clock signal DLL_CLK2 to output the DLL clock signal DLL_CLK2 in advance by the replica delay time of "tD4+tD5+tD6". In addition, the data strobe signal DQS2 outputted from the trigger circuit 114-2 of the first non-representative memory device 110-2 may have a phase which is consistent with a phase of the DLL clock signal DLL_CLK2 outputted from the delay lock loop (DLL) circuit 112-2 of the first non-representative memory device 110-2. Meanwhile, the data strobe signal DQS2 of the first non-representative memory device 110-2 may be outputted not through the first and second drivers 51-2 and 52-2 of the first non-representative memory device 110-2 but through the first and second drivers 51-1 and 52-1 of the representative memory device 110-1. Thus, when the delay time "tD6" of the first non-representative memory device 110-2 is different from the delay time "tD3" of the representative memory device 110-1, the data strobe signal DQS2 of the first non-representative memory device 110-2 may represent the real delay time and the replica delay time which are different from each other.

In an exemplary case illustrated in FIG. 10, the data strobe signal DQS2 of the first non-representative memory device 110-2 outputted from the representative memory device 110-1 may exhibit the real delay time which is less than the replica delay time of "tD4+tD5+tD6". This phenomenon may occur when the delay time "tD6" of the first non-representative memory device 110-2 is greater than the delay time "tD3" of the representative memory device 110-1. In such a case, the data strobe signal DQS2 of the first non-representative memory device 110-2 outputted from the representative memory device 110-1 may have a phase that precedes an end point of the replica delay time. As a result, a timing skew of "tDQSCK2" may exist between the data strobe signal DQS2 of the first non-representative memory device 110-2 and the internal clock signal of the external controller. That is, the real delay time of the data strobe signal DQS2 of the first non-representative memory device 110-2 may be less than the replica delay time of "tD4+tD5+tD6" by the timing skew of "tDQSCK2". In the present embodiment, the timing skew of "tDQSCK2" between the data strobe signal DQS2 of the first non-representative memory device 110-2 and the internal clock signal of the external controller may be removed by performing a training operation for controlling the DLL clock signal DLL_CLK2 outputted from the delay lock loop (DLL) circuit 112-2 of the first non-representative memory device 110-2 using the test mode code TM_code such that the real delay time becomes substantially equal to the replica delay time.

In another exemplary case illustrated in FIG. 11, the data strobe signal DQS2 of the first non-representative memory device 110-2 outputted from the representative memory device 110-1 may exhibit the real delay time which is greater than the replica delay time of "tD4+tD5+tD6". This phenomenon may occur when the delay time "tD6" of the first non-representative memory device 110-2 is less than the delay time "tD3" of the representative memory device 110-1. In such a case, the data strobe signal DQS2 of the first non-representative memory device 110-2 outputted from the representative memory device 110-1 may have a phase that follows an end point of the replica delay time. As a result, the timing skew of "tDQSCK2" may exist between the data strobe signal DQS2 of the first non-representative memory device 110-2 and the internal clock signal of the external controller. That is, the real delay time of the data strobe signal DQS2 of the first non-representative memory device 110-2 may be greater than the replica delay time of "tD4+tD5+tD6" by the timing skew of "tDQSCK2". In the present embodiment, the timing skew of "tDQSCK2" between the data strobe signal DQS2 of the first non-representative memory device 110-2 and the internal clock signal of the external controller may be removed by performing a training operation for controlling the DLL clock signal DLL_CLK2 outputted from the delay lock loop (DLL) circuit 112-2 of the first non-representative memory device 110-2 using the test mode code TM_code such that the real delay time becomes substantially equal to the replica delay time.

In the memory system (100 of FIG. 1) having the plurality of memory devices (110-1, . . . , and 110-M of FIG. 1) according to the present embodiment, the training operation of the representative memory device 110-1 may be performed by generating the internal delay clock signal Internal_CKD having a phase which is consistent with a phase of the data strobe signal DQS1 of the representative memory device 110-1. In addition, the training operation of each of the non-representative memory devices 110-2, . . . , and 110-M may be performed by adjusting a phase of the data strobe signal of each of the non-representative memory devices 110-2, . . . , and 110-M such that the data strobe signal of each of the non-representative memory devices 110-2, . . . , and 110-M has a phase which is consistent with a phase of the internal delay clock signal Internal_CKD generated in the controller 120. The phase of the data strobe signal of each of the non-representative memory devices 110-2, . . . , and 110-M may be adjusted by the delay lock loop (DLL) circuit of each of the non-representative memory devices 110-2, . . . , and 110-M based on delay information included in the test mode codes stored in the delay code register 128 of the controller 120. A configuration of the delay code register 128 of the controller 120 and a method of adjusting a phase of the data strobe signal in the delay lock loop (DLL) circuit of each of the non-representative memory devices 110-2, . . . , and 110-M according to the configuration of the delay code register 128 will be described hereinafter.

Figure 12:
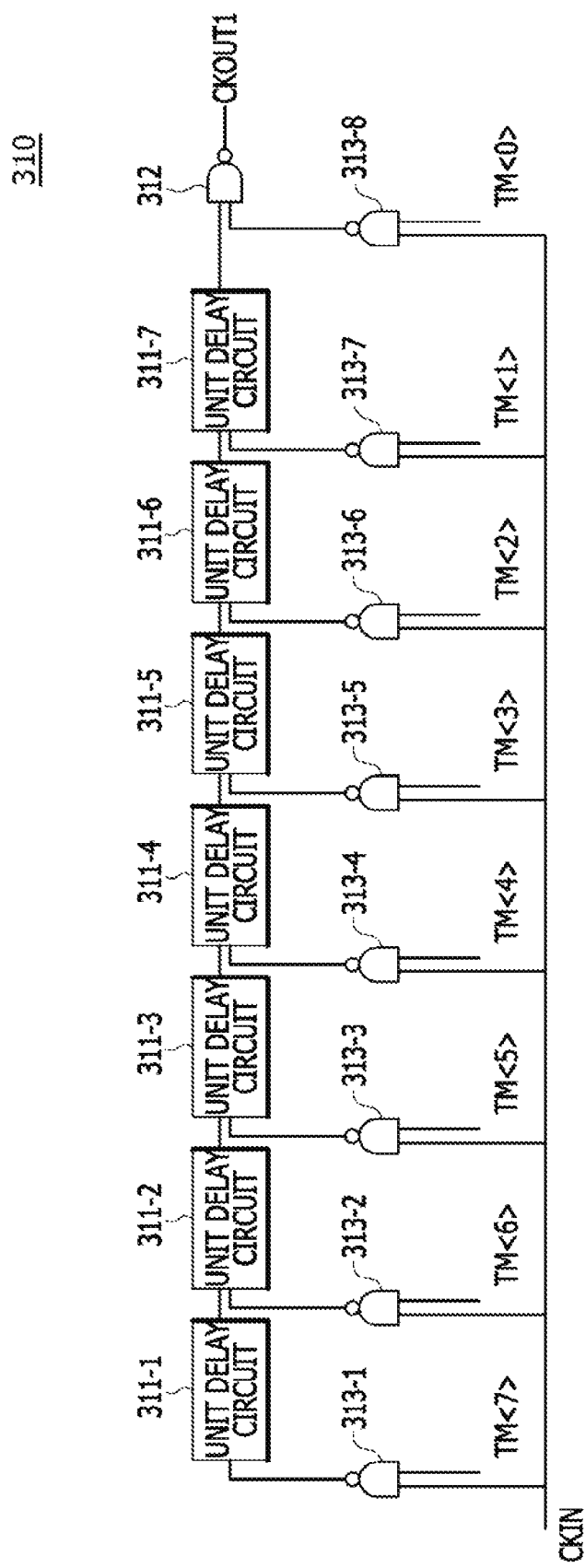
FIGS. 12 and 13 are schematic views illustrating a main delay circuit and an additional delay circuit constituting a delay circuit included in a delay lock loop (DLL) circuit of the first non-representative memory device of FIG. 5, respectively.
Figure 13:
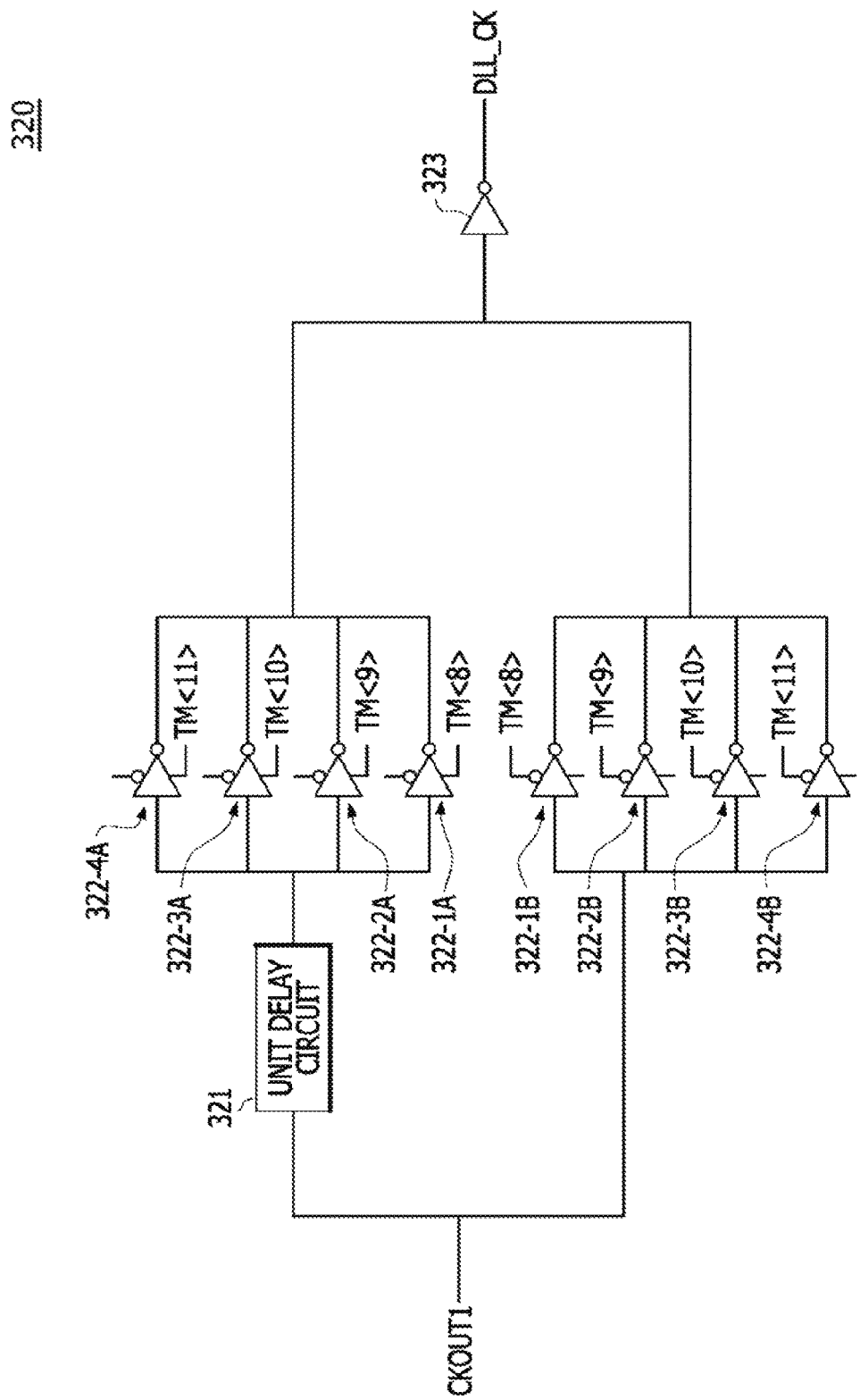

FIGS. 12 and 13 illustrate configurations of delay circuits included in the delay lock loop (DLL) circuit 112-2 of the first non-representative memory device 110-2. A configuration and an operation of the delay lock loop (DLL) circuit 112-2 of the first non-representative memory device 110-2, which are described hereinafter, may be equally applicable to the delay lock loop (DLL) circuit of each of the other non-representative memory devices. Specifically, FIG. 12 is a schematic view illustrating a main delay circuit 310 included in the delay lock loop (DLL) circuit 112-2, and FIG. 13 is a schematic view illustrating an additional delay circuit 320 included in the delay lock loop (DLL) circuit 112-2. First, referring to FIG. 12, the main delay circuit 310 may be configured to include a plurality of unit delay circuits (e.g., first to seventh unit delay circuits 311-1, . . . , and 311-7), an output NAND gate 312 disposed in an output stage, and first to eighth input NAND gates 313-1, . . . , and 313-8. Each of the first to seventh unit delay circuits 311-1, . . . , and 311-7 may delay an input signal by a first delay time and may output the delayed input signal. Hereinafter, it may be assumed that each of the first to seventh unit delay circuits 311-1, . . . , and 311-7 is designed to delay the input signal by 120 picoseconds. The first to seventh unit delay circuits 311-1, . . . , and 311-7 may be connected to each other in a chain form. Thus, an output signal of the first unit delay circuit 311-1 may be inputted to the second unit delay circuit 311-2, and an output signal of the second unit delay circuit 311-2 may be inputted to the third unit delay circuit 311-3. In the same way, output signals of the third to sixth unit delay circuits 311-3, . . . , and 311-6 may be inputted to the fourth to seventh unit delay circuits 311-4, . . . , and 311-7, respectively. An output signal of the seventh unit delay circuit 311-7 may be inputted to a first input terminal of the output NAND gate 312.

An input clock signal CKIN (corresponding to the input clock signal ICLK of FIG. 9) may be inputted to first input terminals of the first to eighth input NAND gates 313-1, . . . , and 313-8. In an embodiment, the input clock signal CKIN may be used as a reference clock signal in the first non-representative memory device 110-2. Some of a plurality of test mode signals (e.g., first to twelfth test mode signals TM<11:0>) constituting the test mode code TM_code, for example, first to eighth test mode signals TM<7:0> corresponding to eight low-order bit signals of the first to twelfth test mode signals TM<11:0> constituting the test mode code TM_code may be inputted to respective ones of second input terminals of the first to eighth input NAND gates 313-1, . . . , and 313-8. Output signals of the first to seventh input NAND gates 313-1, . . . , and 313-7 may be inputted to respective ones of the first to seventh unit delay circuits 311-1, . . . , and 311-7, and an output signal of the eighth input NAND gate 313-8 may be inputted to a second input terminal of the output NAND gate 312.

When any one of the first to eighth test mode signals TM<7:0> inputted to the main delay circuit 310 has a logic "high" level, the input clock signal CKIN may be outputted through an output terminal of the input NAND gate to which the test mode signal having a logic "high" level is inputted. The input clock signal CKIN may be transmitted though the unit delay circuit to which the input clock signal CKIN is inputted and the next unit delay circuits disposed before the output NAND gate 312 and may be outputted as a first output clock signal CKOUT1 through the output NAND gate 312. In an embodiment, when the first to eighth test mode signals TM<7:0> (corresponding to the eight low-order bits of the test mode code TM_code) inputted to the main delay circuit 310 have an eight-bit binary stream of '00001001', the input clock signal CKIN may be transmitted through the fifth to seventh unit delay circuits 311-5, . . . , and 311-7 and may be outputted through the output NAND gate 312 because the fourth test mode signal TM<3> and the first test mode signal TM<0> of the test mode code TM_code have a logic "high" level. Thus, the first output clock signal CKOUT1 may be outputted with a phase which is delayed by 360 picoseconds as compared with the input clock signal CKIN. In another embodiment, when the first to eighth test mode signals TM<7:0> (corresponding to the eight low-order bits of the test mode code TM_code) inputted to the main delay circuit 310 have an eight-bit binary stream of '00100001', the input clock signal CKIN may be transmitted through the third to seventh unit delay circuits 311-3, . . . , and 311-7 and may be outputted through the output NAND gate 312 because the sixth test mode signal TM<5> and the first test mode signal TM<0> of the test mode code TM_code have a logic "high" level. Thus, the first output clock signal CKOUT1 may be outputted with a phase which is delayed by 600 picoseconds as compared with the input clock signal CKIN. As a result, the main delay circuit 310 may delay a phase of the input clock signal CKIN from a minimum delay time of 120 picoseconds to a maximum delay time of 840 picoseconds in units of 120 picoseconds. The first output clock signal CKOUT1 may be inputted to the additional delay circuit 320 illustrated in FIG. 13.

Next, referring to FIG. 13, the additional delay circuit 320 may be configured to include an additional unit delay circuit 321, first to fourth tri-state inverters 322-1A, . . . and 322-4A included in a first group of tri-state inverters, first to fourth tri-state inverters 322-1B, . . . , and 322-4B included in a second group of tri-state inverters, and an output inverter 323 disposed at an output stage. The first output clock signal CKOUT1 outputted from the main delay circuit 310 may be inputted to the additional unit delay circuit 321 and the second group of tri-state inverters 322-1B, . . . , and 322-4B. The additional unit delay circuit 321 may delay the first output clock signal CKOUT1 by a second delay time, for example 120 picoseconds and may output the delayed signal of the first output clock signal CKOUT1 as a clock signal, and the clock signal may be inputted to the first group of first to fourth tri-state inverters 322-1A, . . . , and 322-4A. Thus, a clock signal outputted from the first group of first to fourth tri-state inverters 322-1A, . . . , and 322-4A may have a phase which is delayed as compared with a clock signal outputted from the second group of first to fourth tri-state inverters 322-1B, . . . , and 322-4B.

Ninth to twelfth test mode signals TM<11:8> corresponding to four high-order bit signals of the first to twelfth test mode signals TM<11:0> constituting the test mode code TM_code may be inputted to respective ones of enablement input terminals of the first group of first to fourth tri-state inverters 322-1A, . . . , and 322-4A. Inverted signals of the ninth to twelfth test mode signals TM<11:8> corresponding to the four high-order bit signals of the first to twelfth test mode signals TM<11:0> constituting the test mode code TM_code may be inputted to respective ones of enablement input terminals of the second group of first to fourth tri-state inverters 322-1B, . . . , and 322-4B. The ninth test mode signal TM<8> of the test mode code TM_code may be inputted to the enablement input terminal of the first tri-state inverter 322-1A included in the first group of tri-state inverters, and an inverted signal of the ninth test mode signal TM<8> of the test mode code TM_code may be inputted to the enablement input terminal of the first tri-state inverter 322-1B included in the second group of tri-state inverters. Thus, only one of the first tri-state inverter 322-1A included in the first group of tri-state inverters and the first tri-state inverter 322-1B included in the second group of tri-state inverters may be enabled according to a level of the ninth test mode signal TM<8> of the test mode code TM_code, and the other of the first tri-state inverter 322-1A and the first tri-state inverter 322-1B may be disabled to provide an open circuit. The tenth test mode signal TM<9> of the test mode code TM_code may be inputted to the enablement input terminal of the second tri-state inverter 322-2A included in the first group of tri-state inverters, and an inverted signal of the tenth test mode signal TM<9> of the test mode code TM_code may be inputted to the enablement input terminal of the second tri-state inverter 322-2B included in the second group of tri-state inverters. Thus, only one of the second tri-state inverter 322-2A included in the first group of tri-state inverters and the second tri-state inverter 322-2B included in the second group of tri-state inverters may be enabled according to a level of the tenth test mode signal TM<9> of the test mode code TM_code, and the other of the second tri-state inverter 322-2A and the second tri-state inverter 322-2B may be disabled to provide an open circuit. The eleventh test mode signal TM<10> of the test mode code TM_code may be inputted to the enablement input terminal of the third tri-state inverter 322-3A included in the first group of tri-state inverters, and an inverted signal of the eleventh test mode signal TM<10> of the test mode code TM_code may be inputted to the enablement input terminal of the third tri-state inverter 322-3B included in the second group of tri-state inverters. Thus, only one of the third tri-state inverter 322-3A included in the first group of tri-state inverters and the third tri-state inverter 322-3B included in the second group of tri-state inverters may be enabled according to a level of the eleventh test mode signal TM<10> of the test mode code TM_code, and the other of the third tri-state inverter 322-3A and the third tri-state inverter 322-3B may be disabled to provide an open circuit. The twelfth test mode signal TM<11> of the test mode code TM_code may be inputted to the enablement input terminal of the fourth tri-state inverter 322-4A included in the first group of tri-state inverters, and an inverted signal of the twelfth test mode signal TM<11> of the test mode code TM_code may be inputted to the enablement input terminal of the fourth tri-state inverter 322-4B included in the second group of tri-state inverters. Thus, only one of the fourth tri-state inverter 322-4A included in the first group of tri-state inverters and the fourth tri-state inverter 322-4B included in the second group of tri-state inverters may be enabled according to a level of the twelfth test mode signal TM<11> of the test mode code TM_code, and the other of the fourth tri-state inverter 322-4A and the fourth tri-state inverter 322-4B may be disabled to provide an open circuit.

The additional delay circuit 320 having the aforementioned configuration may output a delay lock loop (DLL) clock signal DLL_CK, which is additionally delayed according to the ninth to twelfth test mode signals TM<11:8> corresponding to the four high-order bit signals of the first to twelfth test mode signals TM<11:0> constituting the test mode code TM_code, through the output inverter 323. Specifically, because the first to fourth tri-state inverters 322-1A, . . . , and 322-4A included in the first group of tri-state inverters output the DLL clock signal DLL_CK which is additionally delayed by 120 picoseconds as compared with the first output clock signal CKOUT1 outputted from the main delay circuit 310, the additional delay time by which the first output clock signal CKOUT1 is delayed may increase if the number of the first group of tri-state inverters increases. For example, when one of the first to fourth tri-state inverters 322-1A, . . . , and 322-4A constituting the first group of tri-state inverters is enabled, the DLL clock signal DLL_CK may have a phase which is additionally delayed by 30 picoseconds as compared with the first output clock signal CKOUT1. When two of the first to fourth tri-state inverters 322-1A, . . . , and 322-4A constituting the first group of tri-state inverters are enabled, the DLL clock signal DLL_CK may have a phase which is additionally delayed by 60 picoseconds as compared with the first output clock signal CKOUT1.

FIG. 14 illustrates the test mode code table 128-1 stored in the delay code register 128 of the controller 120 shown in FIG. 6 in case that the delay circuits 310 and 320 shown in FIGS. 12 and 13 are employed. Referring to FIG. 14, the test mode code table 128-1 may include a plurality of test mode codes, for example, "2N+1"-number of test mode codes TM_code+N, . . . , TM_code+1, TM_code_0, TM_code-1, . . . and TM_code-N (where, "N" denotes a natural number). Each of the test mode codes TM_code+N, . . . , TM_code+1, TM_code_0, TM_code-1, . . . , and TM_code-N may include a plurality of bits, for example, first to twelfth test mode signals TM<0:11>. The test mode codes TM_code+N, . . . , TM_code+1, TM_code_0, TM_code-1, . . . , and TM_code-N may be divided into "N"-number of the negative test mode codes TM_code-1, TM_code-2, . . . , and TM_code-N, one default test mode code TM_code_0, and "N"-number of the positive test mode codes TM_code+1, TM_code+2, . . . , and TM_code+N. The default test mode code TM_code_0 may be a binary stream having delay information corresponding to the replica delay time of the memory device. In the present embodiment, the default test mode code TM_code_0 may have a binary stream of '110000010001'. That is, in case of the default test mode code TM_code_0, the first low-order bit signal (corresponding to the first test mode signal TM<0>) and the fifth low-order bit signal (corresponding to the fifth test mode signal TM<4>) among the first to eighth test mode signals TM<0:7> inputted to the main delay circuit 310 may have a logic "high" level and the remaining bit signals among the first to eighth test mode signals TM<0:7> may have a logic "low" level. In such a case, two high-order bit signals (i.e., the eleventh and twelfth test mode signals TM<10:11> among the ninth to twelfth test mode signals TM<8:11> inputted to the additional delay circuit 320 may have a logic "high" level and the remaining bit signals among the ninth to twelfth test mode signals TM<8:11> may have a logic "low" level.

When the default test mode code TM_code_0 is inputted to the delay circuit of the delay lock loop (DLL) circuit 112-2, the reference clock signal CKIN may be delayed by the fourth to seventh unit delay circuits 311-4, . . . , and 311-7 because the first test mode signal TM<0> and the fifth test mode signal TM<4> among the first to eighth test mode signals TM<0:7> inputted to the main delay circuit 310 have a logic "high" level. Thus, the first output clock signal CKOUT1 outputted from the main delay circuit 310 may have a phase which is delayed by 480 picoseconds as compared with the reference clock signal CKIN. The first output clock signal CKOUT1 having a phase delayed by 480 picoseconds may be inputted to the additional delay circuit 320 illustrated in FIG. 13. Because the eleventh and twelfth test mode signals TM<10:11> among the ninth to twelfth test mode signals TM<8:11> inputted to the additional delay circuit 320 have a logic "high" level and the remaining bit signals among the ninth to twelfth test mode signals TM<8: 11> have a logic "low" level, the first output clock signal CKOUT1 inputted to the additional delay circuit 320 may be additionally delayed by 60 picoseconds by the third and fourth tri-state inverters 322-3A and 322-4A included in the first group of tri-state inverters. Accordingly, the DLL clock signal DLL_CK finally outputted from the additional delay circuit 320 may have a delay time of "540 picoseconds" as compared with the reference clock signal CKIN. This delay time may be substantially equal to the replica delay time of the first non-representative memory device 110-2.

As described with reference to FIGS. 10 and 11, the replica delay time of the first non-representative memory device 110-2 may correspond to a timing interval between the data strobe signal DQS2 generated by the trigger circuit 114-2 of the first non-representative memory device 110-2 and the internal clock signal of the controller 120. The data strobe signal DQS2 outputted from the trigger circuit 114-2 of the first non-representative memory device 110-2 may have a phase which is consistent with a phase of the DLL clock signal DLL_CK outputted from the DLL circuit 112-2. Thus, if the DLL clock signal DLL_CK is generated with a phase having the replica delay time of "540 picoseconds" by the default test mode code TM_code_0, the data strobe signal DQS2 outputted from the trigger circuit 114-2 of the first non-representative memory device 110-2 may also be generated with a phase having the replica delay time of "540 picoseconds". When the negative test mode code is inputted to the DLL circuit 112-2 of the first non-representative memory device 110-2, a delay time of the data strobe signal DQS2 outputted from the trigger circuit 114-2 of the first non-representative memory device 110-2 may increase by a delay time determined by the negative test mode code from the replica delay time of "540 picoseconds". In contrast, when the positive test mode code is inputted to the DLL circuit 112-2 of the first non-representative memory device 110-2, a delay time of the data strobe signal DQS2 outputted from the trigger circuit 114-2 of the first non-representative memory device 110-2 may be reduced by a delay time determined by the positive test mode code from the replica delay time of "540 picoseconds".

Specifically, the negative test mode codes TM_code−1, TM_code−2, . . . , and TM_code−N may be binary streams which sequentially reduces by a certain time from a delay time of a case that the default test mode code is inputted. For example, the first negative test mode code TM_code−1 may be a binary stream of '000100010001'. Because the first to eighth test mode signals TM<0:7> inputted to the main delay circuit 310 of FIG. 12 are identical to the first to eighth test mode signals TM<0:7> of the default test mode code TM_code_0, the first output clock signal CKOUT1 outputted from the main delay circuit 310 of FIG. 12 may maintain a phase which is delayed by 480 picoseconds. In contrast, only the low-order bit signal (i.e., the ninth test mode signal TM<8>) of the ninth to twelfth test mode signals TM<8:11> inputted to the additional delay circuit 320 of FIG. 13 has a logic "high" level and the remaining bit signals of the ninth to twelfth test mode signals TM<8:11> have a logic "low" level. Thus, only the first tri-state inverter 322-1A included in the first group of tri-state inverters may be enabled and all of the remaining tri-state inverters (i.e., the second to fourth tri-state inverters 322-2A, 322-3A and 322-4A) may be disabled. As a result, the DLL clock signal DLL_CK outputted from the additional delay circuit 320 may be additionally delayed by 30 picoseconds as compared with the first output clock signal CKOUT1 outputted from the main delay circuit 310, thereby having a total delay time of "510 picoseconds". Because the DLL clock signal DLL_CK outputted from the additional delay circuit 320 has a delay time of "540 picoseconds" when the default test mode code TM_code_0 is inputted to the delay lock loop (DLL) circuit 112-2, a delay time of the DLL clock signal DLL_CK generated when the first negative test mode code TM_code−1 is inputted to the delay lock loop (DLL) circuit 112-2 may be reduced by 30 picoseconds as compared with a case that the default test mode code TM_code_0 is inputted to the delay lock loop (DLL) circuit 112-2.

In the present embodiment, the second negative test mode code TM_code−2 may be a binary stream of '000000010001'. Because the first to eighth test mode signals TM<0:7> inputted to the main delay circuit 310 of FIG. 12 are identical to the first to eighth test mode signals TM<0:7> of the default test mode code TM_code_0, the first output clock signal CKOUT1 outputted from the main delay circuit 310 of FIG. 12 may maintain a phase which is delayed by 480 picoseconds. In contrast, all of the ninth to twelfth test mode signals TM<8:11> inputted to the additional delay circuit 320 of FIG. 13 have a logic "low" level. Thus, all of the first to fourth tri-state inverters 322-1A, 322-2A, 322-3A and 322-4A included in the first group of tri-state inverters may be disabled. As a result, the DLL clock signal DLL_CK outputted from the additional delay circuit 320 may not be additionally delayed as compared with the first output clock signal CKOUT1 outputted from the main delay circuit 310, thereby having a total delay time of "480 picoseconds". Because the DLL clock signal DLL_CK outputted from the additional delay circuit 320 has a delay time of "540 picoseconds" when the default test mode code TM_code_0 is inputted to the delay lock loop (DLL) circuit 112-2, a delay time of the DLL clock signal DLL_CK generated when the second negative test mode code TM_code−2 is inputted to the delay lock loop (DLL) circuit 112-2 may be reduced by 60 picoseconds as compared with a case that the default test mode code TM_code_0 is inputted to the delay lock loop (DLL) circuit 112-2.

In the present embodiment, the $N^{th}$ negative test mode code TM_code−N may be a binary stream of '000000000011'. Because the second test mode signal TM<1> among the first to eighth test mode signals TM<0:7> inputted to the main delay circuit 310 of FIG. 12 has a logic "high" level, only the seventh unit delay circuit 311-7 among the first to seventh unit delay circuits 311-1, . . . , and 311-7 may be enabled. Thus, the first output clock signal CKOUT1 outputted from the main delay circuit 310 of FIG. 12 may have a phase which is delayed by 120 picoseconds as compared with the reference clock signal CKIN. Because all of the ninth to twelfth test mode signals TM<8:11> inputted to the additional delay circuit 320 of FIG. 13 have a logic "low" level, all of the first to fourth tri-state inverters 322-1A, 322-2A, 322-3A and 322-4A included in the first group of tri-state inverters may be disabled. Accordingly, the DLL clock signal DLL_CK outputted from the additional delay circuit 320 may not be additionally delayed as compared with the first output clock signal CKOUT1 outputted from the main delay circuit 310, thereby having a total delay time of "120 picoseconds". Because the DLL clock signal DLL_CK outputted from the additional delay circuit 320 has a delay time of "540 picoseconds" when the default test mode code TM_code_0 is inputted to the delay lock loop (DLL) circuit 112-2, a delay time of the DLL clock signal DLL_CK generated when the $N^{th}$ negative test mode code TM_code−N is inputted to the delay lock loop (DLL) circuit 112-2 may be reduced by 420 picoseconds as compared with a case that the default test mode code TM_code_0 is inputted to the delay lock loop (DLL) circuit 112-2.

The positive test mode codes TM_code+1, TM_code+2, and TM_code+N may be binary streams which sequentially increases by a certain time from a delay time of a case that the default test mode code is inputted. For example, the first positive test mode code TM_code+1 may be a binary stream of '110100010001'. Because the first to eighth test mode signals TM<0:7> inputted to the main delay circuit 310 of FIG. 12 are identical to the first to eighth test mode signals TM<0:7> of the default test mode code TM_code_0, the first output clock signal CKOUT1 outputted from the main delay circuit 310 of FIG. 12 may maintain a phase which is delayed by 480 picoseconds. In contrast, the ninth test mode signal TM<8> and the eleventh and twelfth test mode signals TM<10:11> among the ninth to twelfth test mode signals TM<8:11> inputted to the additional delay circuit 320 of FIG. 13 has a logic "high" level and the tenth test mode signal of the ninth to twelfth test mode signals TM<8:11> has a logic "low" level. Thus, the first, third and fourth tri-state inverters 322-1A, 322-3A and 322-4A included in the first group of tri-state inverters may be enabled and the second tri-state inverter 322-2A may be disabled. As a result, the DLL clock signal DLL_CK outputted from the additional delay circuit 320 may be additionally delayed by 90 picoseconds as compared with the first output clock signal CKOUT1 outputted from the main delay circuit 310, thereby having a total delay time of "570 picoseconds". Because the DLL clock signal DLL_CK outputted from the additional delay circuit 320 has a delay time of "540 picoseconds" when the default test mode code TM_code_0 is inputted to the delay lock loop (DLL) circuit 112-2, a delay time of the DLL clock signal DLL_CK generated when the first positive test mode code TM_code+1 is inputted to the delay lock loop (DLL) circuit 112-2 may increase by 30 picoseconds as compared with a case that the default test mode code TM_code_0 is inputted to the delay lock loop (DLL) circuit 112-2.

In the present embodiment, the second positive test mode code TM_code+2 may be a binary stream of '111100010001'. Because the first to eighth test mode signals TM<0:7> inputted to the main delay circuit 310 of FIG. 12 are identical to the first to eighth test mode signals TM<0:7> of the default test mode code TM_code_0, the first output clock signal CKOUT1 outputted from the main delay circuit 310 of FIG. 12 may maintain a phase which is delayed by 480 picoseconds. In contrast, all of the ninth to twelfth test mode signals TM<8:11> inputted to the additional delay circuit 320 of FIG. 13 have a logic "high" level. Thus, all of the first to fourth tri-state inverters 322-1A, 322-2A, 322-3A and 322-4A included in the first group of tri-state inverters may be enabled. As a result, the DLL clock signal DLL_CK outputted from the additional delay circuit 320 may be additionally delayed by 120 picoseconds as compared with the first output clock signal CKOUT1 outputted from the main delay circuit 310, thereby having a total delay time of "600 picoseconds". Because the DLL clock signal DLL_CK outputted from the additional delay circuit 320 has a delay time of "540 picoseconds" when the default test mode code TM_code_0 is inputted to the delay lock loop (DLL) circuit 112-2, a delay time of the DLL clock signal DLL_CK generated when the second positive test mode code TM_code+2 is inputted to the delay lock loop (DLL) circuit 112-2 may increase by 60 picoseconds as compared with a case that the default test mode code TM_code_0 is inputted to the delay lock loop (DLL) circuit 112-2.

In the present embodiment, the $N^{th}$ positive test mode code TM_code+N may be a binary stream of '111110000001'. Because the eighth test mode signal TM<7> among the first to eighth test mode signals TM<0:7> inputted to the main delay circuit 310 of FIG. 12 has a logic "high" level, all of the first to seventh unit delay circuits 311-1, . . . , and 311-7 may be enabled. Thus, the first output clock signal CKOUT1 outputted from the main delay circuit 310 of FIG. 12 may have a phase which is delayed by 840 picoseconds as compared with the reference clock signal CKIN. Because all of the ninth to twelfth test mode signals TM<8:11> inputted to the additional delay circuit 320 of FIG. 13 have a logic "high" level, all of the first to fourth tri-state inverters 322-1A, 322-2A, 322-3A, and 322-4A included in the first group of tri-state inverters may be enabled. Accordingly, the DLL clock signal DLL_CK outputted from the additional delay circuit 320 may be additionally delayed by 120 picoseconds as compared with the first output clock signal CKOUT1 outputted from the main delay circuit 310, thereby having a total delay time of "960 picoseconds". Because the DLL clock signal DLL_CK outputted from the additional delay circuit 320 has a delay time of "540 picoseconds" when the default test mode code TM_code_0 is inputted to the delay lock loop (DLL) circuit 112-2, a delay time of the DLL clock signal DLL_CK generated when the $N^{th}$ positive test mode code TM_code+N is inputted to the delay lock loop (DLL) circuit 112-2 may increase by 420 picoseconds as compared with a case that the default test mode code TM_code_0 is inputted to the delay lock loop (DLL) circuit 112-2.

Figure 15:
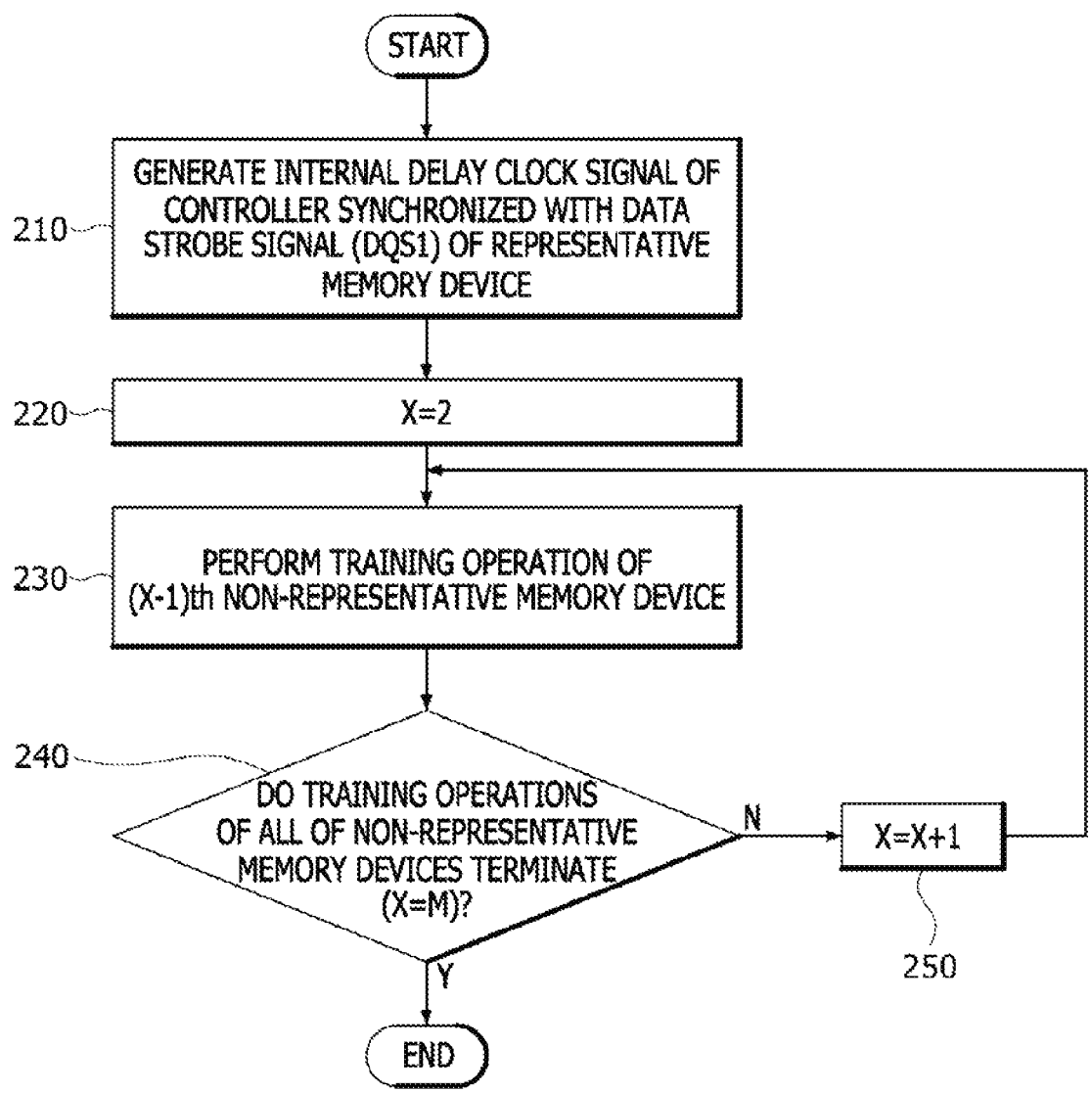
FIG. 15 is a flowchart illustrating all of training operations of a memory system according to an embodiment of the present disclosure.

FIG. 15 is a flowchart illustrating all of training operations of the memory system 100 shown in FIG. 1. Referring to FIGS. 1, 5, 6 and 15, the internal delay clock signal Internal_CKD of the controller 120 may be generated to be synchronized with the strobe signal DQS1 of the representative memory device 110-1 (see a step 210). The internal delay clock signal Internal_CKD of the controller 120 may be synchronized with the strobe signal DQS1 of the representative memory device 110-1 by the step 210. Thus, if generation of the internal delay clock signal Internal_CKD terminates at the step 210, the training operation of the representative memory device 110-1 may be omitted. The internal delay clock signal Internal_CKD generated at the step 210 may be used as an internal clock signal fixed in the controller 120 during a subsequent training operation performed for each of the non-representative memory devices 110-2, . . . , and 110-M.

If the internal delay clock signal Internal_CKD is generated, a variable "X" may be set as two. The variable "X" may be used to specify any one of the plurality of memory devices 110-1, 110-2, . . . , and 110-M. For example, when the variable "X" is two, the first non-representative memory device 110-2 of the plurality of non-representative memory devices 110-2, . . . , and 110-M may be specified. Similarly, when the variable "X" is "M", the $(M-1)^{th}$ non-representative memory device 110-M (i.e., the $M^{th}$ memory device) of the plurality of non-representative memory devices 110-2, . . . , and 110-M may be specified. When the variable "X" is two, the training operation of the first non-representative memory device 110-2 may be performed (see a step 230). After the training operation of the first non-representative memory device 110-2 terminates at the step 230, whether the training operations of all of the non-representative memory devices 110-2, . . . , and 110-M terminate is discriminated at a step 240. When the training operations of the non-representative memory devices 110-2, . . . , and 110-M are sequentially performed, the training operations of all of the non-representative memory devices 110-2, . . . , and 110-M may be regarded as being completely finished if the variable "X" is equal to "M". If only the training operation of the first non-representative memory device 110-2 terminates, the variable "X" may increase by one at a step 250 because the variable "X" is less than "M" and the training operation of the second non-representative memory device 110-3 may be performed at the step 230. These steps 230, 240, and 250 may be iteratively performed until the variable "X" becomes equal to "M" at the step 240. If the training operation of the $(M-1)^{th}$ non-representative memory device 110-M (i.e., the $M^{th}$ memory device) terminates at the step 230, the training operations of all of the non-representative memory devices 110-2, ..., and 110-M may be regarded as being completely finished at the step 240 and all of the training operations may terminate.

Figure 16:
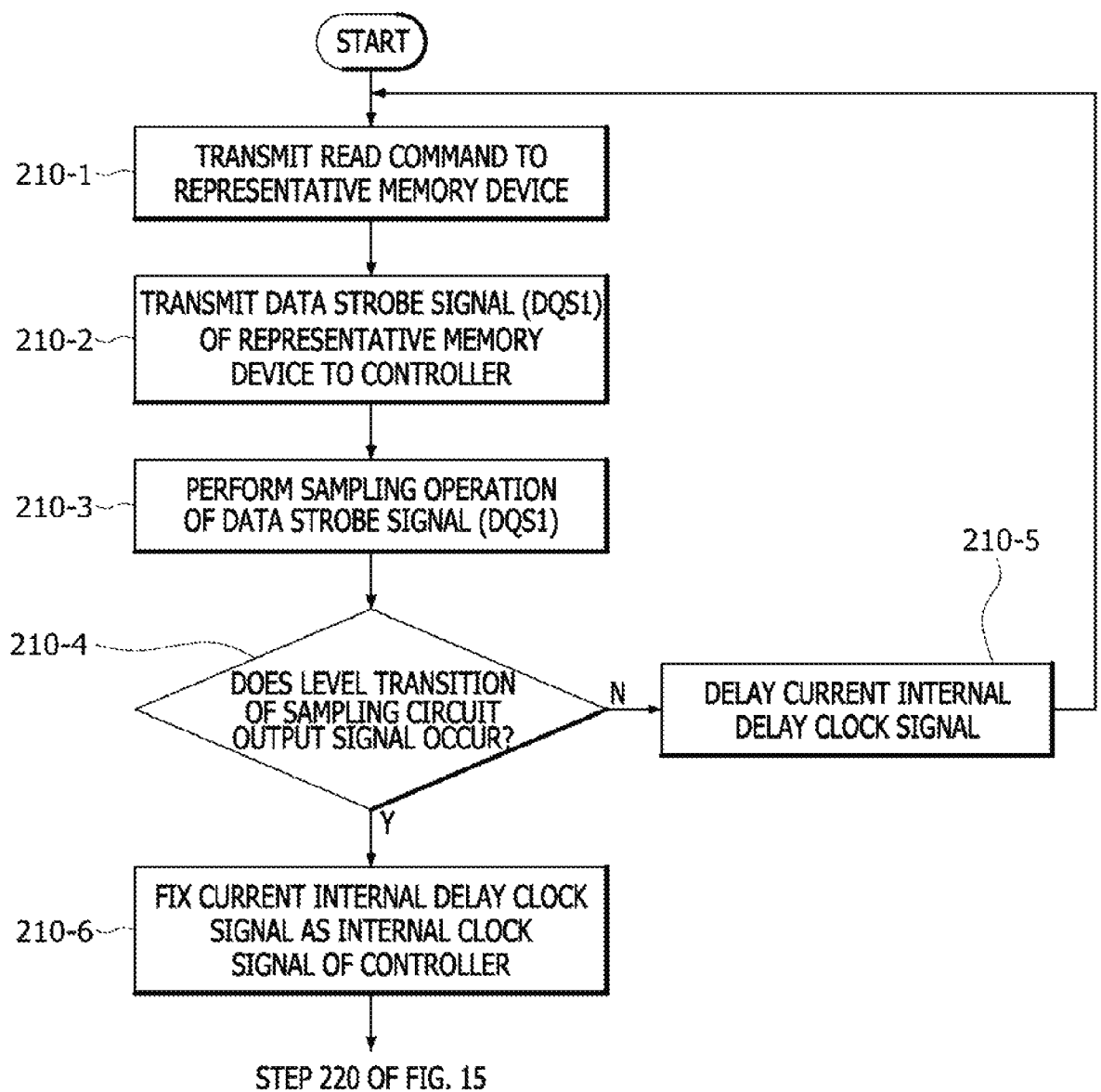
FIG. 16 is a flowchart illustrating a process for generating an internal delay clock signal shown in a step 210 of FIG. 15.

FIG. 16 is a flowchart specifically illustrating the step 210 of FIG. 15 for generating the internal delay clock signal Internal_CKD. Referring to FIG. 16, the controller 120 may transmit a read command to the representative memory device 110-1 (see a step 210-1). The representative memory device 110-1 may transmit the data strobe signal DQS1 to the controller 120 in response to the read command (see a step 210-2). The controller 120 may perform a sampling operation of the data strobe signal DQS1 of the representative memory device 110-1 (see a step 210-3). The controller 120 may discriminate whether level transition of a sampling circuit output signal generated by the sampling operation of the data strobe signal DQS1 occurs (see a step 210-4). If a level of the sampling circuit output signal is not changed at the step 210-4, a current internal delay clock signal may be delayed (see a step 210-5). Subsequently, the steps 210-1, ..., and 210-4 may be iteratively performed. If the level transition of the sampling circuit output signal occurs at the step 210-4, the current internal delay clock signal Internal_CKD may be fixed as the internal clock signal of the controller 120 (see a step 210-6). Subsequently, the step 220 of FIG. 15 may be executed.

Figure 17:
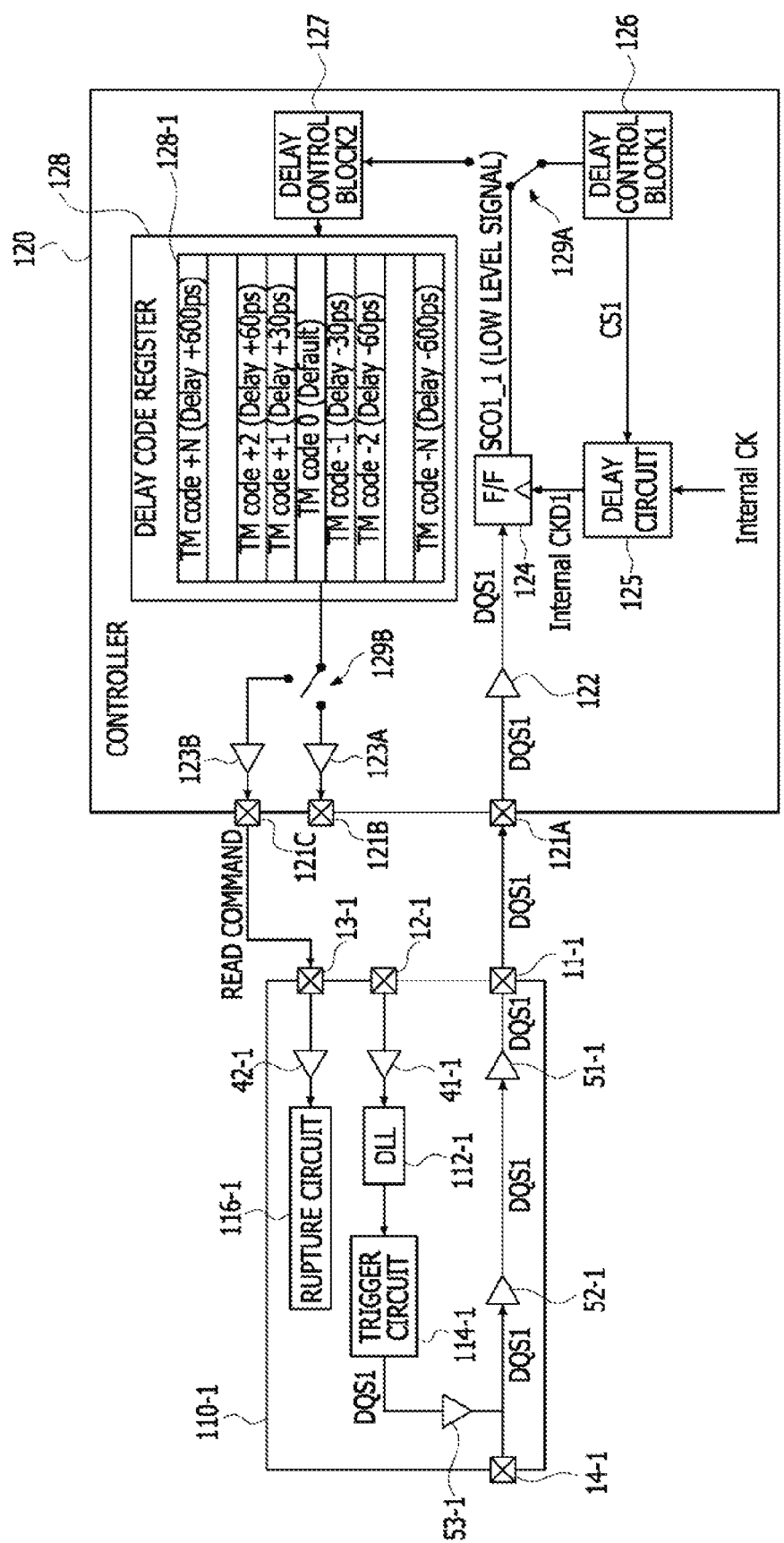
FIGS. 17 to 19 are block diagrams more fully illustrating a process for generating an internal delay clock signal shown in steps 210-1 to 210-6 of FIG. 16.
Figure 18:
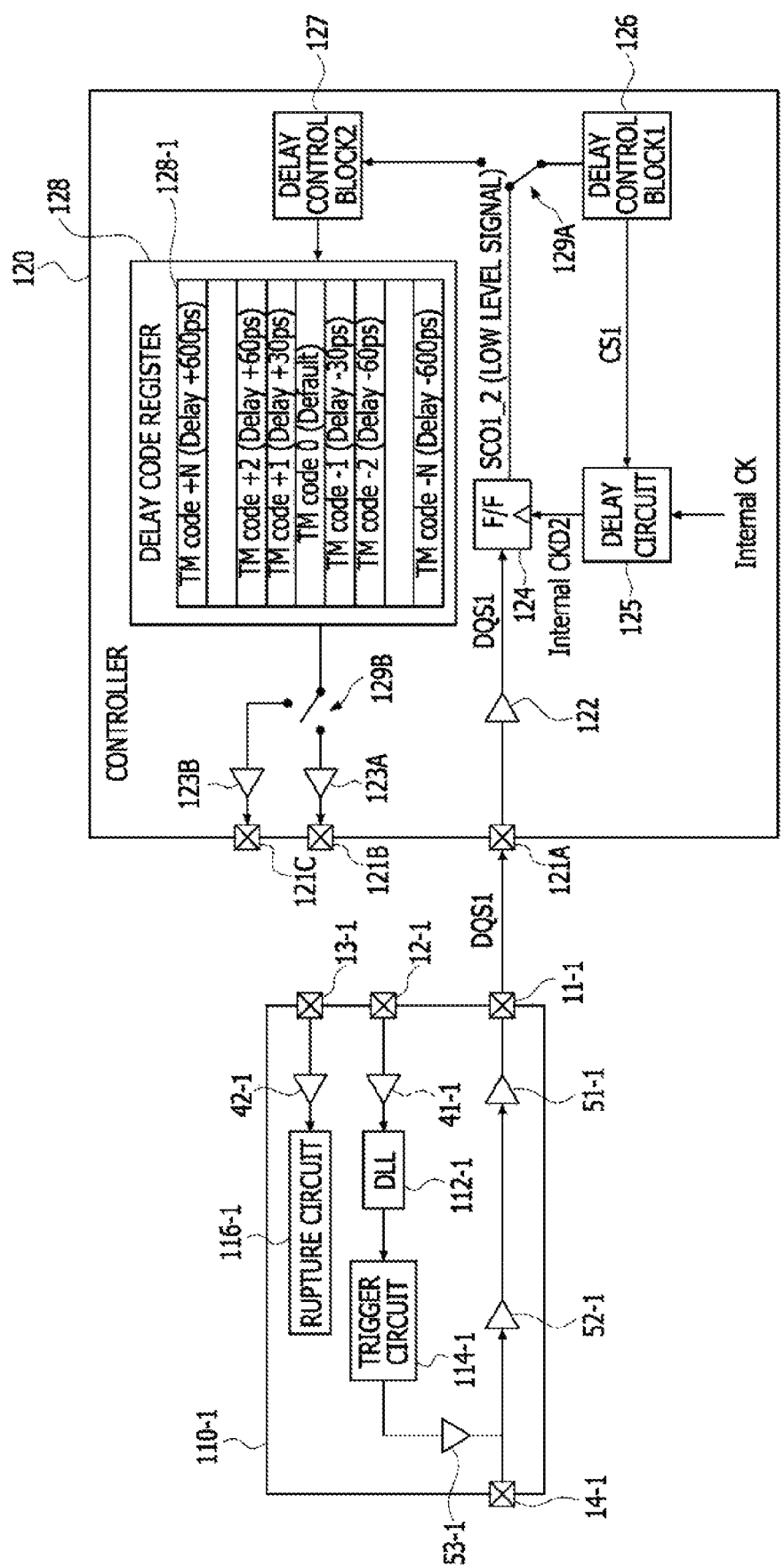
Figure 19:
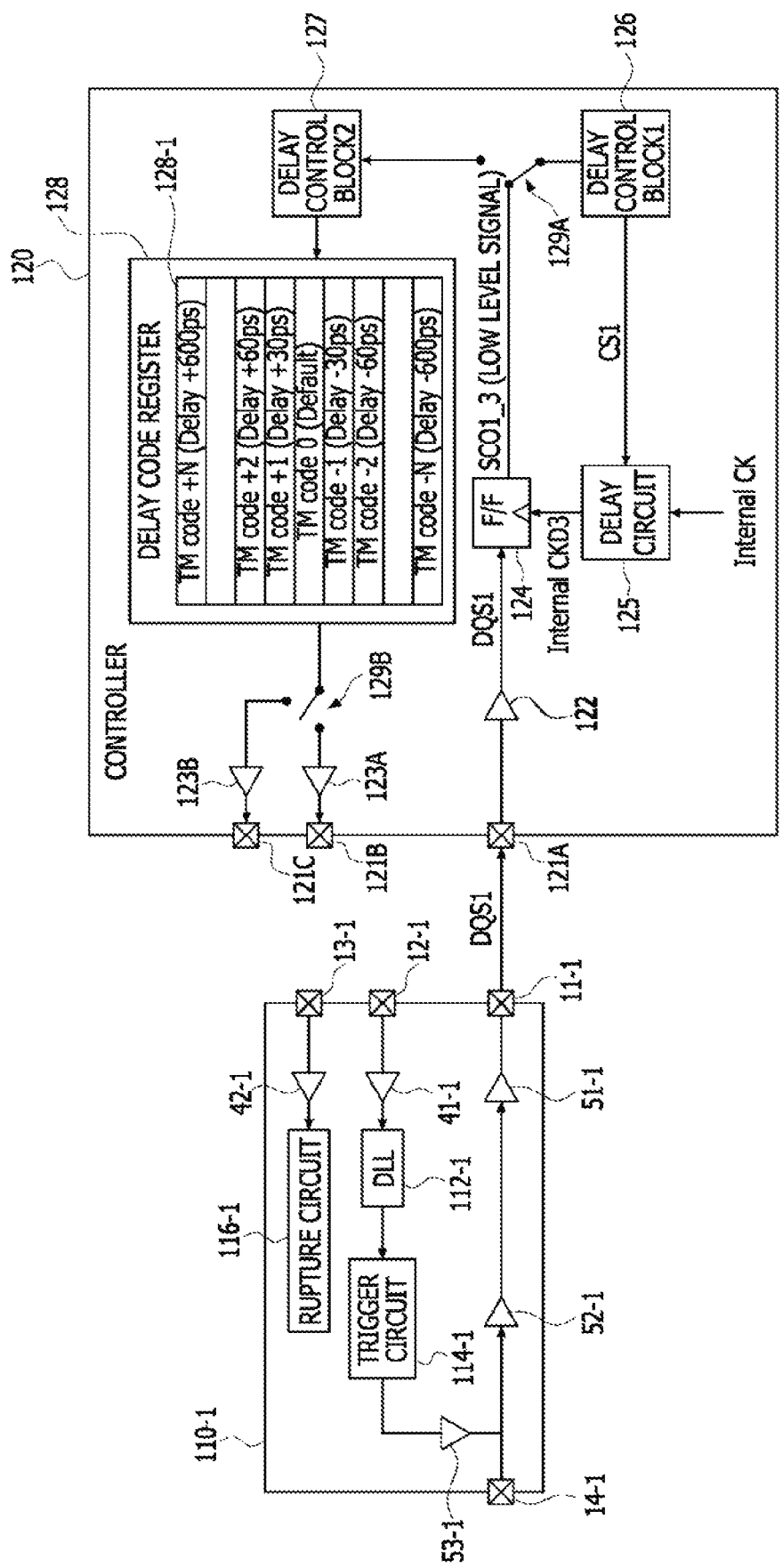
Figure 20:
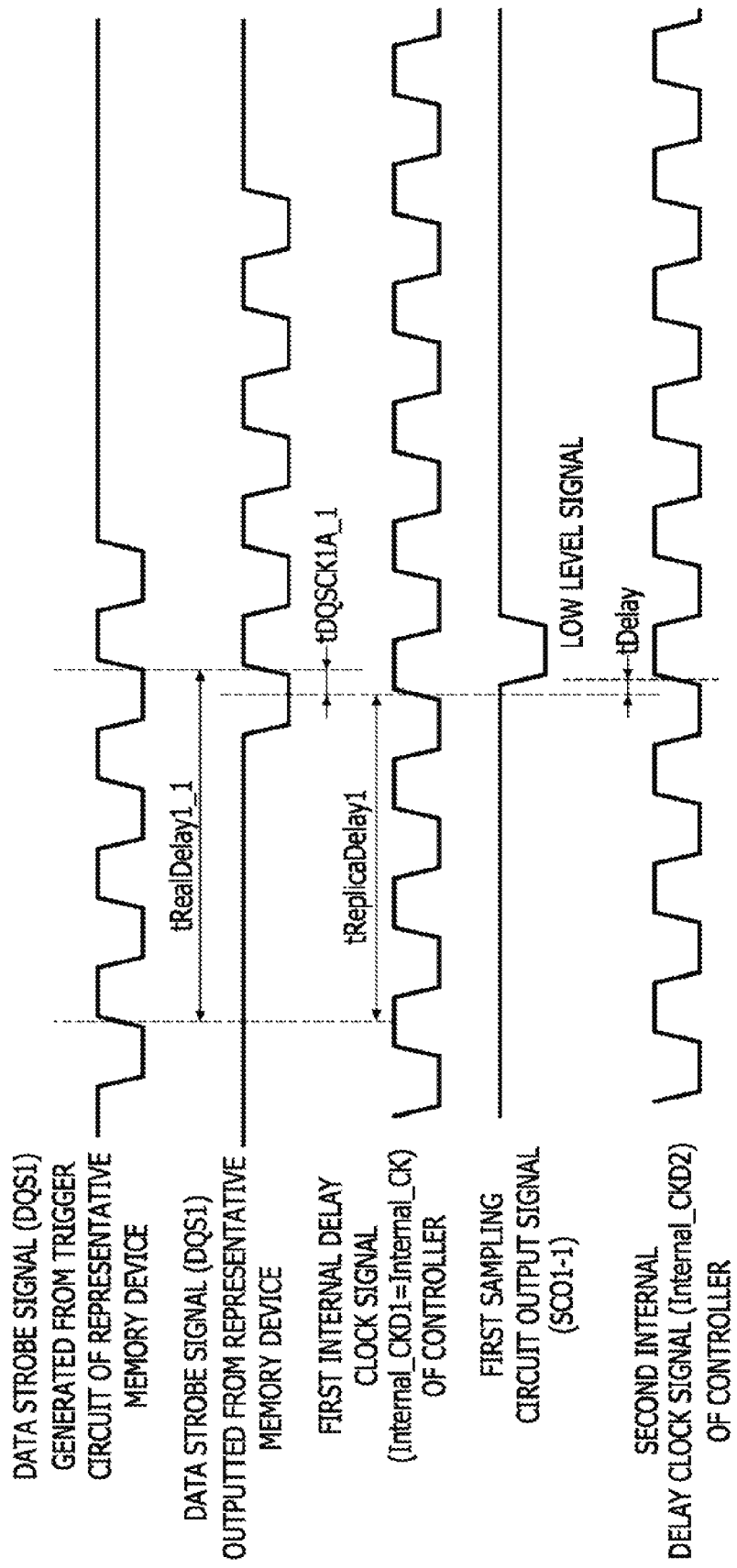
FIGS. 20 to 22 are timing diagrams illustrating an example of a process for generating an internal delay clock signal shown in the step 210 of FIG. 15.
Figure 21:
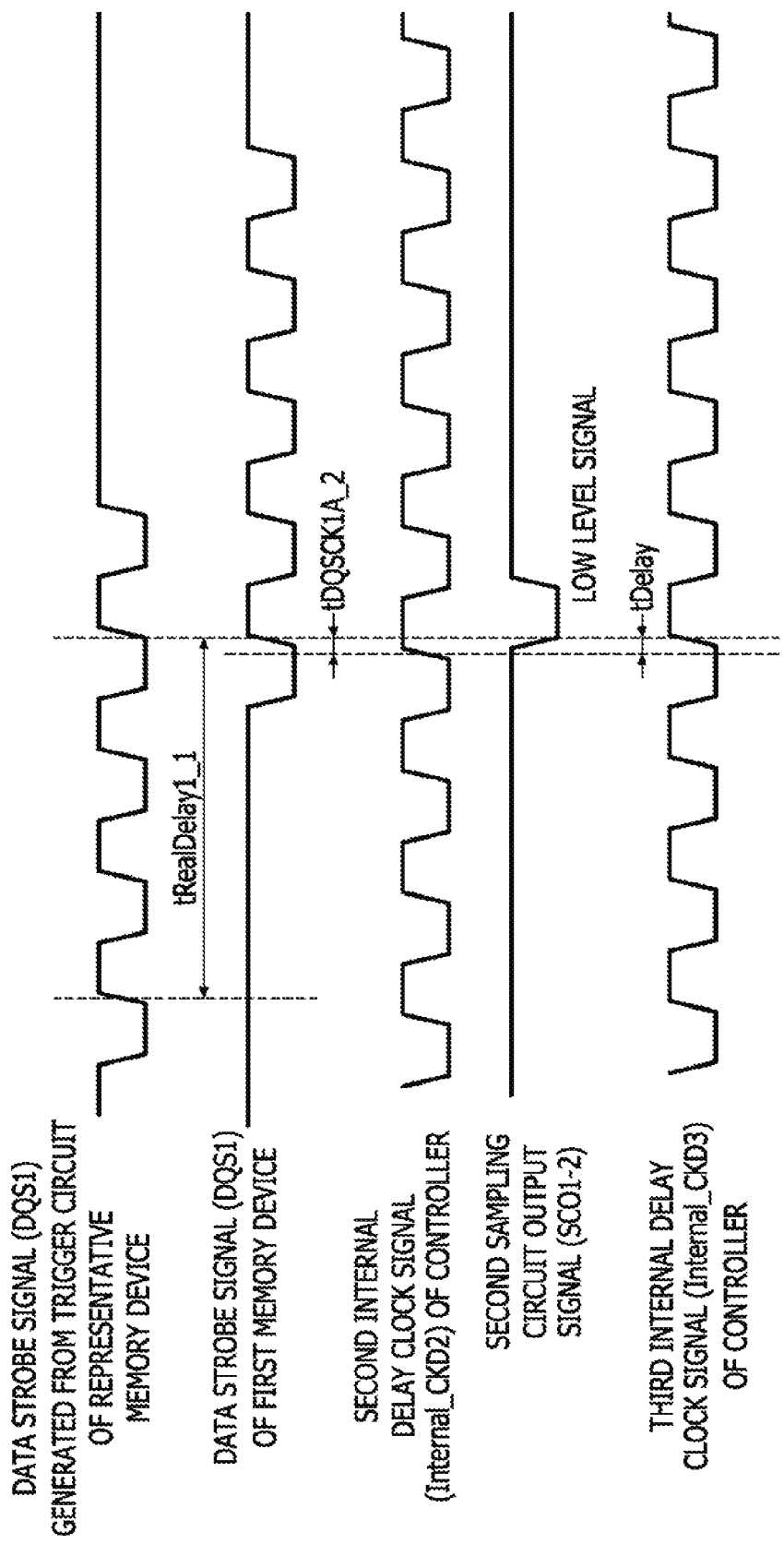
Figure 22:
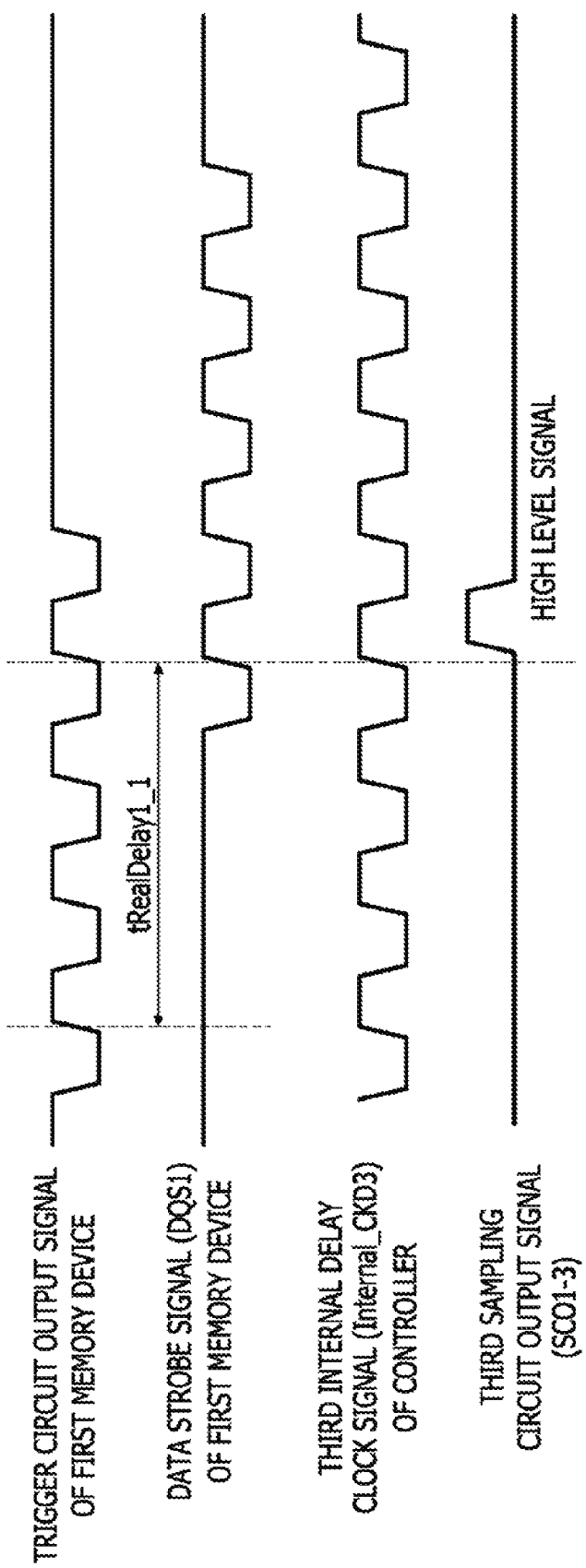

FIGS. 17 to 19 are block diagrams more specifically illustrating a process for generating the internal delay clock signal Internal_CKD mentioned in the steps 210-1 to 210-6 of FIG. 16. FIGS. 20 to 22 are timing diagrams illustrating a process for generating the internal delay clock signal Internal_CKD mentioned in the step 210 of FIG. 15. Referring to FIG. 17, the controller 120 may transmit the read command to the representative memory device 110-1 (see the step 210-1). In an embodiment, the read command may be transmitted from a third controller pad 121-C of the controller 120 to the third chip pad 13-1 of the representative memory device 110-1. In order to generate the internal delay clock signal Internal_CKD of the controller 120, the first switch 129A of the controller 120 may electrically connect an output terminal of the sampling circuit 124 to an input terminal of the first delay control block 126. This electrical connection between the output terminal of the sampling circuit 124 and the input terminal of the first delay control block 126 may be maintained until the generation of the internal delay clock signal Internal_CKD terminates. The representative memory device 110-1 may transmit the data strobe signal DQS1 to the controller 120 in response to the read command provided by the controller 120 (see the step 210-2 of FIG. 16). The data strobe signal DQS1 of the representative memory device 110-1 transmitted to the controller 120 may be inputted to the sampling circuit 124 of the controller 120. The sampling circuit 124 may perform a sampling operation of the data strobe signal DQS1 using the internal delay clock signal Internal_CKD as a reference signal. At this point in time, the internal delay clock signal Internal_CKD may be the same signal as the internal clock signal Internal_CK.

In an ideal case, the replica delay time of the representative memory device 110-1 may be equal to the real delay time of the representative memory device 110-1. However, the replica delay time and the real delay time of the representative memory device 110-1 may be different from each other due to various parameters while the representative memory device 110-1 and the controller 120 are designed and fabricated. In an exemplary embodiment, as illustrated in the timing diagram of FIG. 20, the representative memory device 110-1 may exhibit a real delay time of "tRealDelay1_1" which is greater than a replica delay time of "tReplicaDelay1". That is, the data strobe signal DQS1 of the representative memory device 110-1 may be outputted from the representative memory device 110-1 later than an end point of the replica delay time of "tReplicaDelay1" by a certain time. In such a case, a timing skew of "tDQSCK1A_1" corresponding to a difference (tRealDelay1_1 minus tReplicaDelay1) between the real delay time and the replica delay time may exist between the data strobe signal DQS1 outputted from the representative memory device 110-1 and a first internal delay clock signal Internal_CKD1 of the controller 120. At this time, because the data strobe signal DQS1 outputted from the representative memory device 110-1 has a logic "low" level at a rising edge of the first internal delay clock signal Internal_CKD1 (i.e., the internal clock signal Internal_CK) of the controller 120, the sampling circuit 124 of the controller 120 may output a low level signal as a first sampling circuit output signal SCO1_1. The first delay control block 126 receiving a low level signal as the first sampling circuit output signal SCO1_1 may output the first control signal CS1 operating the delay circuit 125. The delay circuit 125 may delay the internal clock signal Internal_CK by a certain time in response to the first control signal CS1 to generate a second internal delay clock signal Internal_CKD2. In an embodiment, the second internal delay clock signal Internal_CKD2 may be generated by delaying internal clock signal Internal_CK by a time of "tDelay".

Referring to FIG. 18, in order to verify synchronization between the data strobe signal DQS1 of the representative memory device 110-1 and the second internal delay clock signal Internal_CKD2 of the controller 120, the controller 120 may transmit the read command to the representative memory device 110-1 again such that the representative memory device 110-1 outputs a second data strobe signal DQS1. The second data strobe signal DQS1 outputted from the representative memory device 110-1 may be inputted to the sampling circuit 124 of the controller 120. Because a phase of the data strobe signal DQS is not adjusted in the representative memory device 110-1, there may be substantially no phase difference between the first data strobe signal DQS1 and the second data strobe signal DQS1.

As illustrated in FIG. 21, a timing skew of "tDQSCK1A_2" may exist between the data strobe signal DQS1 and the second internal delay clock signal Internal_CKD2 of the controller 120. Because the data strobe signal DQS1 still has a logic "low" level at a rising edge of the second internal delay clock signal Internal_CKD2 of the controller 120, the sampling circuit 124 of the controller 120 may output a low level signal as a second sampling circuit output signal SCO1_2. The first delay control block 126 receiving a low level signal as the second sampling circuit output signal SCO1_2 may output the first control signal CS1 operating the delay circuit 125. The delay circuit 125 may delay a first internal clock signal Internal_CK1 by a time of "tDelay" in response to the first control signal CS1 to generate a third internal delay clock signal Internal_CKD3.

Referring to FIG. 19, because the second data strobe signal DQS1 is not synchronized with the second internal delay clock signal Internal_CKD2 yet, the controller 120 may transmit the read command to the representative memory device 110-1 again such that the representative memory device 110-1 outputs a third data strobe signal DQS1. The third data strobe signal DQS1 may be inputted to the sampling circuit 124 of the controller 120. The sampling circuit 124 may perform a sampling operation of the third data strobe signal DQS1 using the third internal delay clock signal Internal_CKD3 as a reference signal, thereby outputting a third sampling circuit output signal SCO1_3. As illustrated in FIG. 22, in the event that the third data strobe signal DQS1 is synchronized with the third internal delay clock signal Internal_CKD3 of the controller 120, that is, the third data strobe signal DQS1 is not a low level signal any more at a rising edge of the third internal delay clock signal Internal_CKD3 of the controller 120, the sampling circuit 124 may output a high level signal as the third sampling circuit output signal SCO1_3 which is transmitted to the first delay control block 126. The first delay control block 126 may output the first control signal CS1 to the delay circuit 125 to terminate a delay operation of the delay circuit 125 as a level of the third sampling circuit output signal SCO1_3 is changed from the previous logic "low" level into a logic "high" level. Thus, the delay circuit 125 may not perform an additional delay operation of the internal clock signal in the controller 120 during a subsequent training operation of each of the non-representative memory devices 110-2, . . . , and 110-M. As a result, the third internal delay clock signal Internal_CKD3 synchronized with the data strobe signal DQS of the representative memory device 110-1 may be fixedly inputted to the sampling circuit 124. If the generation of the internal delay clock signal in the controller 120 terminates, the first switch 129A may disconnect the sampling circuit 124 from the first delay control block 126.

Figure 23:
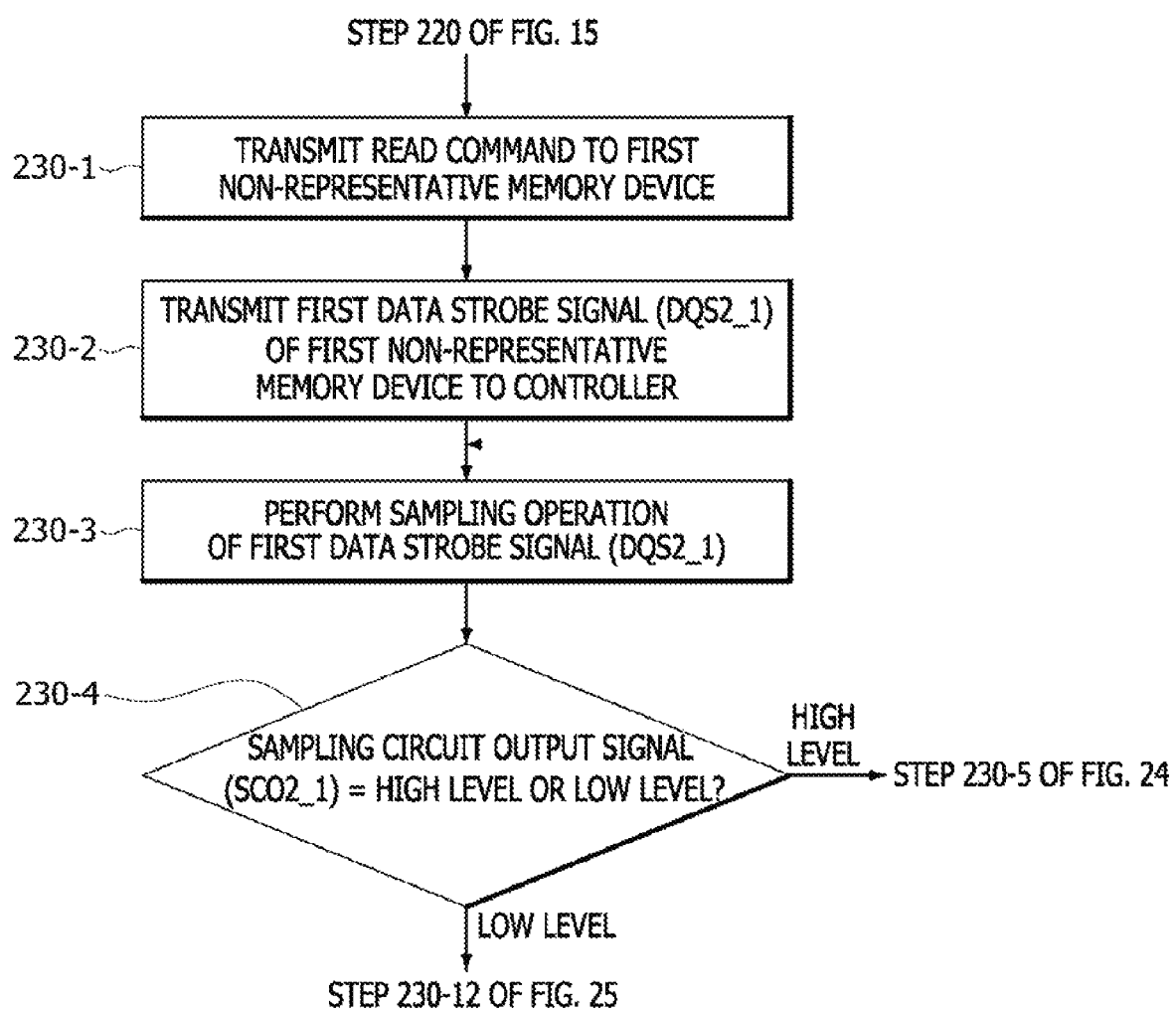
FIGS. 23 to 25 are flowcharts illustrating a training operation of a first non-representative memory device among non-representative memory devices, in a step 230 of FIG. 15.
Figure 24:
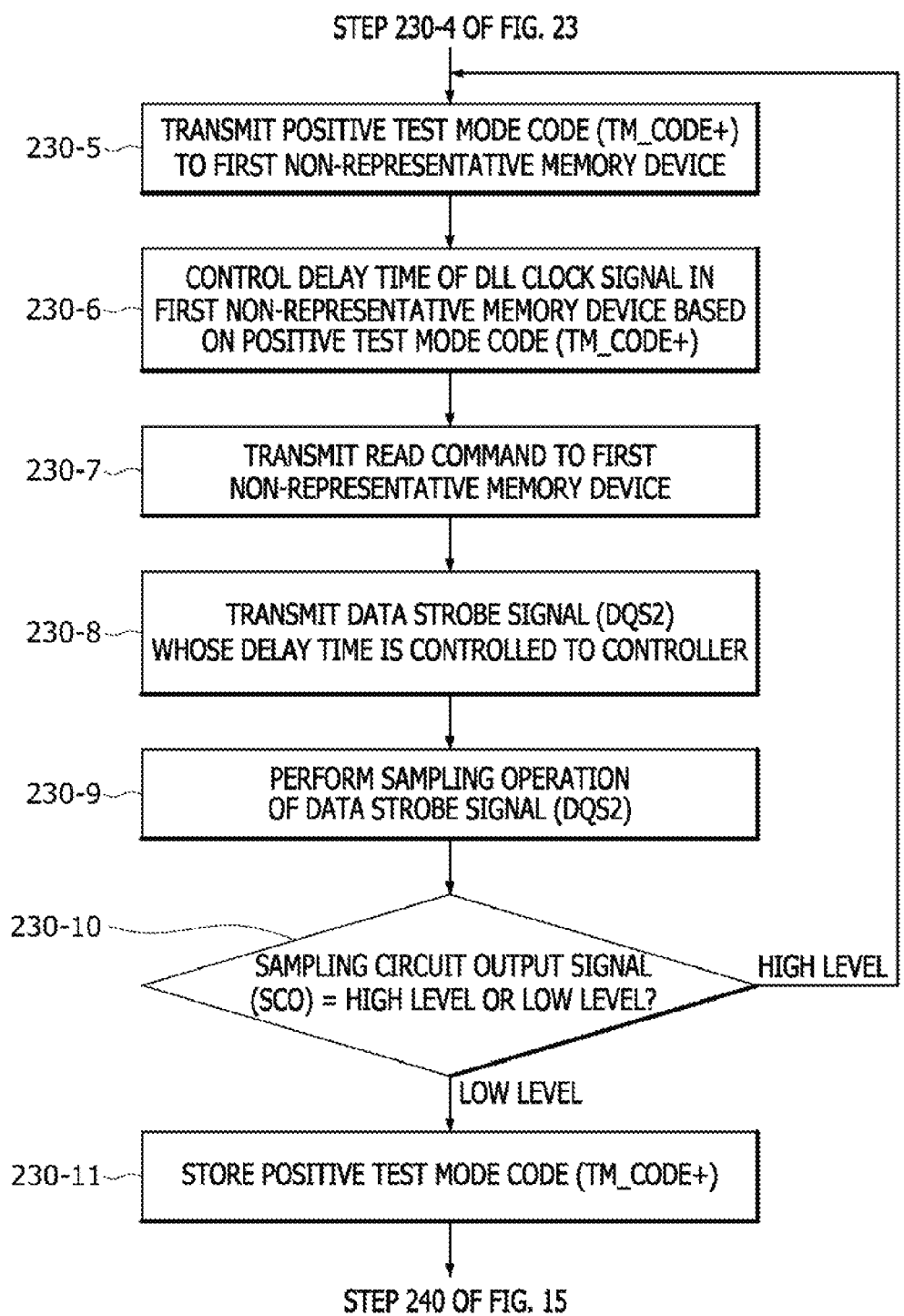
Figure 25:
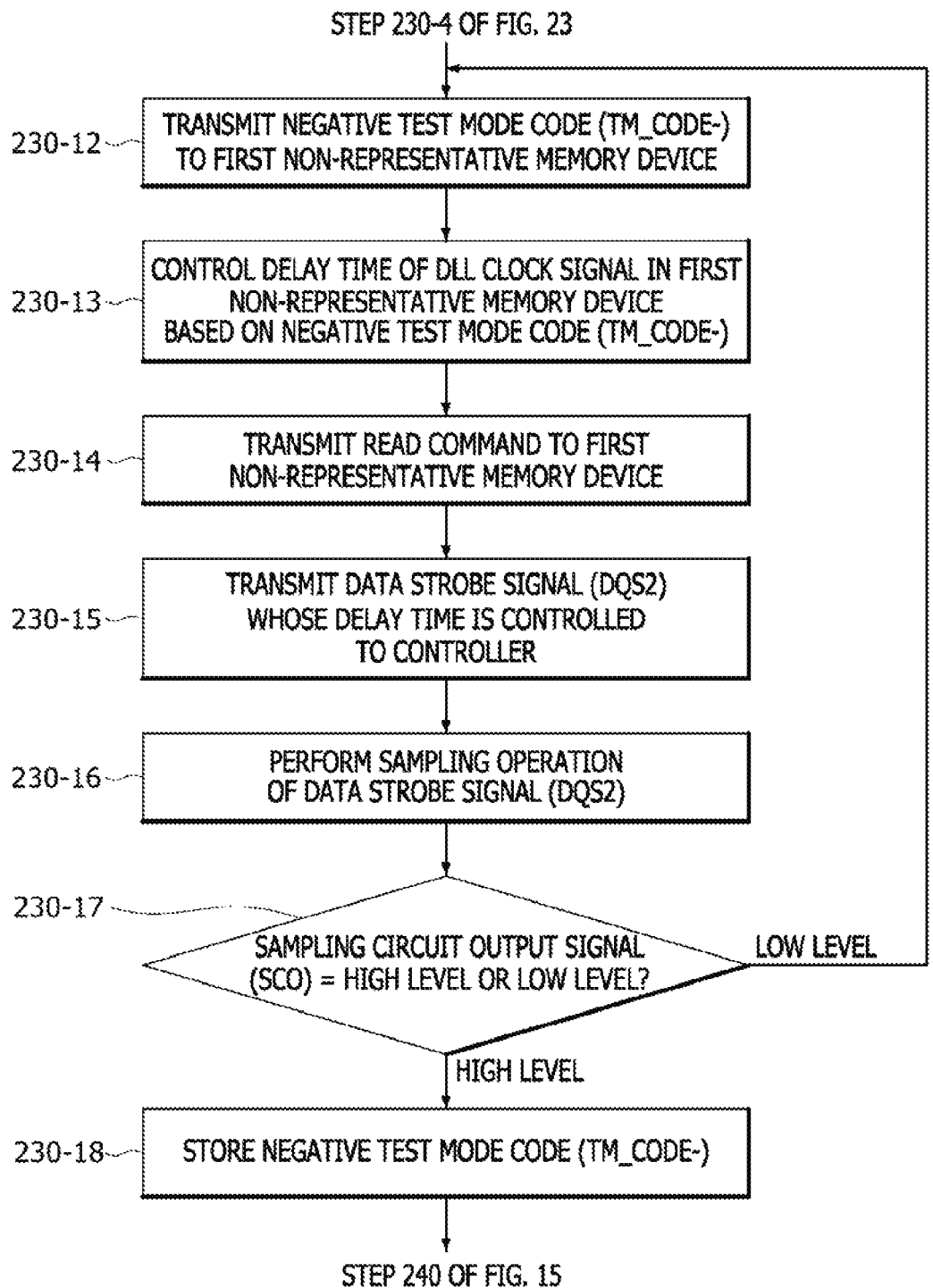

FIGS. 23 to 25 are flowcharts more specifically illustrating the step 230 of FIG. 15 for a training operation of the first non-representative memory device 110-2 among the non-representative memory devices. The training operation of the first non-representative memory device 110-2 described hereinafter may also be equally applicable to each of the remaining non-representative memory device 110-3, . . . , and 110-M. Specifically, FIG. 23 illustrates a sampling operation of the data strobe signal DQS2, which is transmitted from the first non-representative memory device 110-2 to the controller 120, in the controller 120. Referring to FIG. 23, the controller 120 may transmit the read command to the first non-representative memory device 110-2 (see a step 230-1). The first non-representative memory device 110-2 may transmit a first data strobe signal DQS2_1 to the controller 120 in response to the read command (see a step 230-2). A sampling operation of the first data strobe signal DQS2_1 may be performed in the controller 120 (see a step 230-3). The sampling operation may be performed using the internal delay clock signal (e.g., the third internal delay clock signal Internal_CKD3) generated at the step 210 of FIG. 15 as a reference signal. Whether a first sampling circuit output signal SCO2_1 generated by the sampling operation is a high level signal or a low level signal is discriminated (see a step 230-4). If the first sampling circuit output signal SCO2_1 is a high level signal at the step 230-4, a step 230-5 of FIG. 25 may then be performed. If the first sampling circuit output signal SCO2_1 is a low level signal at the step 230-4, a step 230-12 of FIG. 25 may then be performed.

FIG. 24 illustrates a training operation of the first non-representative memory device 110-2 when the first sampling circuit output signal SCO2_1 is a high level signal at the step 230-4 of FIG. 23. Referring to FIG. 24, if the first sampling circuit output signal SCO2_1 is a high level signal as a result of the sampling operation for the first data strobe signal DQS2_1 of the first non-representative memory device 110-2, the positive test mode code TM_code+ may be transmitted from the controller 120 to the first non-representative memory device 110-2 (see a step 230-5). The first non-representative memory device 110-2 may control a delay time of the DLL clock signal based on the positive test mode code TM_code+ to increase the delay time of the DLL clock signal (see a step 230-6). The controller 120 may transmit the read command to the first non-representative memory device 110-2 (see a step 230-7). The first non-representative memory device 110-2 may transmit the data strobe signal DQS2, a delay time of which is increased in synchronization with the DLL clock signal, to the controller 120 in response to the read command (see a step 230-8). The controller 120 may perform a sampling operation of the data strobe signal DQS2 (see a step 230-9). This sampling operation may be performed using the third internal delay clock signal Internal_CKD3 generated at the step 210 of FIG. 15 as a reference signal. Whether a sampling circuit output signal SCO generated by the sampling operation is a high level signal or a low level signal is discriminated (see a step 230-10). If the sampling circuit output signal SCO is a high level signal at the step 230-10, that is, the sampling circuit output signal SCO has the same level as the previous sampling circuit output signal, the step 230-5 may be performed again. If the sampling circuit output signal SCO is a low level signal at the step 230-10, that is, the sampling circuit output signal SCO has a level which is different from a level of the previous sampling circuit output signal, the controller may store the positive test mode code TM_code+ (see a step 230-11). Subsequently, the step 240 of FIG. 15 may be performed.

FIG. 25 illustrates a training operation of the first non-representative memory device 110-2 when the first sampling circuit output signal SCO2_1 is a low level signal at the step 230-4 of FIG. 23. Referring to FIG. 25, if the first sampling circuit output signal SCO2_1 is a low level signal, the negative test mode code TM_code− may be transmitted from the controller 120 to the first non-representative memory device 110-2 (see a step 230-12). The first non-representative memory device 110-2 may control a delay time of the DLL clock signal based on the negative test mode code TM_code− to reduce the delay time of the DLL clock signal (see a step 230-13). The controller 120 may transmit the read command to the first non-representative memory device 110-2 (see a step 230-14). The first non-representative memory device 110-2 may transmit the data strobe signal DQS2, a delay time of which is reduced in synchronization with the DLL clock signal, to the controller 120 in response to the read command (see a step 230-15). The controller 120 may perform a sampling operation of the data strobe signal DQS2 (see a step 230-16). This sampling operation may be performed using the third internal delay clock signal Internal_CKD3 generated at the step 210 of FIG. 15 as a reference signal. Whether a sampling circuit output signal SCO generated by the sampling operation is a high level signal or a low level signal is discriminated (see a step 230-17). If the sampling circuit output signal SCO is a low level signal at the step 230-17, that is, the sampling circuit output signal SCO has the same level as the previous sampling circuit output signal, the step 230-12 may be performed again. If the sampling circuit output signal SCO is a high level signal at the step 230-17, that is, the sampling circuit output signal SCO has a level which is different from a level of the previous sampling circuit output signal, the controller 120 may store the negative test mode code TM_code− (see a step 230-18). Subsequently, the step 240 of FIG. 15 may be performed.

Figure 26:
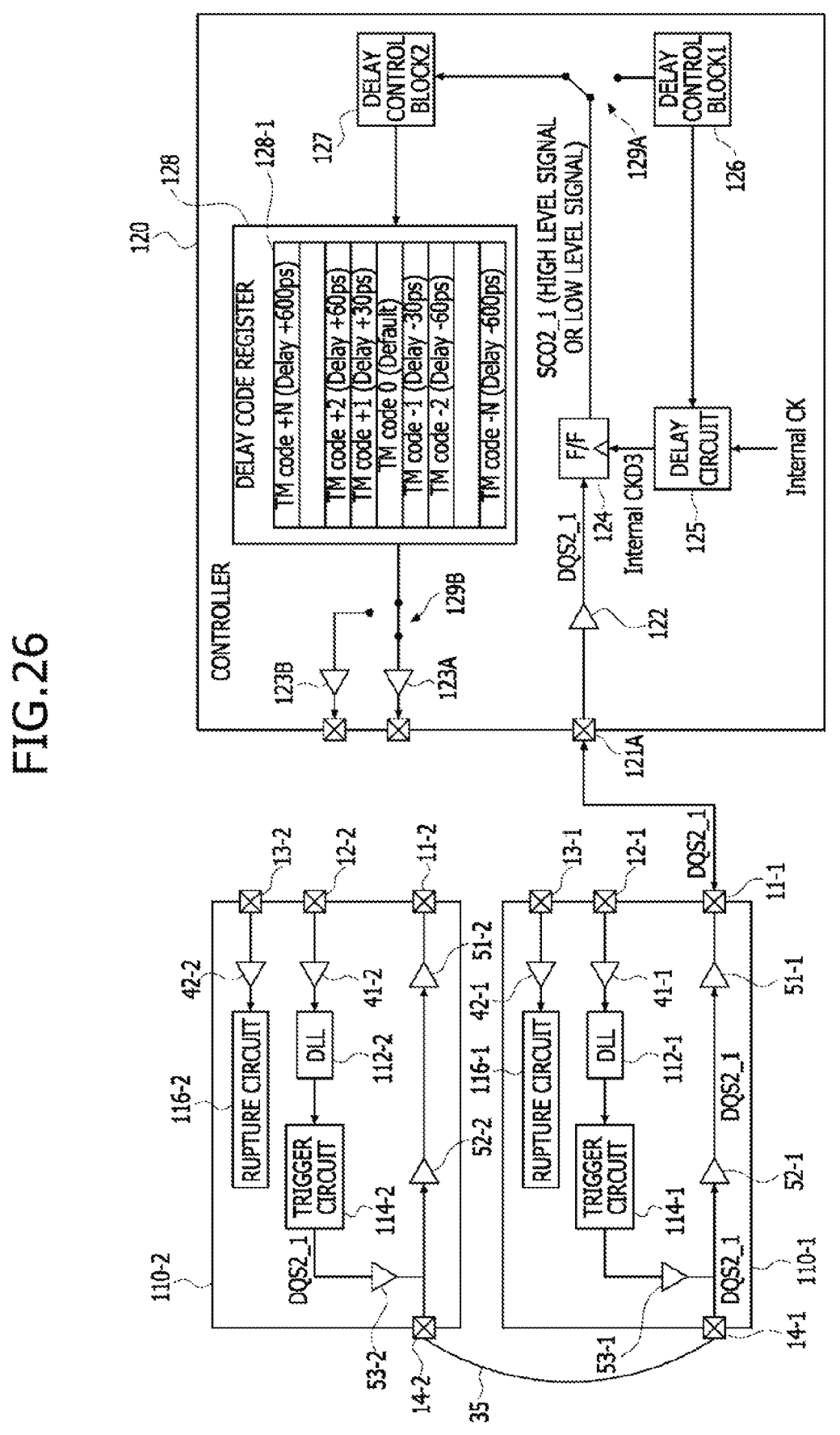

FIG. 26 is a block diagram more specifically illustrating the steps 230-1 to 230-4 of FIG. 23. Referring to FIGS. 23 and 26, if the read command is transmitted to the first non-representative memory device 110-2 at the step 230-1 of FIG. 23, the first non-representative memory device 110-2 may generate the first data strobe signal DQS2_1 in response to the read command and the first data strobe signal DQS2_1 may be transmitted to the controller 120 through the representative memory device 110-1 (see the step 230-2 of FIG. 23). Specifically, the trigger circuit 114-2 of the first non-representative memory device 110-2 may output the first data strobe signal DQS2_1 synchronized with the DLL clock signal outputted from the DLL circuit 112-2. The first data strobe signal DQS2_1 outputted from the trigger circuit 114-2 of the first non-representative memory device 110-2 may be transmitted to the fourth chip pad 14-1 of the representative memory device 110-1 through the third driver 53-2 and the fourth chip pad 14-2 of the first non-representative memory device 110-2. The first data strobe signal DQS2_1 of the first non-representative memory device 110-2 transmitted to the fourth chip pad 14-1 of the representative memory device 110-1 may be transmitted to the first controller pad 121A of the controller 120 through the second driver 52-1, the first driver 51-1 and the first chip pad 11-1 of the representative memory device 110-1.

The first data strobe signal DQS2_1 of the first non-representative memory device 110-2 transmitted to the first controller pad 121A may be inputted to the sampling circuit 124 through the receiver 122 of the controller 120. The sampling circuit 124 of the controller 120 may perform a sampling operation of the first data strobe signal DQS2_1 of the first non-representative memory device 110-2 using the third internal delay clock signal Internal_CKD3 of the controller 120 as a reference signal. That is, the sampling circuit 124 may perform a sampling operation of the first data strobe signal DQS2_1 using the third internal delay clock signal Internal_CKD3 of the controller 120 as a reference signal and may output the first sampling circuit output signal SCO2_1 as a result of the sampling operation through an output terminal of the sampling circuit 124. The first sampling circuit output signal SCO2_1 may be a high level signal or a low level signal according to a phase of the first data strobe signal DQS2_1 of the first non-representative memory device 110-2. The first sampling circuit output signal SCO2_1 outputted from the sampling circuit 124 may be inputted to the second delay control block 127 of the controller 120. At the step 230-4 of FIG. 23, the second delay control block 127 may discriminate whether the first sampling circuit output signal SCO2_1 is a high level signal or a low level signal.

Figure 27:
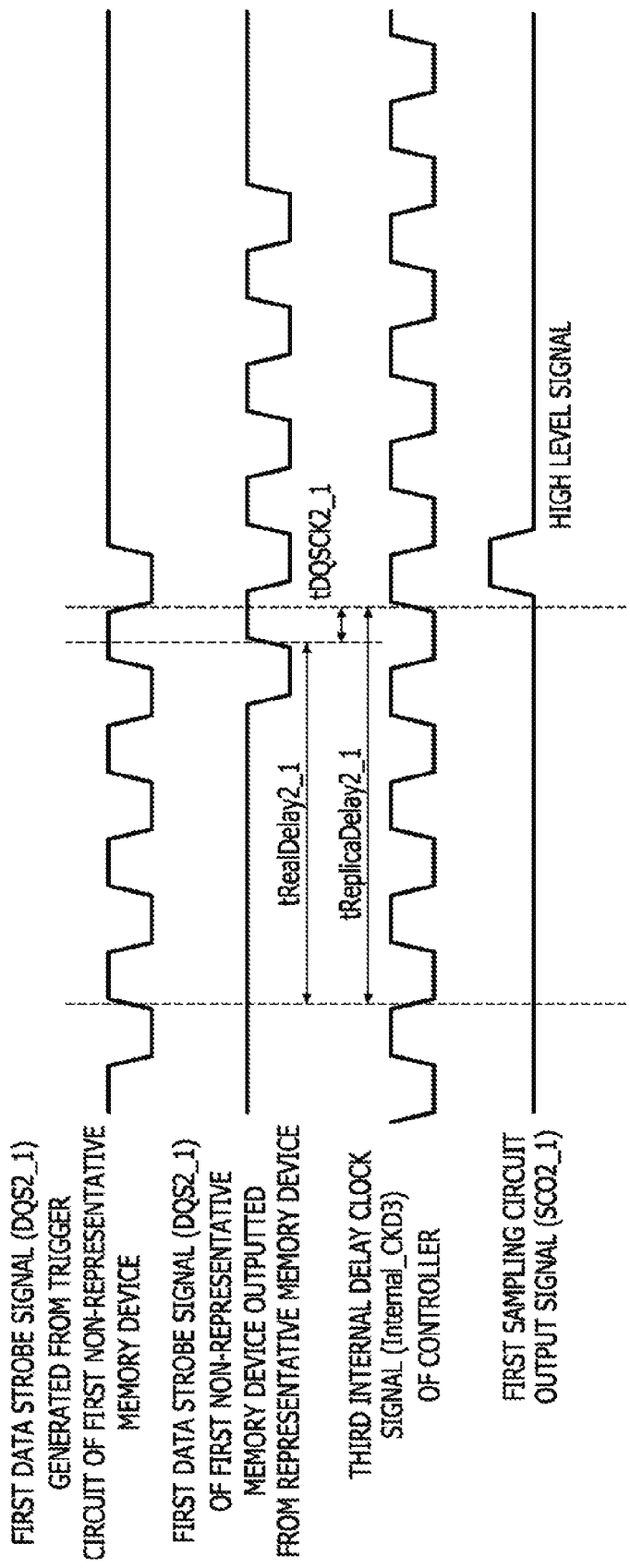
FIG. 27 is a timing diagram illustrating a case that a first sampling circuit output signal generated by a sampling operation of a step 230-3 of FIG. 23 has a logic "high" level.

FIG. 27 is a timing diagram illustrating a case that the first sampling circuit output signal SCO2_1 generated by the sampling operation of the step 230-3 of FIG. 23 is a high level signal. Referring to FIG. 27, the first data strobe signal DQS2_1 of the first non-representative memory device 110-2 transmitted from the representative memory device 110-1 to the controller 120 may exhibit a real delay time of "tRealDelay2_1" which is less than a replica delay time of "tReplicaDelay2_1". This may correspond to the case that a delay time in the representative memory device 110-1 is less than a delay time in the first non-representative memory device 110-2, as described with reference to FIG. 10. Thus, the first data strobe signal DQS2_1 of the first non-representative memory device 110-2 outputted from the representative memory device 110-1 may be transmitted to the controller 120 earlier than a rising edge of the third internal delay clock signal Internal_CKD3 of the controller 120 by a timing skew of "tDQSCK2_1". Because the first data strobe signal DQS2_1 has a logic "high" level at a rising edge of the third internal delay clock signal Internal_CKD3 inputted to the sampling circuit 124, the sampling circuit 124 may output a high level signal as the first sampling circuit output signal SCO2_1.

Figure 28:
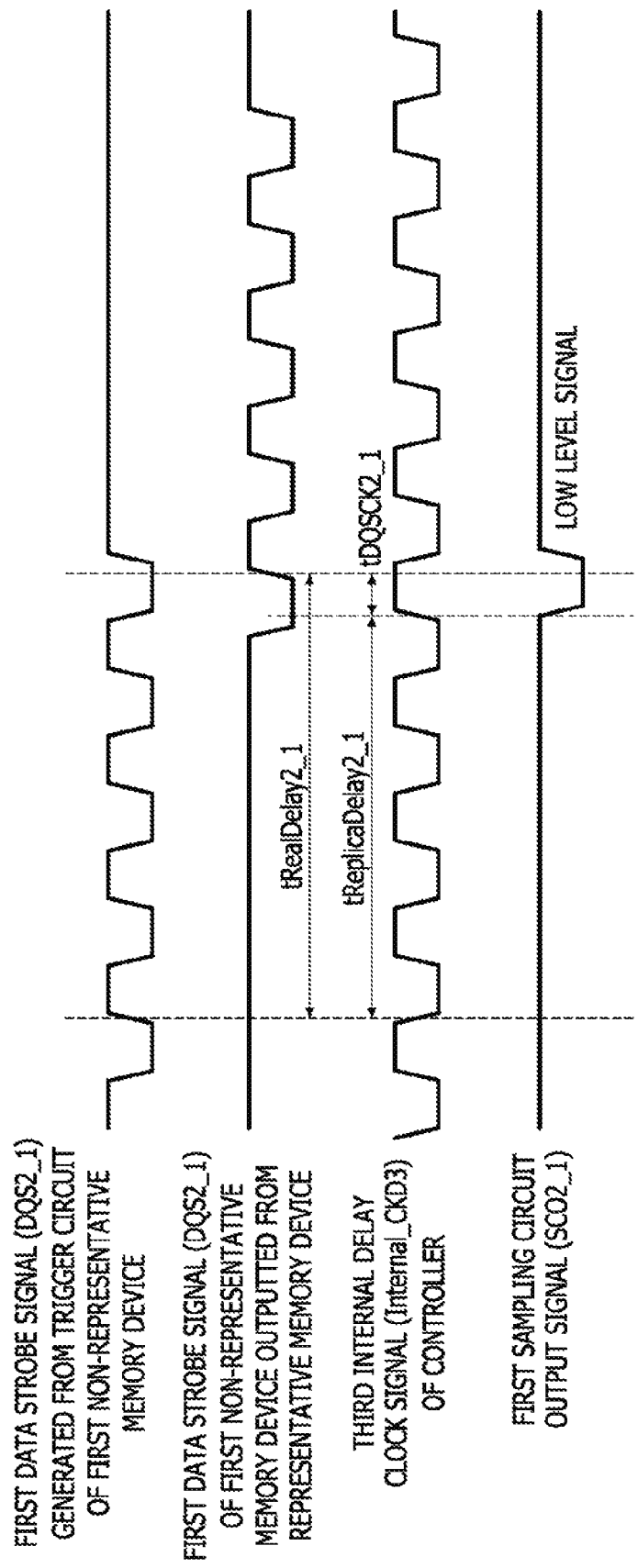
FIG. 28 is a timing diagram illustrating a case that a first sampling circuit output signal generated by a sampling operation of a step 230-3 of FIG. 23 has a logic "low" level.

FIG. 28 is a timing diagram illustrating a case that the first sampling circuit output signal SCO2_1 generated by the sampling operation of the step 230-3 of FIG. 23 is a low level signal. Referring to FIG. 28, the first data strobe signal DQS2_1 of the first non-representative memory device 110-2 outputted from the representative memory device 110-1 may exhibit a real delay time of "tRealDelay2_1" which is greater than the replica delay time of "tReplicaDelay2_1". This may correspond to the case that a delay time in the representative memory device 110-1 is greater than a delay time in the first non-representative memory device 110-2, as described with reference to FIG. 11. Thus, the first data strobe signal DQS2_1 of the first non-representative memory device 110-2 outputted from the representative memory device 110-1 may be transmitted to the controller 120 later than a rising edge of the third internal delay clock signal Internal_CKD3 of the controller 120 by the timing skew of "tDQSCK2_1". Because the first data strobe signal DQS2_1 has a logic "low" level at a rising edge of the third internal delay clock signal Internal_CKD3 inputted to the sampling circuit 124, the sampling circuit 124 may output a low level signal as the first sampling circuit output signal SCO2_1.

Figure 29:
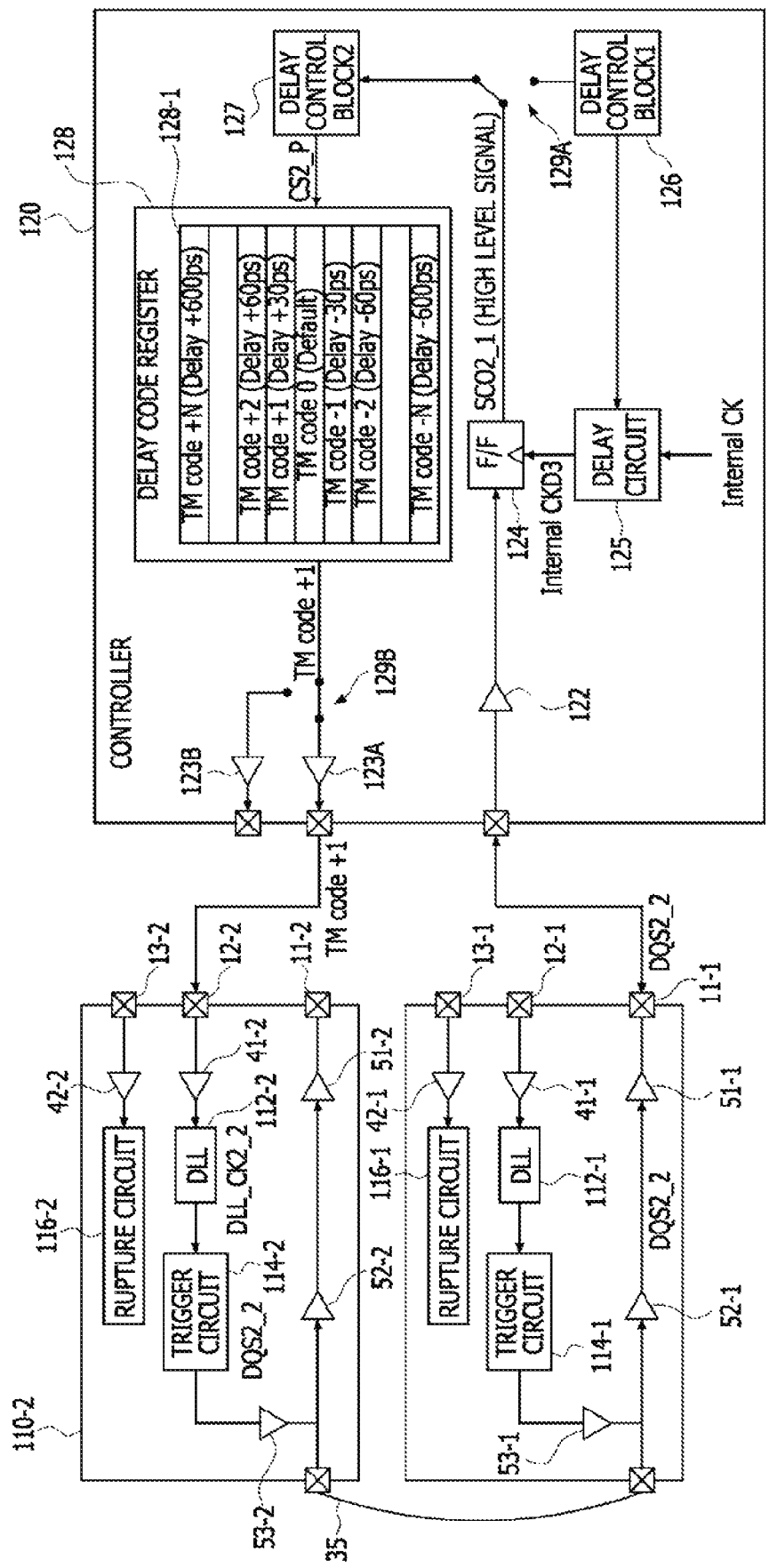
FIG. 29 is a block diagram illustrating a first positive test mode code transmission process of a step 230-5 of FIG. 24 and a delay time control process of a second data strobe signal and a transmission process of a delayed second data strobe signal in a first non-representative memory device of steps 230-6 to 230-8 of FIG. 24.

FIG. 29 is a block diagram illustrating a transmission process of the first positive test mode code TM_code+1 at the step 230-5 of FIG. 24 and a delay time control process of the second data strobe signal DQS2_2 and a transmission process of a delayed second data strobe signal in the first non-representative memory device 110-2 illustrated in the steps 230-6 to 230-8 of FIG. 24. In FIG. 29, the same reference numerals as used in FIG. 26 denote the same elements. Referring to FIGS. 24 and 29, a high level signal corresponding to the first sampling circuit output signal SCO2_1 generated from the sampling circuit 124 at the step 230-4 of FIG. 23 may be inputted to the second delay control block 127. In order to transmit the positive test mode code TM_code+ at the step 230-5 of FIG. 24, the second delay control block 127 may transmit a second control signal CS2_P to the delay code register 128 such that the positive test mode code TM_code+ among the test mode codes stored in the test mode code table 128-1 included in the delay code register 128 is outputted. The delay code register 128 receiving the second control signal CS2_P may output the first positive test mode code TM_code+1 among the plurality of positive test mode codes TM_code+1, TM_code+2, . . . , and TM_code+N.

The first positive test mode code TM_code+1 may be inputted to the DLL circuit 112-2 of the first non-representative memory device 110-2. The DLL circuit 112-2 of the first non-representative memory device 110-2 may generate the DLL clock signal DLL_CK2_2 whose delay time is increased by delay information (e.g., 30 picoseconds) of the first positive test mode code TM_code+1. The trigger circuit 114-2 of the first non-representative memory device 110-2 may generate the second data strobe signal DQS2_2 which is synchronized with the DLL clock signal DLL_CK2_2. The second data strobe signal DQS2_2 of the first non-representative memory device 110-2 may be transmitted to the controller 120 through the representative memory device 110-1. A path through which the second data strobe signal DQS2_2 of the first non-representative memory device 110-2 is transmitted to the controller 120 may be the same as a path through which the first data strobe signal DQS2_1 of the first non-representative memory device 110-2 is transmitted to the controller 120.

Figure 30:
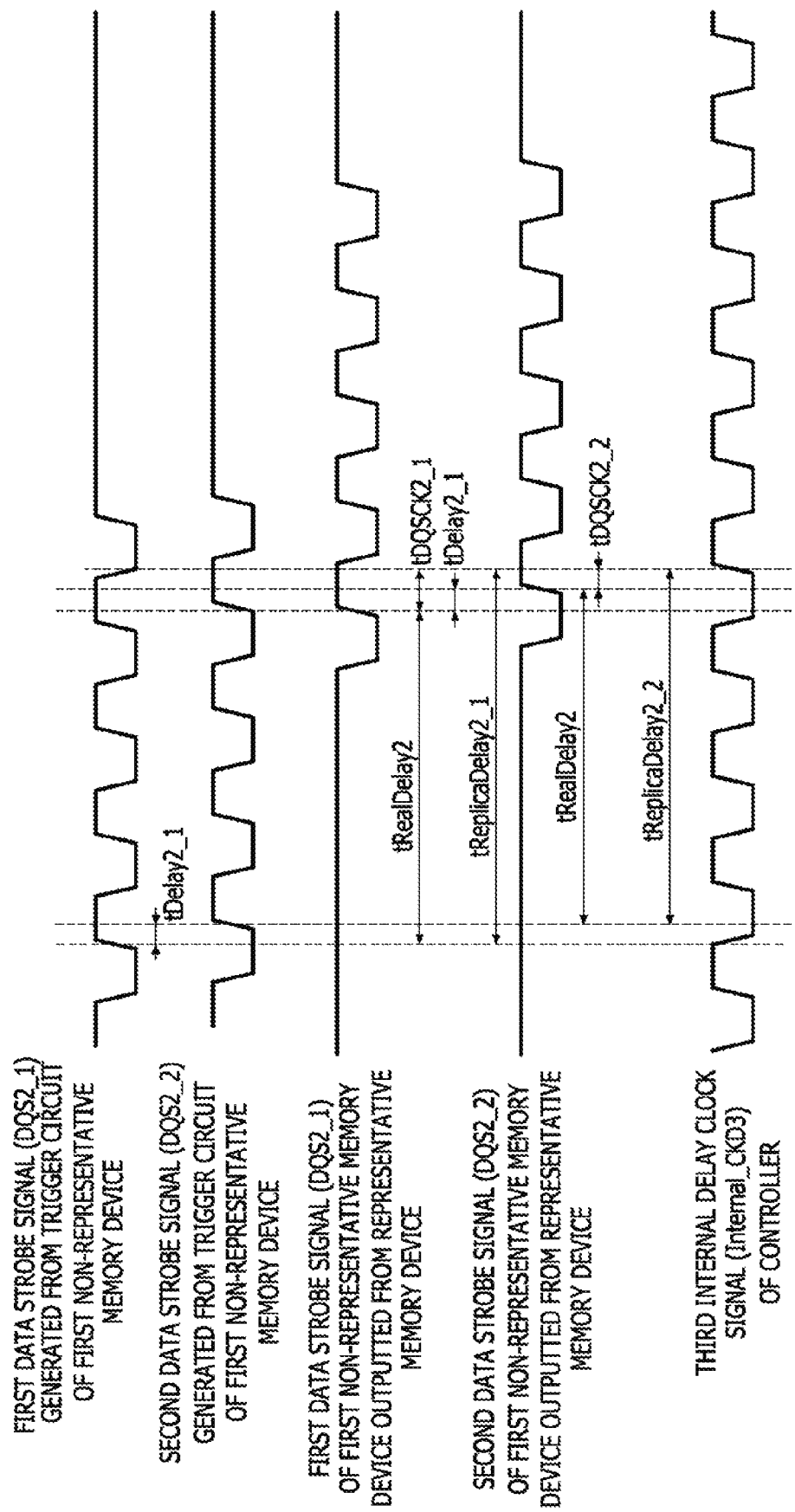
FIG. 30 is a timing diagram illustrating a phase of a second data strobe signal of the first non-representative memory device, a delay time of which is increased by a step 230-8 of FIG. 24, together with a phase of a first data strobe signal.

FIG. 30 is a timing diagram illustrating a phase of the second data strobe signal DQS2_2 of the first non-representative memory device 110-2, a delay time of which is increased by the step 230-8 of FIG. 24, together with a phase of the first data strobe signal DQS2_1. Referring to FIG. 30, because the DLL clock signal whose delay time is increased by a first delay time of "tDelay2_1(=30 picoseconds)" determined by the first positive test mode code TM_code+1 is generated by the DLL circuit 112-2 of the first non-representative memory device 110-2, the second data strobe signal DQS2_2 generated by the trigger circuit 114-2 of the first non-representative memory device 110-2 in synchronization with the DLL clock signal may also be additionally delayed by the first delay time of "tDelay2_1(=30 picoseconds)". Thus, the second data strobe signal DQS2_2 of the first non-representative memory device 110-2 outputted from the representative memory device 110-1 may also be more delayed by the first delay time of "tDelay2_1(=30 picoseconds)" as compared with the first data strobe signal DQS2_1 of the first non-representative memory device 110-2 outputted from the representative memory device 110-1. As a result, a replica delay time "tReplicaDelay2_2" of the second data strobe signal DQS2_2 of the first non-representative memory device 110-2 may become less than the replica delay time "tReplicaDelay2_1" of the first data strobe signal DQS2_1. A timing skew of "tDQSCK2_2" between the second data strobe signal DQS2_2 of the first non-representative memory device 110-2 and the third internal delay clock signal Internal_CKD3 of the controller 120 may also become less than the timing skew of "tDQSCK2_1" between the first data strobe signal DQS2_1 of the first non-representative memory device 110-2 and the third internal delay clock signal Internal_CKD3 of the controller 120.

Even though a delay time of the second data strobe signal DQS2_2 of the first non-representative memory device 110-2 becomes increased as compared with a delay time of the first data strobe signal DQS2_1 of the first non-representative memory device 110-2, the timing skew of "tDQSCK2_2" may still exist between a rising edge of the second data strobe signal DQS2_2 of the first non-representative memory device 110-2 and a rising edge of the third internal delay clock signal Internal_CKD3 of the controller 120. That is, the second data strobe signal DQS2_2 may be outputted from the representative memory device 110-1 earlier than a rising edge of the third internal delay clock signal Internal_CKD3 by the timing skew of "tDQSCK2_2" and may be inputted to the controller 120. Thus, the second data strobe signal DQS2_2 may still have a logic "high" level at a rising edge of the third internal delay clock signal Internal_CKD3 of the controller 120. Accordingly, as a result of the sampling operation of the second data strobe signal DQS2_2, the sampling circuit 124 may output a second sampling circuit output signal SCO2_2 having a logic "high" level.

Figure 31:
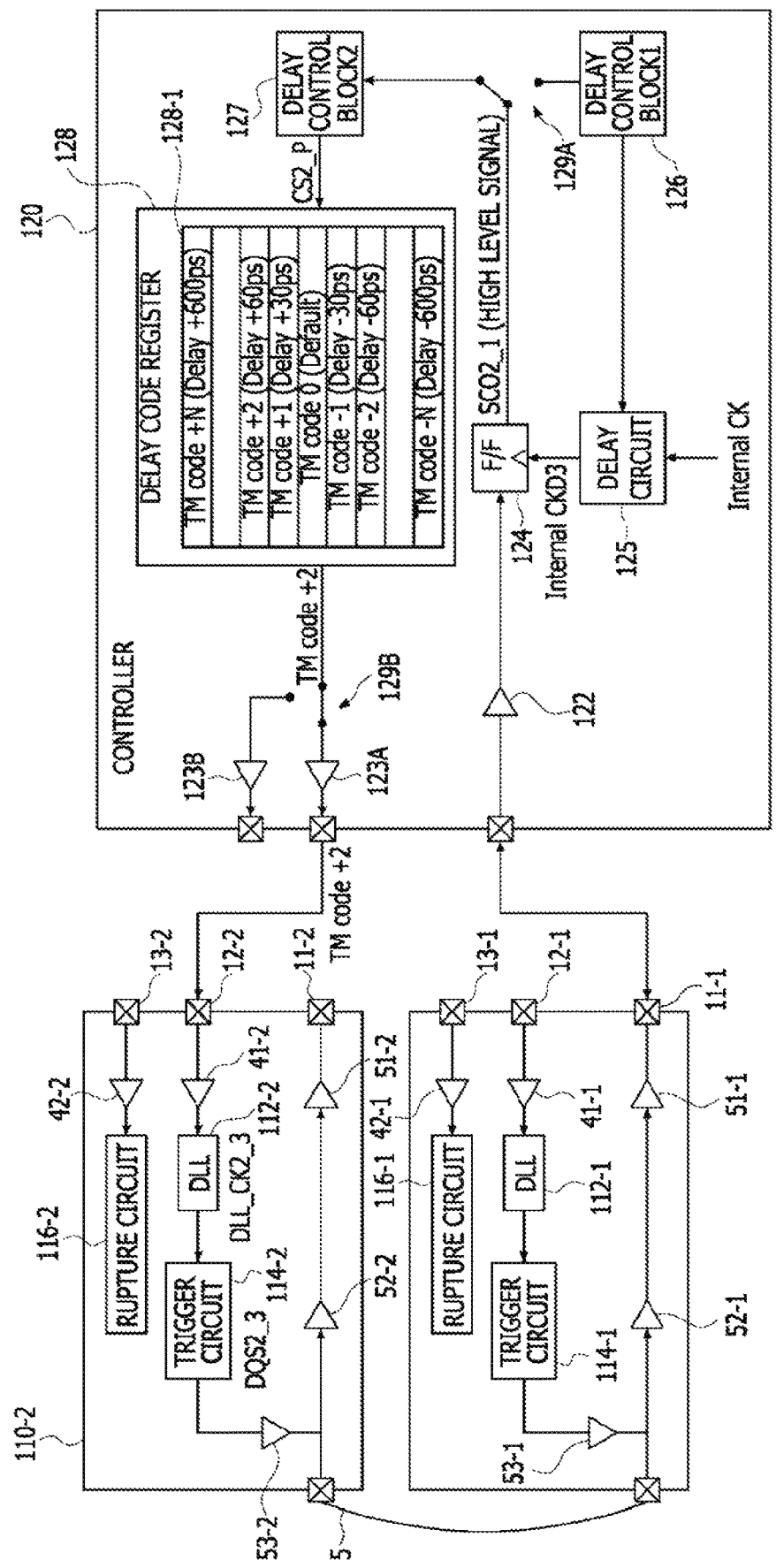
FIG. 31 is a block diagram illustrating steps 230-5 to 230-8 executed by a feedback loop in case that a second sampling circuit output signal has a logic "high" level at a step 230-10 of FIG. 24.

FIG. 31 is a block diagram illustrating the steps 230-5 to 230-8 of FIG. 24 executed by a feedback loop in case that the second sampling circuit output signal SCO2_2 has a logic "high" level at the step 230-10 of FIG. 24. Referring to FIG. 31, when the second sampling circuit output signal SCO2_2 for the second data strobe signal DQS2_2 of the first non-representative memory device 110-2 is a high level signal (having a logic "high" level) at the step 230-10 of FIG. 24, the training operation of the first non-representative memory device 110-2 may be fed back to the step 230-5 of FIG. 24 to transmit the positive test mode code TM_code+ to the first non-representative memory device 110-2. Specifically, the second delay control block 127 receiving the second sampling circuit output signal SCO2_2 having a logic "high" level may transmit the second control signal CS2_P to the delay code register 128 such that the second positive test mode code TM_code+2 corresponding to the next code of the first positive test mode code TM_code+1 is outputted from the delay code register 128. The delay code register 128 receiving the second control signal CS2_P may output the second positive test mode code TM_code+2, and the second positive test mode code TM_code+2 outputted from the delay code register 128 may be transmitted to the first non-representative memory device 110-2. The second positive test mode code TM_code+2 may be a binary stream having information on a delay time which is greater than a delay time of the first positive test mode code TM_code+1 by 30 picoseconds and which is greater than a delay time of the default test mode code TM_code_0 by 60 picoseconds. Thus, the DLL circuit 112-2 of the first non-representative memory device 110-2 receiving the second positive test mode code TM_code+2 may generate a DLL clock signal DLL_CK2_3 whose delay time is increased by 60 picoseconds in addition to the replica delay time. Accordingly, a third data strobe signal DQS2_3 generated by the first non-representative memory device 110-2 may also have a phase which is more delayed by 60 picoseconds in addition to the replica delay time.

Figure 32:
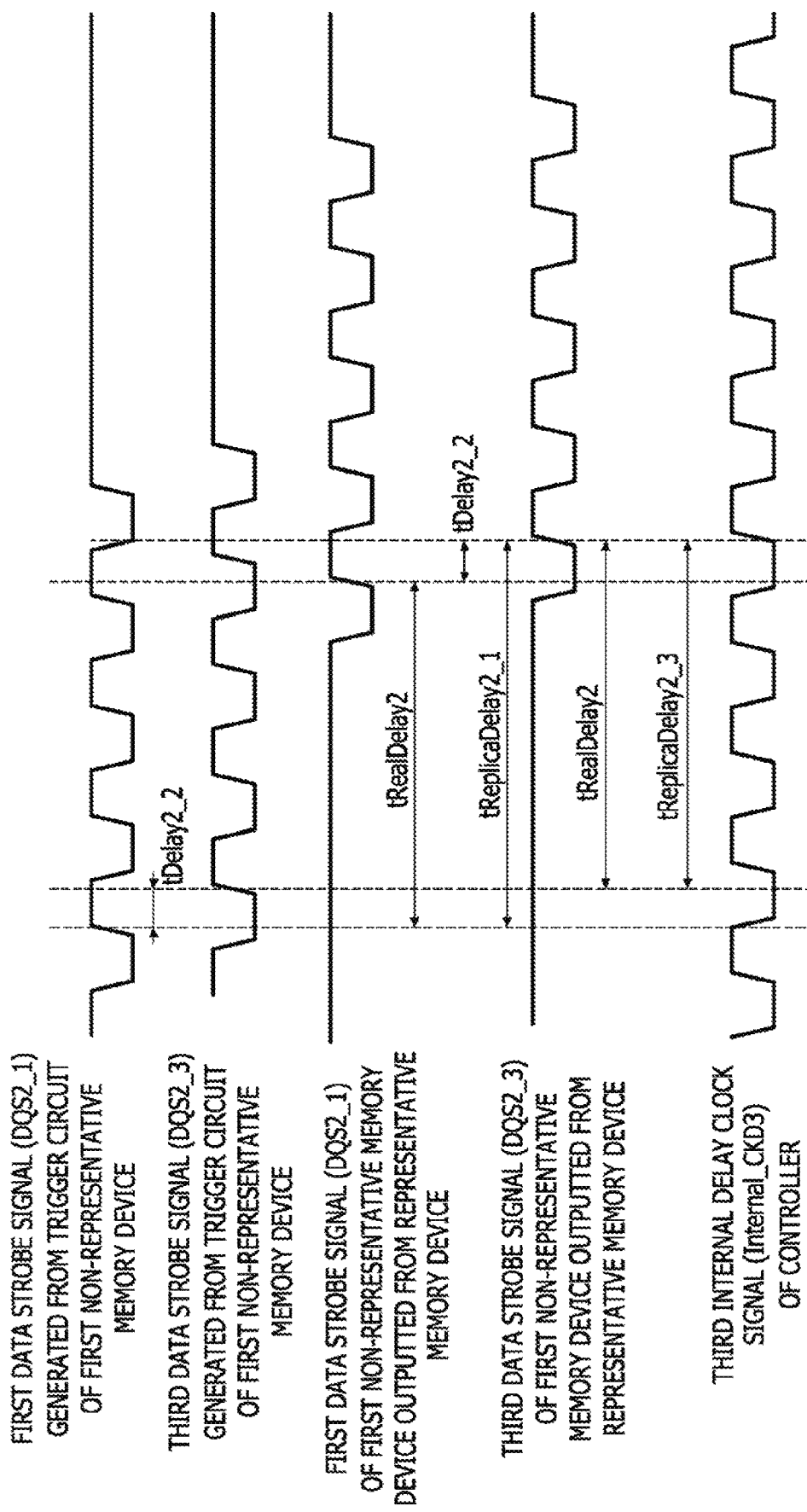
FIG. 32 is a timing diagram illustrating a phase of a third data strobe signal of the first non-representative memory device, a delay time of which is increased by a fed-back step 230-8 of FIG. 24 together with a phase of the first data strobe signal.

FIG. 32 is a timing diagram illustrating a phase of the third data strobe signal DQS2_3 of the first non-representative memory device 110-2, a delay time of which is increased by the fed-back step 230-8 of FIG. 24 together with a phase of the first data strobe signal DQS2-1. Referring to FIG. 32, because the DLL clock signal whose delay time is increased by a second delay time of "tDelay2_2(=60 picoseconds)" determined by the second positive test mode code TM_code+2 is generated by the DLL circuit 112-2 of the first non-representative memory device 110-2, the third data strobe signal DQS2_3 generated by the trigger circuit 114-2 of the first non-representative memory device 110-2 in synchronization with the DLL clock signal may also be additionally delayed by the second delay time of "tDelay2_2(=60 picoseconds)". Thus, the third data strobe signal DQS2_3 of the first non-representative memory device 110-2 outputted from the representative memory device 110-1 may also be more delayed by the second delay time of "tDelay2_2(=60 picoseconds)" as compared with the first data strobe signal DQS2_1 of the first non-representative memory device 110-2 outputted from the representative memory device 110-1. As a result, a replica delay time "tReplicaDelay2_3" of the third data strobe signal DQS2_3 of the first non-representative memory device 110-2 may become less than the replica delay time "tReplicaDelay2_1" of the first data strobe signal DQS2_1 by the second delay time of "tDelay2_2(=60 picoseconds)", and a timing skew between the third data strobe signal DQS2_3 of the first non-representative memory device 110-2 and the third internal delay clock signal Internal_CKD3 of the controller 120 may be removed.

Figure 33:
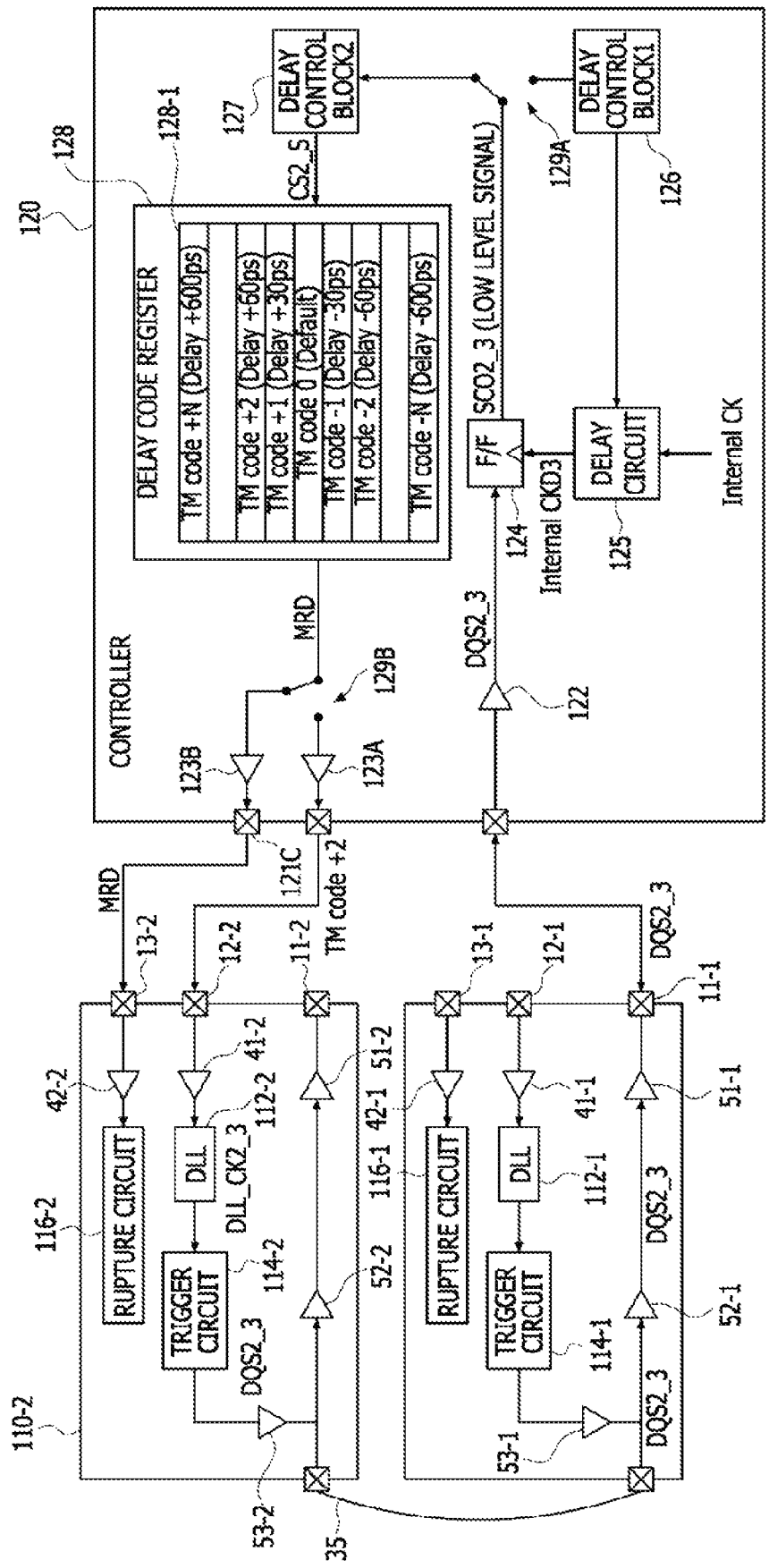
FIG. 33 is a block diagram illustrating fed-back steps 230-9 to 230-11 of FIG. 24.

FIG. 33 is a block diagram illustrating fed-back steps 230-9 to 230-11 of FIG. 24. Referring to FIG. 33, the third data strobe signal DQS2_3 of the first non-representative memory device 110-2 may be inputted to the controller 120 through the representative memory device 110-1. A path through which the third data strobe signal DQS2_3 of the first non-representative memory device 110-2 is transmitted to the controller 120 through the representative memory device 110-1 may be the same as a path through which the first data strobe signal DQS2_1 of the first non-representative memory device 110-2 is transmitted to the controller 120. The controller 120 may perform a sampling operation of the third data strobe signal DQS2_3 of the first non-representative memory device 110-2. This sampling operation may be performed using the third internal delay clock signal Internal_CKD3 generated at the step 210 of FIG. 15 as a reference signal. The third data strobe signal DQS2_3 of the first non-representative memory device 110-2 is not a high level signal any more at a rising edge of the third internal delay clock signal Internal_CKD3 of the controller 120, as illustrated in FIG. 32. Thus, the sampling circuit 124 may output a low level signal as a third sampling circuit output signal SCO2_3.

The second delay control block 127 receiving the third sampling circuit output signal SCO2_3 having a logic "low" level may output a second control signal CS2_S to the delay code register 128 such that the second positive test mode code TM_code+2 corresponding to the previous test mode code is stored in the delay code register 128. This is because a logic "high" level of the second sampling circuit output signal SCO2_2 is changed into a logic "low" level of the third sampling circuit output signal SCO2_3. The delay code register 128 may store the second positive test mode code TM_code+2 and may output the memory repair data MRD having delay information corresponding to the second positive test mode code TM_code+2 to the second driver 123B. The second driver 123B may transmit the memory repair data MRD to the first non-representative memory device 110-2 through the third controller pad 121C. In order that the memory repair data MRD is transmitted to the first non-representative memory device 110-2 through the third controller pad 121C, the second switch 1298 may electrically connect an output terminal of the delay code register 128 to an input terminal of the second driver 123B. The memory repair data MRD transmitted to the first non-representative memory device 110-2 may be inputted to the rupture circuit 116-2. The rupture circuit 116-2 may perform a repair operation such that the data strobe signal DQS2 of the first non-representative memory device 110-2 has a delay time corresponding to the second positive test mode code TM_code+2 according to the memory repair data MRD.

Figure 34:
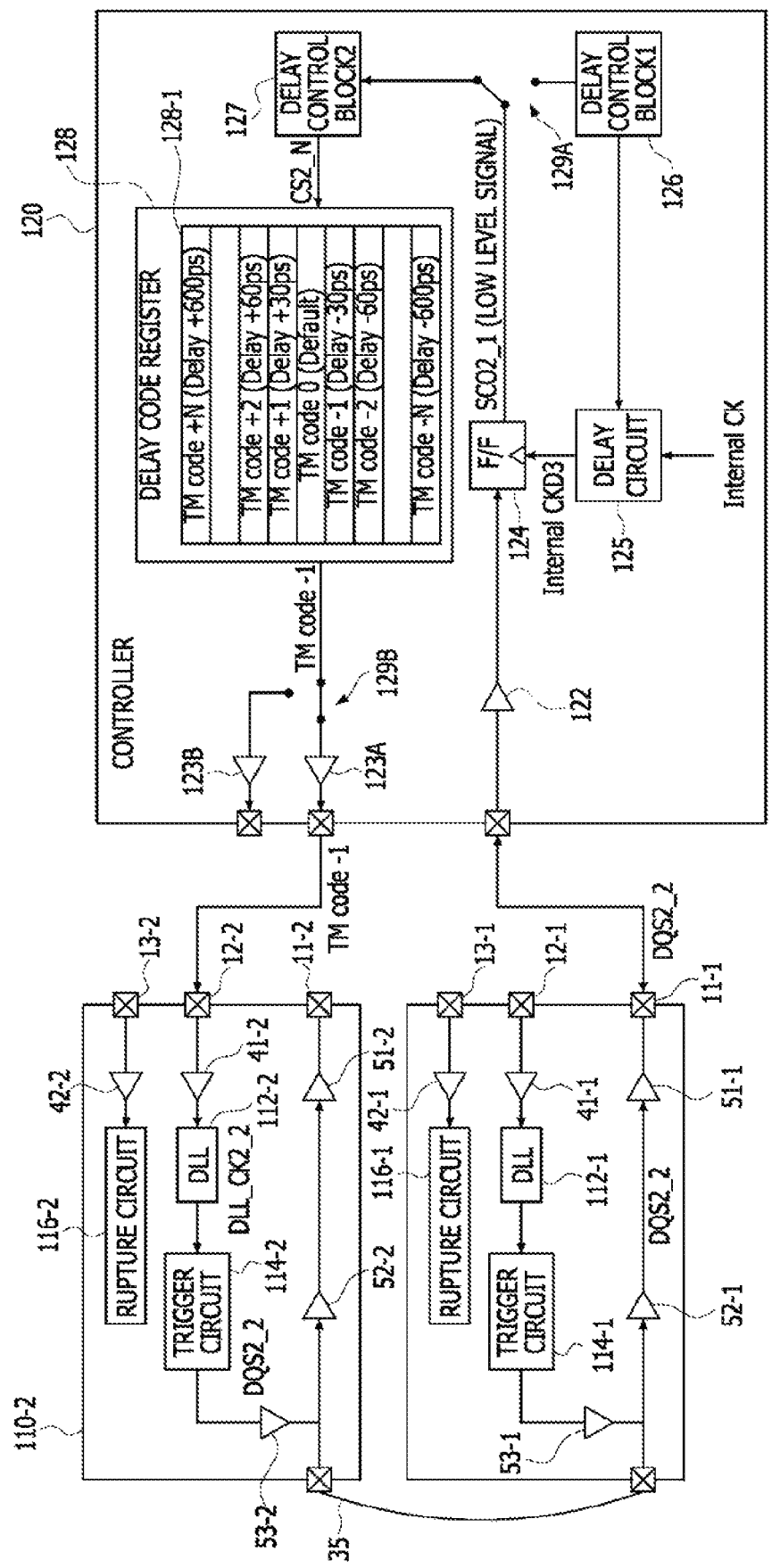
FIG. 34 is a block diagram illustrating a first negative test mode code transmission process of a step 230-12 of FIG. 25 and a delay time control process of a second data strobe signal and a transmission process of a delayed second data strobe signal in the first non-representative memory device of steps 230-13 to 230-15 of FIG. 25.

FIG. 34 is a block diagram illustrating a transmission process of the first negative test mode code TM_code−1 at the step 230-12 of FIG. 25 and a delay time control process of the second data strobe signal DQS2_2 and a transmission process of a delayed second data strobe signal in the first non-representative memory device 110-2 illustrated in the steps 230-13 to 230-15 of FIG. 25. In FIG. 34, the same reference numerals as used in FIG. 26 denote the same elements. Referring to FIGS. 25 and 34, a low level signal corresponding to the first sampling circuit output signal SCO2_1 generated by the sampling circuit 124 at the step 230-4 of FIG. 23 may be inputted to the second delay control block 127. In order to transmit the negative test mode code TM_code− at the step 230-12 of FIG. 25, the second delay control block 127 may transmit a second control signal CS2_N to the delay code register 128 such that the negative test mode code TM_code− among the test mode codes stored in the test mode code table 128-1 included in the delay code register 128 is outputted. The delay code register 128 receiving the second control signal CS2_N may output the first negative test mode code TM_code−1 among the plurality of negative test mode codes TM_code−1, TM_code−2, . . . , and TM_code−N.

The first negative test mode code TM_code−1 may be inputted to the DLL circuit 112-2 of the first non-representative memory device 110-2. The DLL circuit 112-2 of the first non-representative memory device 110-2 may generate the DLL clock signal DLL_CK2_2 whose delay time is reduced by delay information (e.g., 30 picoseconds) of the first negative test mode code TM_code−1. The trigger circuit 114-2 of the first non-representative memory device 110-2 may generate the second data strobe signal DQS2_2 which is synchronized with the DLL clock signal DLL_CK2_2. The second data strobe signal DQS2_2 of the first non-representative memory device 110-2 may be transmitted to the controller 120 through the representative memory device 110-1. A path through which the second data strobe signal DQS2_2 of the first non-representative memory device 110-2 is transmitted to the controller 120 through the representative memory device 110-1 may be the same as a path through which the first data strobe signal DQS2_1 of the first non-representative memory device 110-2 is transmitted to the controller 120.

Figure 35:
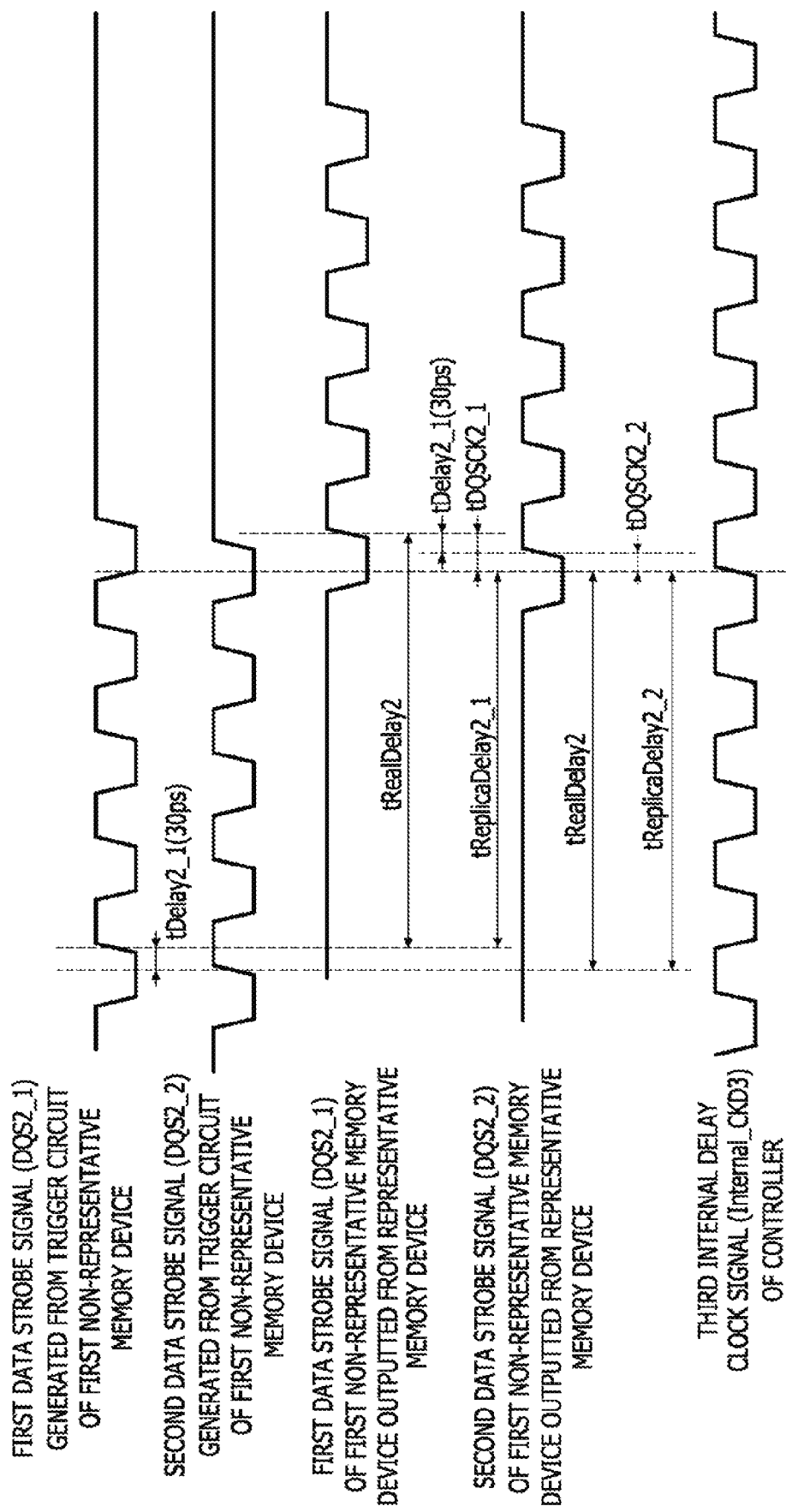
FIG. 35 is a timing diagram illustrating a phase of a second data strobe signal of the first non-representative memory device, a delay time of which is reduced at a step 230-15 of FIG. 25 together with a phase of the first data strobe signal.

FIG. 35 is a timing diagram illustrating a phase of the second data strobe signal DQS2_2 of the first non-representative memory device 110-2, a delay time of which is reduced by the step 230-15 of FIG. 25, together with a phase of the first data strobe signal DQS2_1. Referring to FIG. 35, because the DLL clock signal DLL_CK2_2 whose delay time is reduced by a first delay time of "tDelay2_1(=30 picoseconds)" determined by the first negative test mode code TM_code−1 is generated by the DLL circuit 112-2 of the first non-representative memory device 110-2, a delay time of the second data strobe signal DQS2_2 generated by the trigger circuit 114-2 of the first non-representative memory device 110-2 in synchronization with the DLL clock signal may also be reduced by the first delay time of "tDelay2_1(=30 picoseconds)". Thus, a phase of the second data strobe signal DQS2_2 of the first non-representative memory device 110-2 outputted from the representative memory device 110-1 may also precede by the first delay time of "tDelay2_1(=30 picoseconds)" as compared with the first data strobe signal DQS2_1 of the first non-representative memory device 110-2 outputted from the representative memory device 110-1. As a result, a replica delay time "tReplicaDelay2_2" of the second data strobe signal DQS2_2 of the first non-representative memory device 110-2 may become greater than the replica delay time "tReplicaDelay2_1" of the first data strobe signal DQS2_1 by 30 picoseconds. A timing skew of "tDQSCK2_2" between the second data strobe signal DQS2_2 of the first non-representative memory device 110-2 and the third internal delay clock signal Internal_CKD3 of the controller 120 may also become less than the timing skew of "tDQSCK2_1" between the first data strobe signal DQS2_1 of the first non-representative memory device 110-2 and the third internal delay clock signal Internal_CKD3 of the controller 120.

Even though a delay time of the second data strobe signal DQS2_2 of the first non-representative memory device 110-2 becomes reduced as compared with a delay time of the first data strobe signal DQS2_1 of the first non-representative memory device 110-2, the timing skew "tDQSCK2_2" may still exist between a rising edge of the second data strobe signal DQS2_2 of the first non-representative memory device 110-2 and a rising edge of the third internal delay clock signal Internal_CKD3 of the controller 120. That is, the second data strobe signal DQS2_2 may be outputted from the representative memory device 110-1 later than a rising edge of the third internal delay clock signal Internal_CKD3 by the timing skew of "tDQSCK2_2" and may be inputted to the controller 120. Thus, the second data strobe signal DQS2_2 may still have a logic "low" level at a rising edge of the third internal delay clock signal Internal_CKD3 of the controller 120. Accordingly, as a result of the sampling operation of the second data strobe signal DQS2_2, the sampling circuit 124 may output a second sampling circuit output signal SCO2_2 having a logic "low" level.

Figure 36:
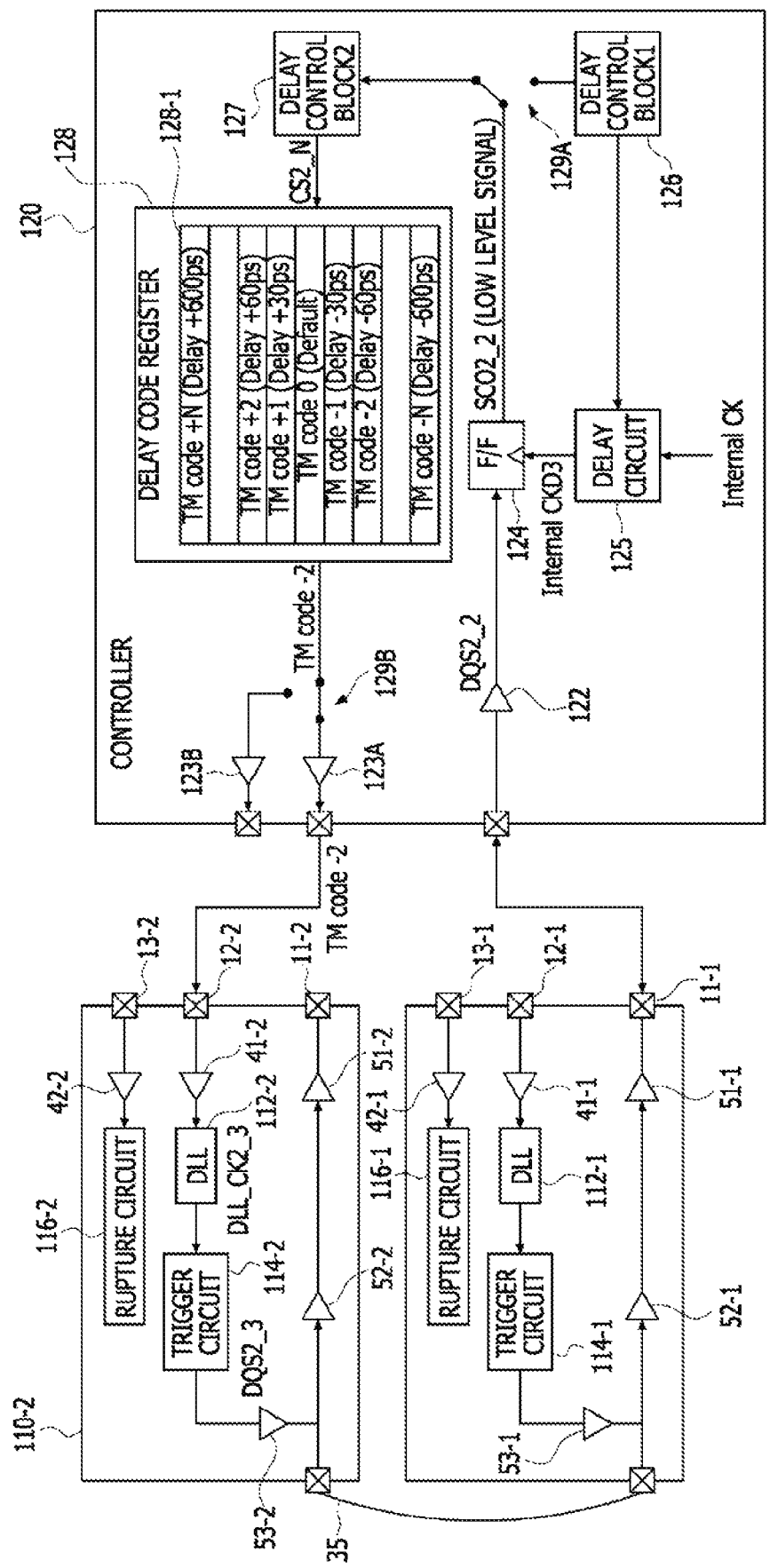
FIG. 36 is a block diagram illustrating steps 230-12 to 230-15 executed by a feedback loop in case that a second sampling circuit output signal has a logic "low" level at a step 230-17 of FIG. 25.

FIG. 36 is a block diagram illustrating the steps 230-12 to 230-15 of FIG. 25 executed by a feedback loop in case that the second sampling circuit output signal SCO2_2 has a logic "low" level at the step 230-17 of FIG. 25. Referring to FIG. 36, when the second sampling circuit output signal SCO2_2 for the second data strobe signal DQS2_2 of the first non-representative memory device 110-2 is a low level signal (having a logic "low" level) at the step 230-17 of FIG. 25, the training operation of the first non-representative memory device 110-2 may be fed back to the step 230-12 of FIG. 25 to transmit the negative test mode code TM_code− to the first non-representative memory device 110-2. Specifically, the second delay control block 127 receiving the second sampling circuit output signal SCO2_2 having a logic "low" level may transmit the second control signal CS2_N to the delay code register 128 such that the second negative test mode code TM_code−2 corresponding to the next code of the first negative test mode code TM_code−1 is outputted from the delay code register 128. The delay code register 128 receiving the second control signal CS2_N may output the second negative test mode code TM_code−2, and the second negative test mode code TM_code−2 outputted from the delay code register 128 may be transmitted to the first non-representative memory device 110-2. The second negative test mode code TM_code−2 may be a binary stream having information on a delay time which is negatively greater than a delay time of the first negative test mode code TM_code−1 by 30 picoseconds and which is negatively greater than a delay time of the default test mode code TM_code_0 by 60 picoseconds. Thus, the DLL circuit 112-2 of the first non-representative memory device 110-2 receiving the second negative test mode code TM_code−2 may generate a DLL clock signal DLL_CK2_3 whose delay time is reduced by 60 picoseconds from the replica delay time. Accordingly, a phase of the third data strobe signal DQS2_3 generated by the first non-representative memory device 110-2 may also precede by the second delay time of "tDelay2_2(=60 picoseconds)" as compared with the first data strobe signal DQS2_1 generated by the first non-representative memory device 110-2.

Figure 37:
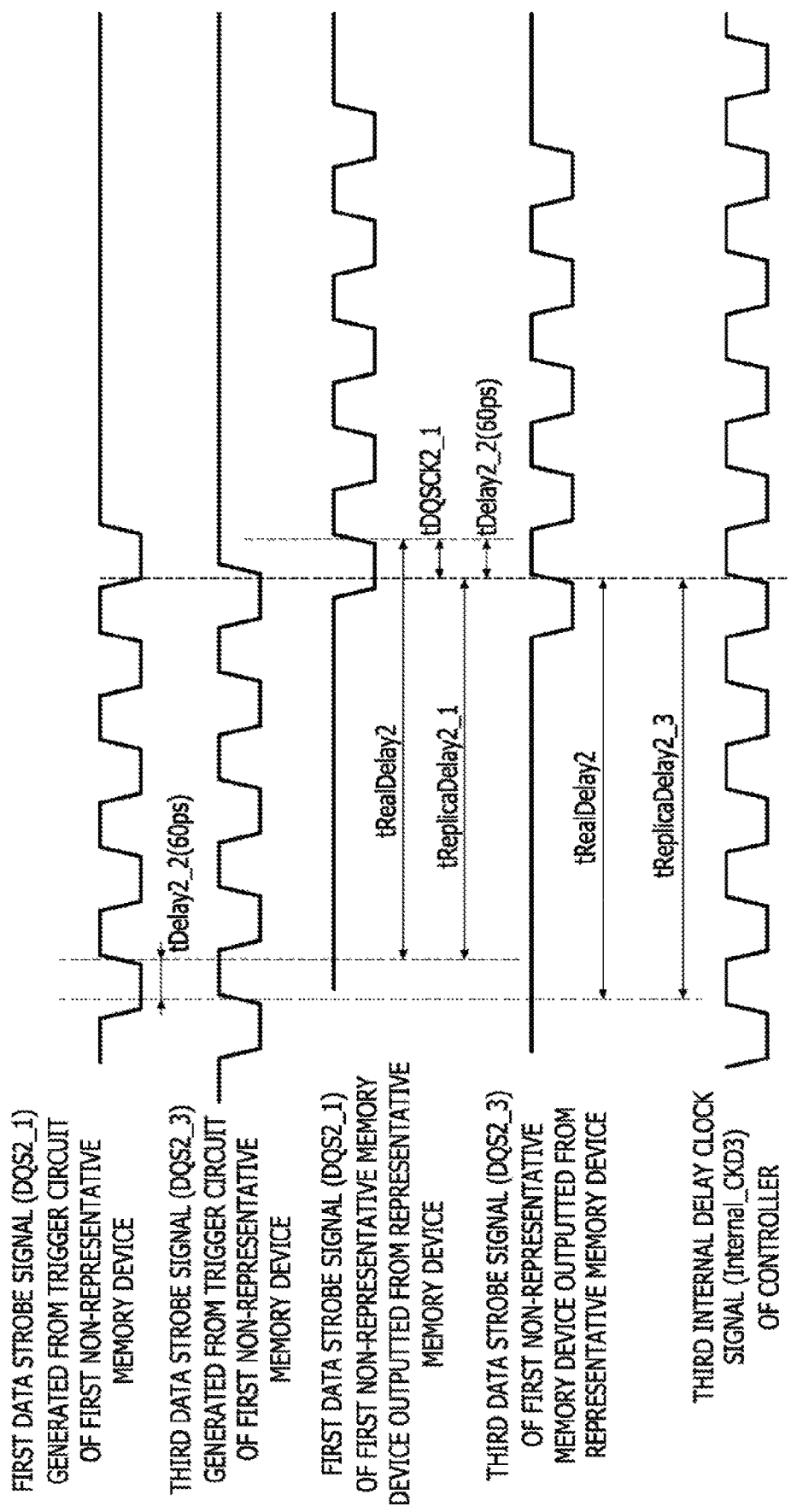
FIG. 37 is a timing diagram illustrating a phase of a third data strobe signal of the first non-representative memory device, a delay time of which is reduced by a fed-back step 230-15 of FIG. 25 together with a phase of the first data strobe signal.

FIG. 37 is a timing diagram illustrating a phase of the third data strobe signal DQS2_3 of the first non-representative memory device 110-2, a delay time of which is reduced by the fed-back step 230-15 of FIG. 25 together with a phase of the first data strobe signal DQS2-1. Referring to FIG. 37, because the DLL clock signal whose delay time is reduced by the second delay time of "tDelay2_2(=60 picoseconds)" determined by the second negative test mode code TM_code−2 is generated by the DLL circuit 112-2 of the first non-representative memory device 110-2, a delay time of the third data strobe signal DQS2_3 generated by the trigger circuit 114-2 of the first non-representative memory device 110-2 in synchronization with the DLL clock signal may also be reduced by the second delay time of "tDelay2_2

(=60 picoseconds)". Thus, a phase of the third data strobe signal DQS2_3 of the first non-representative memory device 110-2 outputted from the representative memory device 110-1 may also precede by the second delay time of "tDelay2_2(=60 picoseconds)" as compared with the first data strobe signal DQS2_1 of the first non-representative memory device 110-2 outputted from the representative memory device 110-1. As a result, a replica delay time "tReplicaDelay2_3" of the third data strobe signal DQS2_3 of the first non-representative memory device 110-2 may become greater than the replica delay time "tReplicaDelay2_1" of the first data strobe signal DQS2_1 by the second delay time of "tDelay2_2(=60 picoseconds)", and a timing skew between the third data strobe signal DQS2_3 of the first non-representative memory device 110-2 and the third internal delay clock signal Internal_CKD3 of the controller 120 may be removed.

Figure 38:
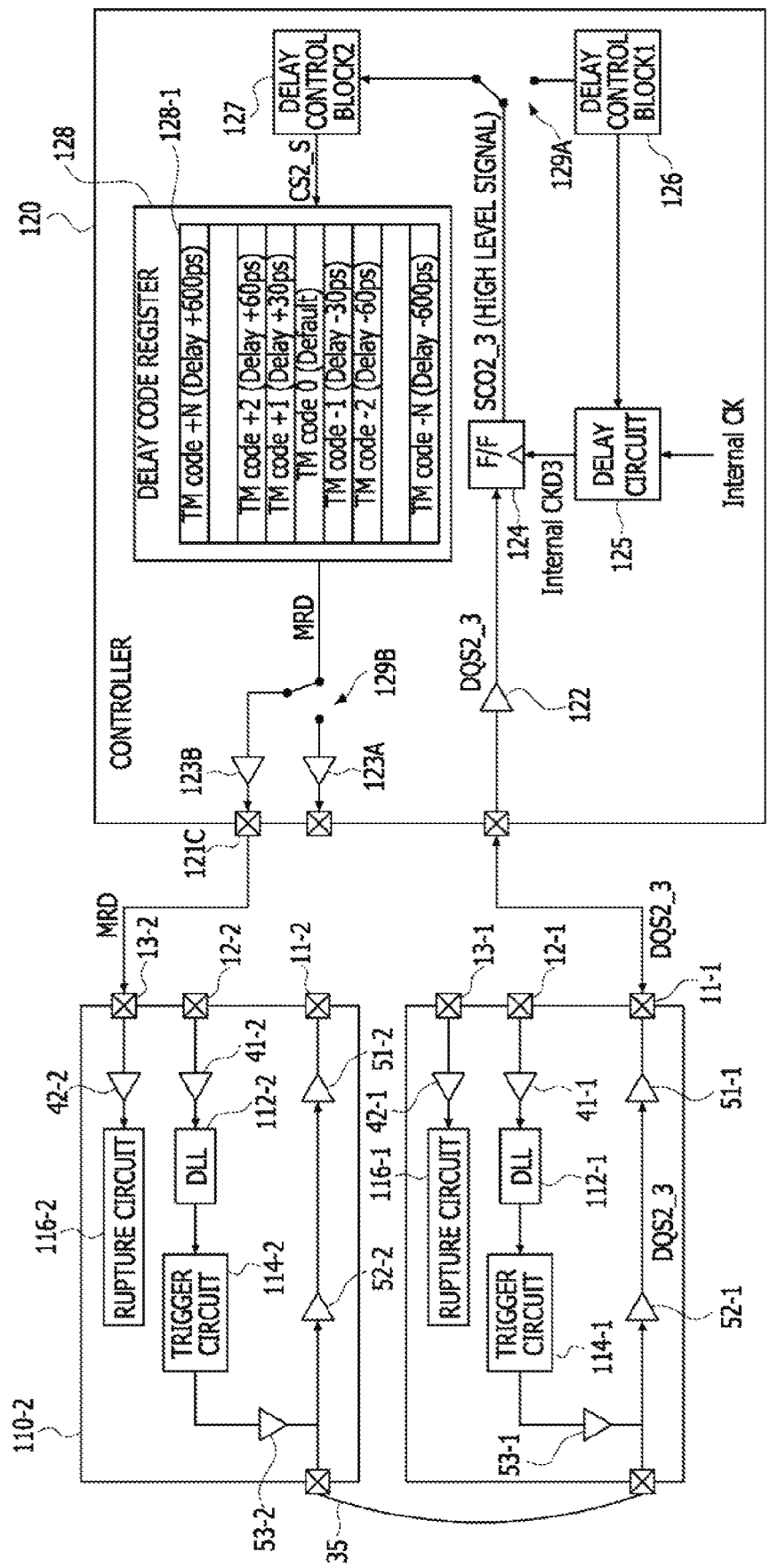
FIG. 38 is a block diagram illustrating fed-back steps 230-16 to 230-18 of FIG. 25.

FIG. 38 is a block diagram illustrating fed-back steps 230-16 to 230-18 of FIG. 25. Referring to FIG. 38, the third data strobe signal DQS2_3 of the first non-representative memory device 110-2 may be inputted to the controller 120 through the representative memory device 110-1. A path through which the third data strobe signal DQS2_3 of the first non-representative memory device 110-2 is transmitted to the controller 120 through the representative memory device 110-1 may be the same as a path through which the first data strobe signal DQS2_1 of the first non-representative memory device 110-2 is transmitted to the controller 120. The controller 120 may perform a sampling operation of the third data strobe signal DQS2_3 of the first non-representative memory device 110-2. This sampling operation may be performed using the third internal delay clock signal Internal_CKD3 generated at the step 210 of FIG. 15 as a reference signal. The third data strobe signal DQS2_3 of the first non-representative memory device 110-2 is not a low level signal any more at a rising edge of the third internal delay clock signal Internal_CKD3 of the controller 120, as illustrated in FIG. 37. Thus, the sampling circuit 124 may output a high level signal as the third sampling circuit output signal SCO2_3.

The second delay control block 127 receiving the third sampling circuit output signal SCO2_3 having a logic "high" level may output the second control signal CS2_S to the delay code register 128 such that the second negative test mode code TM_code−2 corresponding to the previous test mode code is stored in the delay code register 128. This is because a logic "low" level of the second sampling circuit output signal SCO2_2 is changed into a logic "high" level of the third sampling circuit output signal SCO2_3. The delay code register 128 may store the second negative test mode code TM_code−2 and may output the memory repair data MRD having delay information corresponding to the second negative test mode code TM_code−2 to the second driver 123B. The second driver 123B may transmit the memory repair data MRD to the first non-representative memory device 110-2 through the third controller pad 121C. In order that the memory repair data MRD is transmitted to the first non-representative memory device 110-2 through the third controller pad 121C, the second switch 129B may electrically connect an output terminal of the delay code register 128 to an input terminal of the second driver 123B. The memory repair data MRD transmitted to the first non-representative memory device 110-2 may be inputted to the rupture circuit 116-2. The rupture circuit 116-2 may perform a repair operation such that the data strobe signal DQS2 of the first non-representative memory device 110-2 has a delay time corresponding to the second negative test mode code TM_code–2 according to the memory repair data MRD.

Figure 39:
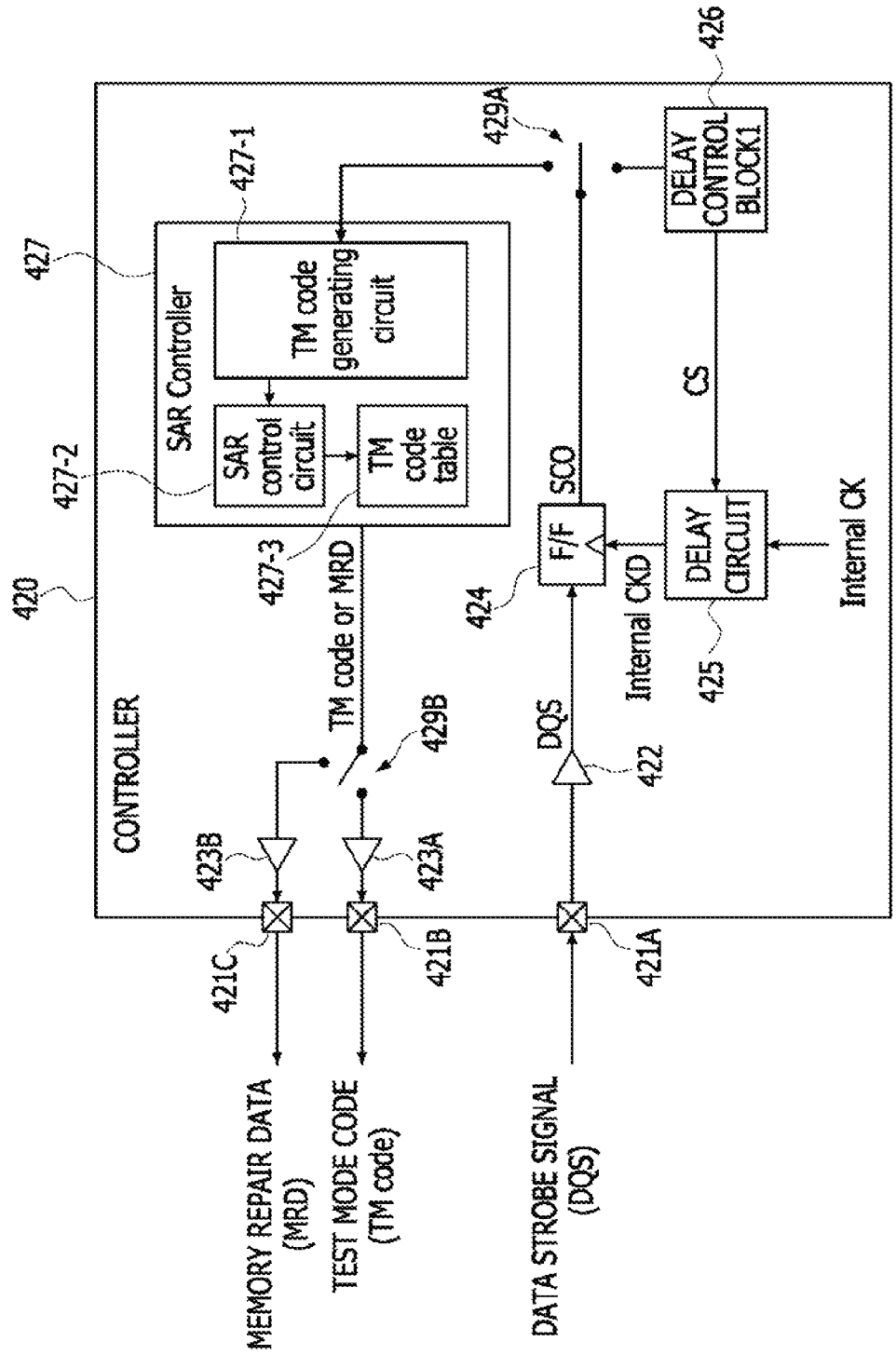
FIG. 39 is a block diagram illustrating an example of a controller included in a memory system according to another embodiment of the present disclosure.

FIG. 39 is a block diagram illustrating a controller 420 included in a memory system according to another embodiment of the present disclosure. A representative memory device and a non-representative memory device of the memory system described hereinafter may have substantially the same configurations as the representative memory device 110-1 and the first non-representative memory devices 110-2 described with reference to FIG. 5. Referring to FIG. 39, the controller 420 may be configured to include at least three controller pads (e.g., first to third controller pads 421A, 421B and 421C), a receiver 422, two drivers (i.e., first and second drivers 423A and 423B), a sampling circuit 424, a delay circuit 425, a delay control block 426, a successive approximation register (SAR) controller 427, and first and second switches 429A and 429B. During a training operation of a memory device (the representative memory device or the non-representative memory device), the first controller pad 421A may be used to receive a data strobe signal DQS from the memory device. In addition, the second controller pad 421B may be used to transmit a test mode code TM_code to the memory device during the training operation of the memory device. Moreover, the third controller pad 421C may be used to transmit memory repair data MRD to the memory device during the training operation of the memory devices. The receiver 422 and the first and second drivers 423A and 423B may function as I/O buffers of the controller 420. The receiver 422 may receive the data strobe signal DQS from the memory device performing the training operation and may apply the data strobe signal DQS to the sampling circuit 424.

The sampling circuit 424 may perform a sampling operation of the data strobe signal DQS outputted from the receiver 422 and may output the result of the sampling operation. In an embodiment, the sampling circuit 424 may include a D-flip-flop. In such a case, the sampling circuit 424 may have an input terminal, an output terminal and a clock input terminal. An internal delay clock signal Internal_CKD of the controller 420 may be inputted to the sampling circuit 424 through the clock input terminal of the sampling circuit 424. A signal to be sampled, that is, the data strobe signal DQS transmitted through the receiver 422 may be inputted to the sampling circuit 424 through the input terminal of the sampling circuit 424. If the data strobe signal DQS is inputted to the sampling circuit 424 through the input terminal of the sampling circuit 424, the sampling circuit 424 may perform a sampling operation of the data strobe signal DQS using the internal delay clock signal Internal_CKD and may output a sampling circuit output signal SCO obtained by the sampling operation of the data strobe signal DQS through the output terminal of the sampling circuit 424. The sampling circuit output signal SCO may be a low level signal (having a value of "0" corresponding to a logic "low" level) or a high level signal (having a value of "1" corresponding to a logic "high" level).

In an embodiment, the sampling operation performed by the sampling circuit 424 may be executed using a rising edge of the internal delay clock signal Internal_CKD as a reference point in time. In such a case, if the data strobe signal DQS is a high level signal at a rising edge of the internal delay clock signal Internal_CKD, the sampling circuit 424 may output a high level signal as the sampling circuit output signal SCO. In contrast, if the data strobe signal DQS is a low level signal at a rising edge of the internal delay clock signal Internal_CKD, the sampling circuit 124 may output a low level signal as the sampling circuit output signal SCO. When a phase of the data strobe signal DQS is consistent with a phase of the internal delay clock signal Internal_CKD, that is, a rising edge of the data strobe signal DQS is consistent with a rising edge of the internal delay clock signal Internal_CKD, the sampling circuit output signal SCO may be changed from a low level signal into a high level signal or from a high level signal into a low level signal.

The delay circuit 425 may receive a control signal CS from the delay control block 426 and may output the internal delay clock signal Internal_CKD obtained by delaying an internal clock signal Internal_CK by a certain time. The internal delay clock signal Internal_CKD generated by the delay circuit 425 may be applied to the sampling circuit 424. The delay control block 426 may apply the control signal CS for delaying the internal clock signal Internal_CK to the delay circuit 425 according to the sampling circuit output signal SCO outputted from the sampling circuit 424. The delay circuit 425 may output the internal delay clock signal Internal_CKD obtained by delaying the internal clock signal Internal_CK or may terminate an operation for delaying the internal clock signal Internal_CK, based on the control signal CS. The first switch 429A may perform a switching operation for connecting an output terminal of the sampling circuit 424 to one of the delay control block 426 and the SAR controller 427. The first switch 429A may connect an output terminal of the sampling circuit 424 to the delay control block 426 until the internal delay clock signal Internal_CKD generated by the delay circuit 425 is synchronized with the data strobe signal DQS of a representative memory device (corresponding to the representative memory device 110-1 described with reference to FIGS. 1 to 38), which is inputted to the sampling circuit 424. After the internal delay clock signal Internal_CKD generated by the delay circuit 425 is synchronized with the data strobe signal DQS of the representative memory device, the first switch 429A may connect an output terminal of the sampling circuit 424 to the SAR controller 427.

The SAR controller 427 may perform a control operation to output a plurality of test mode codes TM_codes, which are determined according to a level of the sampling circuit output signal SCO outputted from the sampling circuit 424, using an SAR method. The SAR controller 427 may include a test mode code generating circuit 427-1, an SAR control circuit 427-2 and a test mode code table 427-3. The test mode code generating circuit 427-1 may output at least one bit signal of a binary stream constituting the test mode code according to the sampling circuit output signal SCO generated by a sampling operation of the data strobe signal DQS. The SAR control circuit 427-2 may receive a bit signal of the test mode code TM_code outputted from the test mode code generating circuit 427-1 and may output a control signal for selecting and outputting one of the test mode codes stored in the test mode code table 427-3 using the SAR method. The test mode code table 427-3 may output the selected test mode code in response to the control signal outputted from the SAR control circuit 427-2. While the selected test mode code is outputted from the SAR controller 427, the second switch 429B may electrically connect an output terminal of the SAR controller 427 to an input terminal of the first driver 423A. The test mode code TM_code outputted from the SAR controller 427 may be inputted to the first driver 423A. The first driver 423A may transmit the test mode code TM_code to the non-representative memory device through the second controller pad 421B.

If all of bit signals of a binary stream constituting the test mode code TM_code are determined by the SAR controller 427, a final test mode code may be stored in the SAR controller 427. In such a case, the SAR controller 427 may output the memory repair data MRD including information on the stored test mode code. If the memory repair data MRD are outputted from the SAR controller 427, the second switch 429B may electrically connect an output terminal of the SAR controller 427 to an input terminal of the second driver 4238. Thus, the memory repair data MRD may be transmitted to the second driver 4238, and the second driver 4238 may transmit the memory repair data MRD to the non-representative memory device through the third controller pad 421C.

Figure 40:
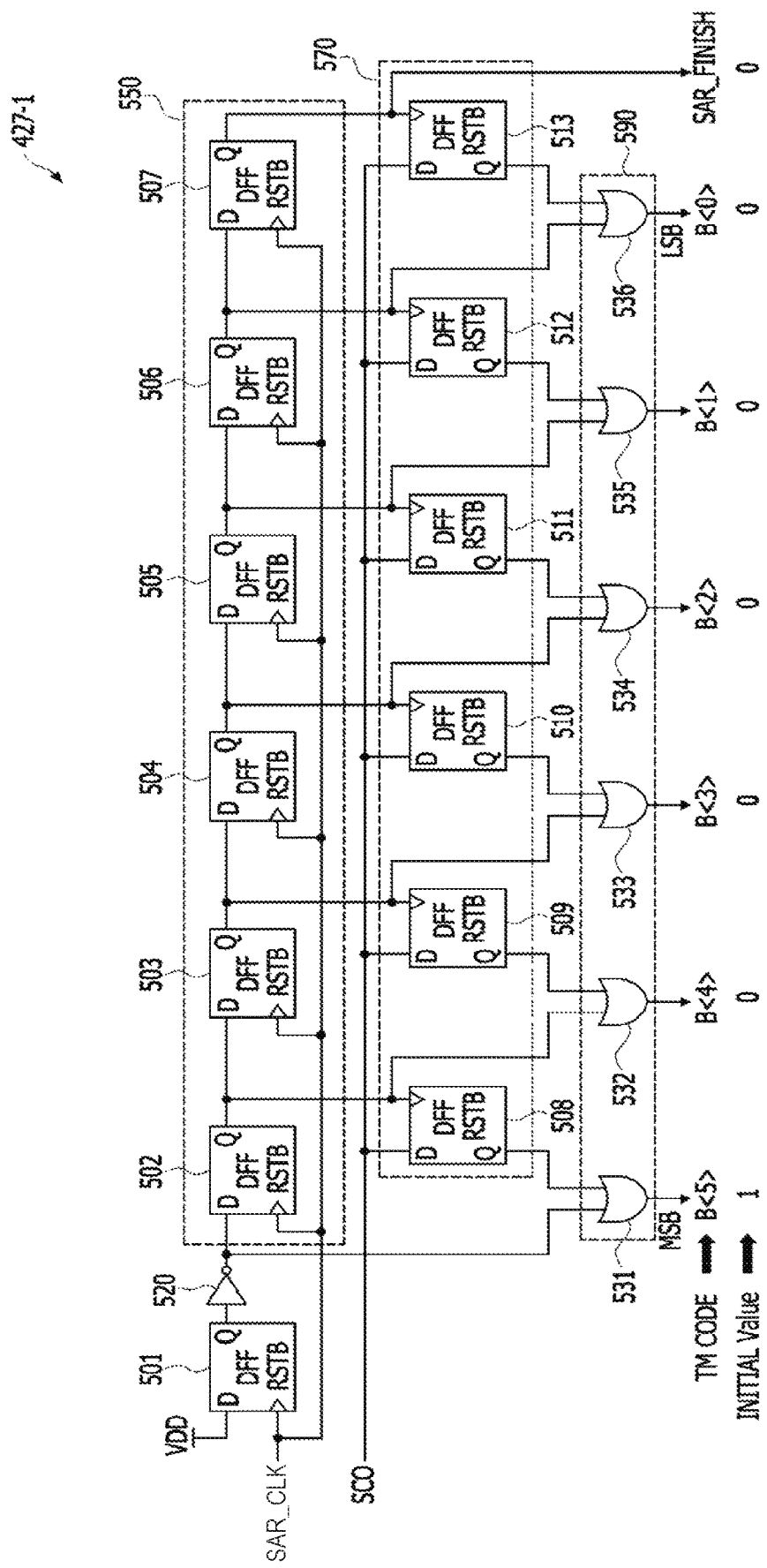
FIG. 40 is a circuit diagram illustrating an example of a test mode code generating circuit included in the controller of FIG. 39.

FIG. 40 is a circuit diagram illustrating the test mode code generating circuit 427-1 included in the controller 420 of FIG. 39. The test mode code generating circuit 427-1 may be designed to use in an exemplary case that the test mode code is a binary stream having six bits (i.e., first to sixth test mode signals TM<0:5>). Referring to FIG. 40, the test mode code generating circuit 427-1 may be configured to include a first D-flip-flop 501, an inverter 520, a shift register 550, a sampling unit 570 and an output stage 590. The shift register 550 may be comprised of second to seventh D-flip-flops 502, . . . , and 507 which are coupled in series. The sampling unit 570 may include eighth to thirteenth D-flip-flops 508, . . . , and 513. The output stage 590 may include first to sixth OR gates 531, . . . , and 536. In the present embodiment, because the test mode code TM_code is comprised of a 6-bit binary stream, each of the shift register 550 and the sampling unit 570 may be configured to include six D-flip-flops and the output stage 590 may be configured to include six OR gates. A power supply voltage VDD may be applied to a data input terminal D of the first D-flip-flop 501. An SAR clock signal SAR_CLK may be inputted to clock signal input terminals of the first to seventh D-flip-flops 501, . . . , and 507. An output terminal Q of the first D-flip-flop 501 may be coupled to an input terminal of the inverter 520.

An output terminal of the inverter 520 may be coupled to a data input terminal D of the second D-flip-flop 502 and a first input terminal of the first OR gate 531. An output terminal Q of the second D-flip-flop 502 may be coupled to a data input terminal D of the third D-flip-flop 503, a clock signal input terminal of the eighth D-flip-flop 508, and a first input terminal of the second OR gate 532. An output terminal of the third D-flip-flop 503 may be coupled to a data input terminal D of the fourth D-flip-flop 504, a clock signal input terminal of the ninth D-flip-flop 509, and a first input terminal of the third OR gate 533. An output terminal of the fourth D-flip-flop 504 may be coupled to a data input terminal D of the fifth D-flip-flop 505, a clock signal input terminal of the tenth D-flip-flop 510, and a first input terminal of the fourth OR gate 534. An output terminal of the fifth D-flip-flop 505 may be coupled to a data input terminal D of the sixth D-flip-flop 506, a clock signal input terminal of the eleventh D-flip-flop 511, and a first input terminal of the fifth OR gate 535. An output terminal of the sixth D-flip-flop 506 may be coupled to a data input terminal D of the seventh D-flip-flop 507, a clock signal input terminal of the twelfth D-flip-flop 512, and a first input terminal of the sixth OR gate 536. An output terminal of the seventh D-flip-flop 507 may be coupled to a clock signal input terminal of the thirteenth D-flip-flop 513 and an SAR end signal output line SAR_FINISH on which an SAR end signal is loaded. The SAR end signal may be a signal informing that determination of the test mode code using the SAR method terminates.

The sampling circuit output signal SCO outputted from the sampling circuit 424 of the controller 420 may be inputted to the data input terminals D of the eighth to thirteenth D-flip-flops 508, . . . , and 513. An output terminal Q of the eighth D-flip-flop 508 may be coupled to a second input terminal of the first OR gate 531. An output terminal Q of the ninth D-flip-flop 509 may be coupled to a second input terminal of the second OR gate 532. An output terminal Q of the tenth D-flip-flop 510 may be coupled to a second input terminal of the third OR gate 533. An output terminal Q of the eleventh D-flip-flop 511 may be coupled to a second input terminal of the fourth OR gate 534. An output terminal Q of the twelfth D-flip-flop 512 may be coupled to a second input terminal of the fifth OR gate 535. An output terminal Q of the thirteenth D-flip-flop 513 may be coupled to a second input terminal of the sixth OR gate 536. The first to sixth test mode signals TM<0:5> corresponding to first to sixth bit signals B<0:5> constituting each of the test mode codes may be outputted through the output terminals of the first to sixth OR gates 531, . . . , and 536, respectively. The sixth test mode signal TM<5> corresponding to a most significant bit (MSB) of the first to sixth bit signals B<0:5> constituting each of the test mode codes may be outputted through the output terminal of the first OR gate 531, and the first test mode signal TM<0> corresponding to a least significant bit (LSB) of the first to sixth bit signals B<0:5> constituting each of the test mode codes may be outputted through the output terminal of the sixth OR gate 536.

An operation of the test mode code generating circuit 427-1 will be described hereinafter. First, an initial value of the shift register 550 may be set to have a binary code of "100000". That is, an output value of the second D-flip-flop 502 may have a binary number of "1", and output values of the third to seventh D-flip-flops 503, . . . , and 507 may have a binary number of "0". In such a case, if the SAR clock signal SAR_CLK is inputted to the clock signal input terminals of the first to seventh D-flip-flops 501, . . . , and 507, a high level signal having a logic "high" level may be outputted through the output terminal Q of the first D-flip-flop 501 at a first rising edge of the SAR clock signal SAR_CLK due to the power supply voltage VDD applied to the data input terminal D of the first D-flip-flop 501. In such a case, the inverter 520 may invert a high level signal corresponding to an output signal of the first D-flip-flop 501 to output and apply a low level signal to the first input terminal of the first OR gate 531. A high level signal outputted through the output terminal Q of the second D-flip-flop 502 at the first rising edge of the SAR clock signal SAR_CLK may be inputted to the clock signal input terminal of the eighth D-flip-flop 508. Thus, a level of an output signal of the eighth D-flip-flop 508 inputted to the second input terminal of the first OR gate 531 may be determined by the first sampling circuit output signal SCO inputted to the data input terminal D of the eighth D-flip-flop 508. The first sampling circuit output signal SCO may correspond to a sampling result of the first data strobe signal DQS of the non-representative memory device, which is transmitted to the controller 420 through the representative memory device. That is, when the first sampling circuit output signal SCO is a high level signal, a high level signal may be inputted to the second input terminal of the first OR gate 531. In contrast, when the first sampling circuit output signal SCO is a low level signal, a low level signal may be inputted to the second input terminal of the first OR gate 531.

Because a low level signal is inputted to the first input terminal of the first OR gate 531, an output signal of the first OR gate 531 may have the same level as a signal inputted to the second input terminal of the first OR gate 531. Thus, when the first sampling circuit output signal SCO is a high level signal, the first OR gate 531 may output a high level signal as an MSB of the test mode code through an output terminal thereof. In contrast, when the first sampling circuit output signal SCO is a low level signal, the first OR gate 531 may output a low level signal as an MSB of the test mode code through an output terminal thereof. In such a case, the third to seventh D-flip-flops 503, . . . , and 507 of the shift register 550 may output low level signals through their output terminals Q, and the low level signals may be inputted to the clock signal input terminals of the ninth to thirteenth D-flip-flops 509, . . . , and 513 of the sampling unit 570. No signals may be outputted through the output terminals Q of the ninth to thirteenth D-flip-flops 509, . . . , and 513 because low level signals are inputted to the clock signal input terminals of the ninth to thirteenth D-flip-flops 509, . . . , and 513. Thus, no signals may be outputted through the output terminals of the second to sixth OR gates 532, . . . , and 536. As such, only the sixth test mode signal TM<5> corresponding to the MSB of the first to sixth test mode signals TM<0:5> constituting the test mode code may be outputted at the first rising edge of the SAR clock signal SAR_CLK.

A high level signal corresponding to an output signal of the second D-flip-flop 502 may be shifted to the output terminal of the third D-flip-flop 503 at a second rising edge of the SAR clock signal SAR_CLK. Thus, only the third D-flip-flop 503 of the shift register 550 may output a high level signal through the output terminal Q thereof, and the remaining D-flip-flops (i.e., the second D-flip-flop 502 and the fourth to seventh D-flip-flops 504, . . . , and 507) of the shift register 550 may output a low level signal through the output terminals Q thereof. Because only the third D-flip-flop 503 of the shift register 550 outputs a high level signal, only the ninth D-flip-flop 509 of the sampling unit 570 may output a signal having the same level as the second sampling circuit output signal SCO inputted to the data input terminal D of the ninth D-flip-flop 509. The second sampling circuit output signal SCO may correspond to a sampling result of the second data strobe signal DQS of the non-representative memory device, which is transmitted to the controller 420 through the representative memory device. As a result, because a low level signal corresponding to an output signal of the second D-flip-flop 502 is inputted to the first input terminal of the second OR gate 532, an output signal of the second OR gate 532 may have the same level as a signal inputted to the second input terminal of the second OR gate 532. When the second sampling circuit output signal SCO is a high level signal, the second OR gate 532 may output a high level signal as the fifth bit signal B<4> (i.e., the fifth test mode signal TM<4>) through the output terminal of the second OR gate 532. In contrast, when the second sampling circuit output signal SCO is a low level signal, the second OR gate 532 may output a low level signal as the fifth bit signal B<4> (i.e., the fifth test mode signal TM<4>) through the output terminal of the second OR gate 532.

A high level signal corresponding to an output signal of the third D-flip-flop 503 may be shifted to the output terminal of the fourth D-flip-flop 504 at a third rising edge of the SAR clock signal SAR_CLK. Thus, only the fourth D-flip-flop 504 of the shift register 550 may output a high level signal through the output terminal Q thereof, and the remaining D-flip-flops (i.e., the second and third D-flip-flops 502 and 503 and the fifth to seventh D-flip-flops 505, . . . , and 507) of the shift register 550 may output a low level signal through the output terminals Q thereof. Because only the fourth D-flip-flop 504 of the shift register 550 outputs a high level signal, only the tenth D-flip-flop 510 of the sampling unit 570 may output a signal having the same level as the third sampling circuit output signal SCO inputted to the data input terminal D of the tenth D-flip-flop 510. The third sampling circuit output signal SCO may correspond to a sampling result of the third data strobe signal DQS of the non-representative memory device, which is transmitted to the controller 420 through the representative memory device. As a result, because a low level signal corresponding to an output signal of the third D-flip-flop 503 is inputted to the first input terminal of the third OR gate 533, an output signal of the third OR gate 533 may have the same level as a signal inputted to the second input terminal of the third OR gate 533. When the third sampling circuit output signal SCO is a high level signal, the third OR gate 533 may output a high level signal as the fourth bit signal B<3> (i.e., the fourth test mode signal TM<3>) through the output terminal of the third OR gate 533. In contrast, when the third sampling circuit output signal SCO is a low level signal, the third OR gate 533 may output a low level signal as the fourth bit signal B<3> (i.e., the fourth test mode signal TM<3>) through the output terminal of the third OR gate 533.

By the same operational principle as described above, the fourth OR gate 534 may output the third bit signal B<2> (i.e., the third test mode signal TM<2>) of the test mode code TM_code through the output terminal thereof at a fourth rising edge of the SAR clock signal SAR_CLK, and the third bit signal B<2> may have the same level as the fourth sampling circuit output signal SCO corresponding to a sampling result of the fourth data strobe signal DQS of the non-representative memory device, which is transmitted to the controller 420 through the representative memory device. Similarly, the fifth OR gate 535 may output the second bit signal B<1> (i.e., the second test mode signal TM<1> of the test mode code TM_code) having the same level as the fifth sampling circuit output signal SCO through the output terminal thereof at a fifth rising edge of the SAR clock signal SAR_CLK. The sixth OR gate 536 may output the first bit signal B<0> (i.e., the first test mode signal TM<0> corresponding to the least significant bit (LSB) of the test mode code TM_code) having the same level as the sixth sampling circuit output signal SCO through the output terminal thereof at a sixth rising edge of the SAR clock signal SAR_CLK. In addition, a high level signal outputted through the output terminal Q of the seventh D-flip-flop 507 may be transmitted through the SAR end signal output line SAR_FINISH. Thus, the training operation of the current non-representative memory device may terminate, and a training operation of the next non-representative memory device will be subsequently performed.

FIG. 41 illustrates the test mode code table 427-3 included in the controller 420 of FIG. 39. Referring to FIG. 41, the plurality of test mode codes TM_codes may be stored in the test mode code table 427-3. When the number of bits included in a binary stream of each test mode code TM_code is "K", the number of the test mode codes TM_codes in the test mode code table 427-3 may be "$2^K$" (where, "K" is a natural number). As described with reference to FIG. 40, when each of the test mode codes TM_codes is configured to include six bits, the number of the test mode codes TM_codes in the test mode code table 427-3 may be sixty four. The DLL circuit of the non-representative memory device may generate the DLL clock signal DLL_CK which is delayed by a delay time determined by the first to sixth bit signals B<0:5> constituting the test mode code TM_code. Thus, the data strobe signal DQS outputted from the trigger circuit of the non-representative memory device may also have a phase which is delayed by the delay time determined according to the first to sixth bit signals B<0:5> constituting the test mode code TM_code.

In the present embodiment, the delay time determined according to the first to sixth bit signals B<0:5> constituting the test mode code TM_code may be distributed within the range of minus 630 (−630) picoseconds to plus 630 (+630) picoseconds. An interval time between two adjacent test mode codes may be set to be 20 picoseconds. Each of the test mode codes TM_codes indicating the delay times of −630 picoseconds to −10 picoseconds may increase the delay time of the data strobe signal DQS such that the data strobe signal DQS is inputted to the controller 420 later by the delay time. The longest delay time for delaying the data strobe signal DQS may be −630 picoseconds, and the test mode code corresponding to the delay time of −630 picoseconds may have a binary stream of "111111". The delay time lower than −630 picoseconds by one step may be −610 picoseconds, and the test mode code corresponding to the delay time of −610 picoseconds may have a binary stream of "111110". The shortest delay time for delaying the data strobe signal DQS may be −10 picoseconds, and the test mode code corresponding to the delay time of −10 picoseconds may have a binary stream of "100000". In contrast, each of the test mode codes TM_codes indicating the delay times of +10 picoseconds to +630 picoseconds may reduce the delay time of the data strobe signal DQS such that the data strobe signal DQS is inputted to the controller 420 in advance by the delay time. The longest time for advancing the data strobe signal DQS may be +630 picoseconds, and the test mode code corresponding to the delay time of +630 picoseconds may have a binary stream of "000000". The delay time lower than +630 picoseconds by one step may be +610 picoseconds, and the test mode code corresponding to the delay time of −610 picoseconds may have a binary stream of "000001". The shortest delay time for advancing the data strobe signal DQS may be +10 picoseconds, and the test mode code corresponding to the delay time of +10 picoseconds may have a binary stream of "011111".

The training operation of the memory system according to the present embodiment may be the same as the training operation described with reference to FIG. 15. That is, the training operation of the representative memory device 100-1 may be performed by generating the internal delay clock signal Internal_CKD in the controller 420, a phase of which is consistent with a phase of the data strobe signal DQS of the representative memory device 100-1. If the internal delay clock signal Internal_CKD of the controller 420 is generated, the training operation of the representative memory device 100-1 may be performed by controlling the replica delay time of the data strobe signal DQS of the representative memory device 100-1 such that a phase of the data strobe signal DQS of the representative memory device 100-1 is consistent with a phase of the internal delay clock signal Internal_CKD. Only the difference between the present embodiment and the previous embodiment is that the replica delay time of the data strobe signal DQS of the representative memory device 100-1 according to the present embodiment is controlled using the SAR method. Thus, hereinafter, the training operation of the representative memory device will be omitted, and only the training operation of the non-representative memory device according to the present embodiment will be described. As described with reference to FIGS. 16 to 22, the present embodiment will also be described in conjunction with an example in which the third internal delay clock signal Internal_CKD3 is generated at the step 210 of FIG. 15, and the sampling operation of the data strobe signal DQS of the representative memory device 100-1 may be performed using the third internal delay clock signal Internal_CKD3 as a reference signal.

Figure 42:
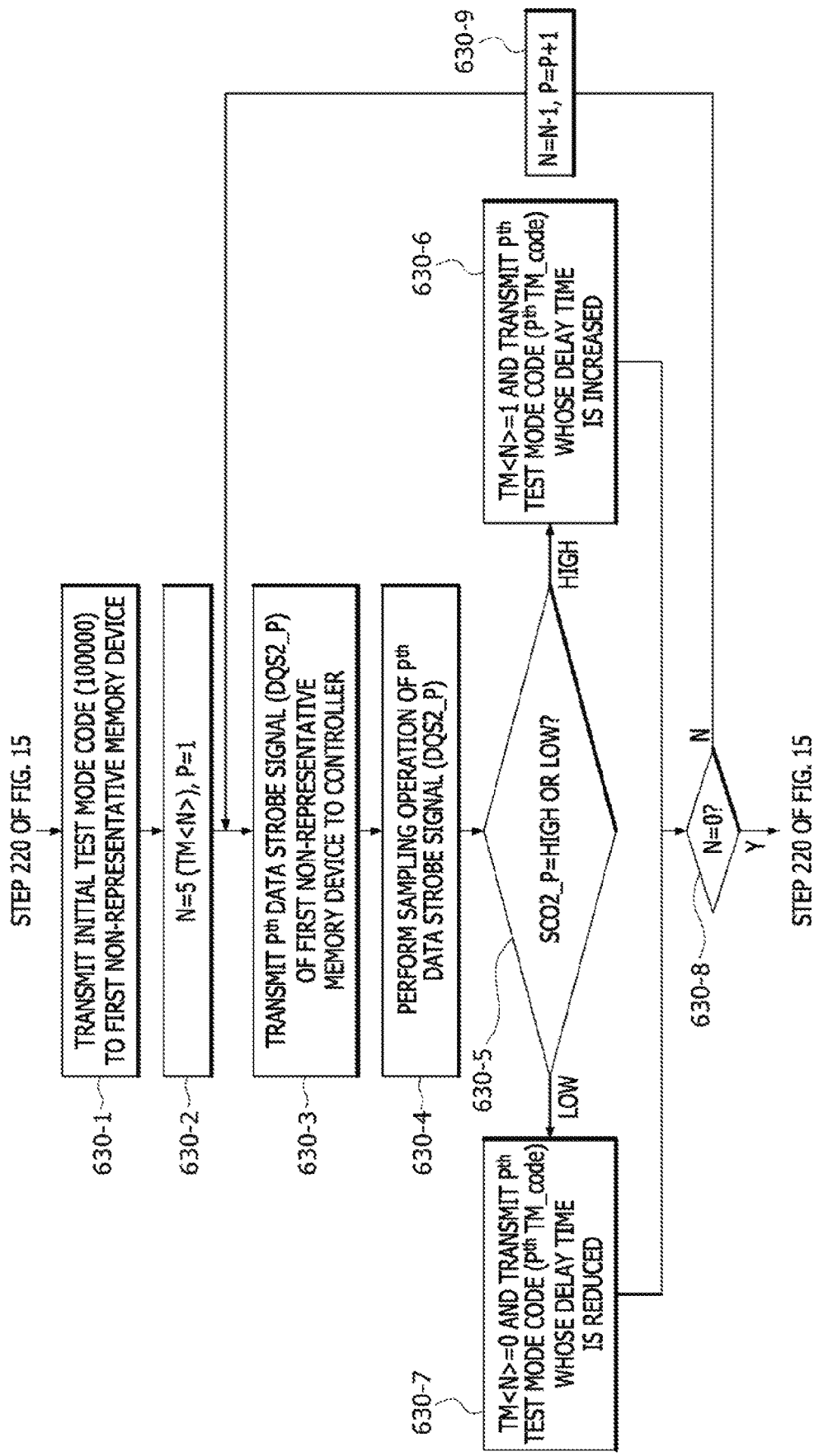
FIG. 42 is a flowchart illustrating an example of one of training operations of non-representative memory devices among a plurality of memory devices included in a memory system according to an embodiment.

FIG. 42 is a flowchart illustrating one of training operations of non-representative memory devices among a plurality of memory devices included in a memory system according to an embodiment. According to the present embodiment, a phase of the data strobe signal DQS of the non-representative memory device may become consistent with a phase of the third internal delay clock signal Internal_CKD3 of the controller (420 of FIG. 39) by six test mode code transmission processes including a process for transmitting an initial test mode code Initial_TM_code. Referring to FIGS. 39 and 42, after generating the third internal delay clock signal Internal_CKD3 of the controller 420 synchronized with the data strobe signal DQS1 of the representative memory device 110-1 at the step 210 of FIG. 15, the training operations of all of the first to $(M-1)^{th}$ non-representative memory devices 110-2, . . . , and 110-M may be performed. Because the training operations of all of the non-representative memory devices 110-2, . . . , and 110-M are identical to each other, only the training operation of the first non-representative memory device 110-2 will be described hereinafter. The initial test mode code Initial_TM_code may be transmitted to the first non-representative memory device 110-2 (see a step 630-1). The test mode code located at a mid-position of the test mode code table 427-3 described with reference to FIG. 41 may be set as the initial test mode code Initial_TM_code. In an embodiment, the test mode code TM_code+10 having the replica delay time of +10 picoseconds or the test mode code TM_code−10 having the replica delay time of −10 picoseconds may be set as the initial test mode code Initial_TM_code. The present embodiment will be described in conjunction with an example in which the test mode code TM_code−10 having the replica delay time of −10 picoseconds and corresponding to a binary stream of "100000" is set as the initial test mode code Initial_TM_code.

At a step 630-2, the bit number "N" of the test mode code TM_code may be set to be "5" corresponding to the MSB of the test mode code TM_code, and the number "P" representing the transmission number of times of the test mode code TM_code and the generation number of times of the data strobe signal DQS2 may be set to be "1". At a step 630-3, the first non-representative memory device 110-2 receiving the test mode code of "100000" as the initial test mode code may generate a first data strobe signal DQS2_1. The first data strobe signal DQS2_1 of the first non-representative memory device 110-2 may be transmitted to the sampling circuit 424 of the controller 420 through the representative memory device 110-1. The first data strobe signal DQS2_1 transmitted to the sampling circuit 424 may have the delay time of −10 picoseconds determined by the initial test mode code. At a step 630-4, the sampling circuit 424 of the controller 420 may perform a sampling operation of the first data strobe signal DQS2_1. This sampling operation of the first data strobe signal DQS2_1 may be performed using the third internal delay clock signal Intrnal_CKD3 as a reference signal. The sampling circuit 424 may perform the sampling operation of the first data strobe signal DQS2_1 and may output a first sampling circuit output signal SCO2_1. The first sampling circuit output signal SCO2_1 may be inputted to the test mode code generating circuit 427-1.

If the first data strobe signal DQS2_1 has a logic "high" level at a rising edge of the third internal delay clock signal Intrnal_CKD3 at the step 630-4, the sampling circuit 424 may output a high level signal as the first sampling circuit output signal SCO2_1. In such a case, the MSB signal (i.e., the sixth test mode signal TM<5>) of a final test mode code TM_code may be determined as a high level signal having a logic "high" level and the first test mode code for increasing the delay time may be transmitted (see a step 630-6). Specifically, the test mode code generating circuit 427-1 of the SAR controller 427 may output the test mode code TM_code having a binary stream of "100000" whose MSB signal (TM<5>) is a high level signal to the SAR control circuit 427-2. The SAR control circuit 427-2 may generate a control signal for selectively outputting a test mode code located at a mid-position of the test mode codes whose MSB signals (TM<5>) have a logic "high" level among the test mode codes stored in the test mode code table 427-3 using the SAR method and may transmit the control signal to the test mode code table 427-3. The test mode code table 427-3 may transmit the first test mode code selected according to the control signal, which is outputted from the SAR control circuit 427-2, to the first non-representative memory device 110-2.

In contrast, if the first data strobe signal DQS2_1 has a logic "low" level at a rising edge of the third internal delay clock signal Intrnal_CKD3 at the step 630-4, the sampling circuit 424 may output a low level signal as the first sampling circuit output signal SCO2_1. In such a case, the MSB signal (i.e., the sixth test mode signal TM<5>) of the final test mode code TM_code may be determined as a low level signal having a logic "low" level and the first test mode code for reducing the delay time may be transmitted (see a step 630-7). Specifically, the test mode code generating circuit 427-1 of the SAR controller 427 may output the test mode code TM_code having a binary stream of "000000" whose MSB signal (TM<5>) is a low level signal to the SAR control circuit 427-2. The SAR control circuit 427-2 may generate a control signal for selectively outputting a test mode code located at a mid-position of the test mode codes whose MSB signals (TM<5>) have a logic "low" level among the test mode codes stored in the test mode code table 427-3 using the SAR method and may transmit the control signal to the test mode code table 427-3. The test mode code table 427-3 may transmit the first test mode code selected according to the control signal, which is outputted from the SAR control circuit 427-2, to the first non-representative memory device 110-2.

After transmitting the first test mode code to the first non-representative memory device 110-2 at the step 630-6 or 630-7, whether the bit number "N" is zero may be discriminated (see a step 630-8). Because the bit number "N" represents a position of any one of bits included in the test mode code, the bit number "0" means the first test mode signal TM<0> corresponding to the LSB of the test mode code. Since the bit number "N" is "5" at the current step, the step 630-9 may be performed. At the step 630-9, the bit number "N" may be reduced by one to be set as "4" and the number "P" may increase by one to be set as "2". Subsequently, the process may be fed back to the step 630-3, and the first non-representative memory device 110-2 may generate a second data strobe signal DQS2_2 having the delay time corresponding to the first test mode code at the step 630-3. The second data strobe signal DQS2_2 may be transmitted to the sampling circuit 424 of the controller 420 through the representative memory device 110-1.

At the step 630-4, the sampling circuit 424 of the controller 420 may perform a sampling operation of the second data strobe signal DQS2_2 using the third internal delay clock signal Intrnal_CKD3 as a reference signal to output a second sampling circuit output signal SCO2_2. The second sampling circuit output signal SCO2_2 may be inputted to the test mode code generating circuit 427-1 of the SAR controller 427. If the sampling circuit 424 outputs a high level signal as the second sampling circuit output signal SCO2_2, the fifth test mode signal TM<4> of the final test mode code TM_code may be determined as a high level signal having a logic "high" level by the operation of the test mode code generating circuit 427-1 (see the step 630-6). Subsequently, the SAR controller 427 may transmit a second test mode code for increasing the delay time to the first non-representative memory device 110-2. In contrast, if the sampling circuit 424 outputs a low level signal as the second sampling circuit output signal SCO2_2, the fifth test mode signal TM<4> of the final test mode code TM_code may be determined as a low level signal having a logic "low" level by the operation of the test mode code generating circuit 427-1 (see the step 630-7). Subsequently, the SAR controller 427 may transmit a second test mode code for reducing the delay time to the first non-representative memory device 110-2.

Since the bit number "N" is "4" at the step 630-8, the step 630-9 may be performed. At the step 630-9, the bit number "N" may be reduced by one to be set as "3" and the number "P" may increase by one to be set as "3". Subsequently, the process may be fed back to the step 630-3 again. At the step 630-3, the first non-representative memory device 110-2 may generate a third data strobe signal DQS2_3 having the delay time corresponding to the second test mode code. The third data strobe signal DQS2_3 of the first non-representative memory device 110-2 may be transmitted to the sampling circuit 424 of the controller 420 through the representative memory device 110-1. Next, the steps 630-4 and 630-5 may be executed to perform a sampling operation of the third data strobe signal DQS2_3 and to discriminate whether a third sampling circuit output signal SCO2_3 obtained by the sampling operation of the third data strobe signal DQS2_3 is a high level signal or a low level signal. Next, at the step 630-6 or 630-7, the fourth test mode signal TM<3> of the final test mode code TM_code may be determined, and a third test mode code may be transmitted to the first non-representative memory device 110-2. Since the bit number "N" is not zero at the step 630-8, the bit number "N" may be set to be "2" and the number "P" may be set as "4". Thereafter, the process may be fed back to the step 630-3, and the first non-representative memory device 110-2 may transmit a fourth data strobe signal DQS2_4 having the delay time corresponding to the third test mode code to the controller 420 through the representative memory device 110-1.

In the same way, when the bit number "N" is "2" and the number "P" is "4", the third test mode signal TM<2> of the final test mode code TM_code may be determined, and a fourth test mode code may be transmitted from the controller 420 to the first non-representative memory device 110-2. The first non-representative memory device 110-2 may transmit a fifth data strobe signal DQS2_5 having the delay time corresponding to the fourth test mode code to the controller 420 through the representative memory device 110-1. When the bit number "N" is "1" and the number "P" is "5", the second test mode signal TM<1> of the final test mode code TM_code may be determined, and a fifth test mode code may be transmitted from the controller 420 to the first non-representative memory device 110-2. The first non-representative memory device 110-2 may transmit a sixth data strobe signal DQS2_6 having the delay time corresponding to the fifth test mode code to the controller 420 through the representative memory device 110-1. Finally, when the bit number "N" is "0" and the number "P" is "6", the first test mode signal TM<0> corresponding to the LSB of the final test mode code TM_code may be determined, and a sixth test mode code may be transmitted from the controller 420 to the first non-representative memory device 110-2.

The sixth test mode code corresponding to the final test mode code may be stored in the SAR controller 427 of the controller 420, and the SAR controller 427 of the controller 420 may output the memory repair data MRD having information on the delay time corresponding to the sixth test mode code to the second driver 423B. The second driver 423B may transmit the memory repair data MRD to the first non-representative memory device 110-2 through the third controller pad 421C. In order to transmit the memory repair data MRD to the first non-representative memory device 110-2, the second switch 429B may electrically connect an output terminal of the SAR controller 427 to an input terminal of the second driver 423B. The memory repair data MRD transmitted to the first non-representative memory device 110-2 may be inputted to the rupture circuit 116-2 of the first non-representative memory device 110-2. The rupture circuit 116-2 may perform a repair operation such that the data strobe signal of the first non-representative memory device 110-2 has a delay time corresponding to the sixth test mode code according to the memory repair data MRD.

Figure 43:
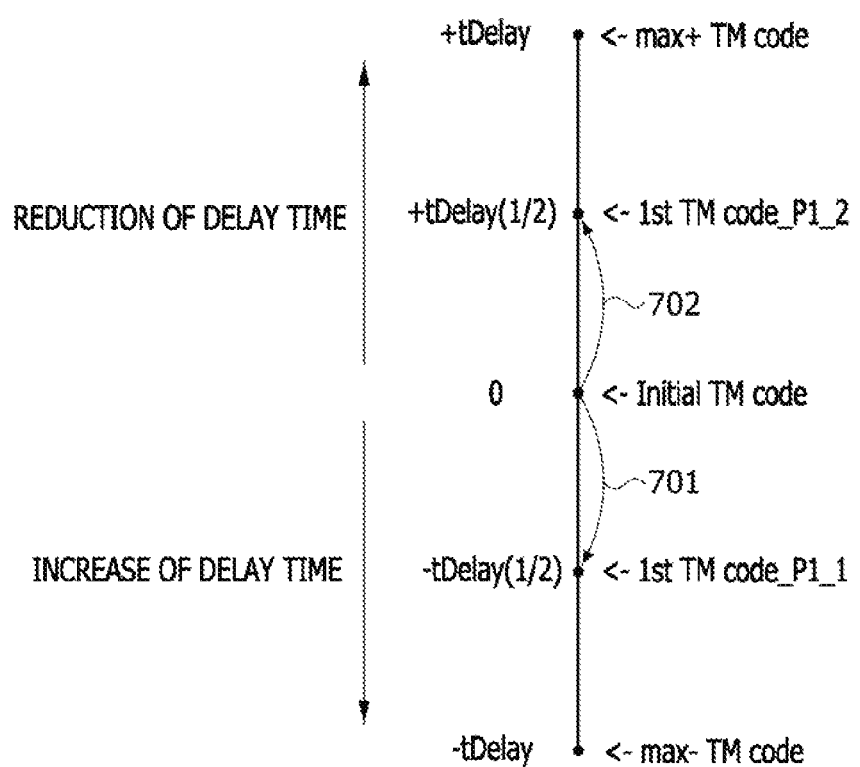
FIGS. 43 to 45 illustrate a process of selecting a test mode code using a successive approximation register (SAR) method at a step 630-6 or 630-7 of FIG. 42.
Figure 44:
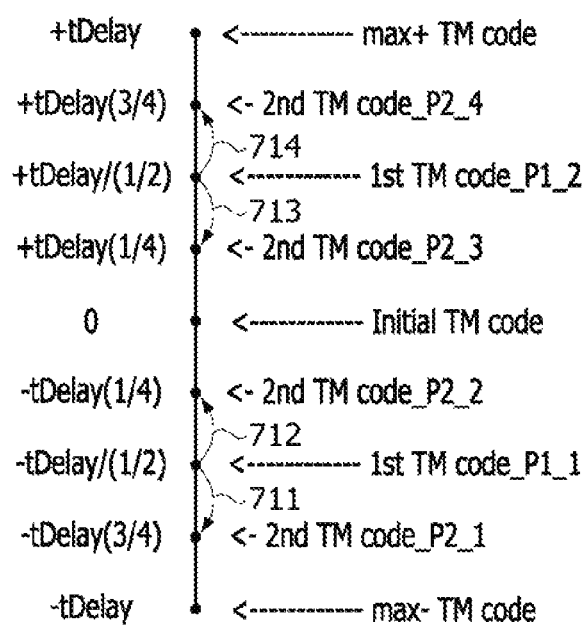
Figure 45:
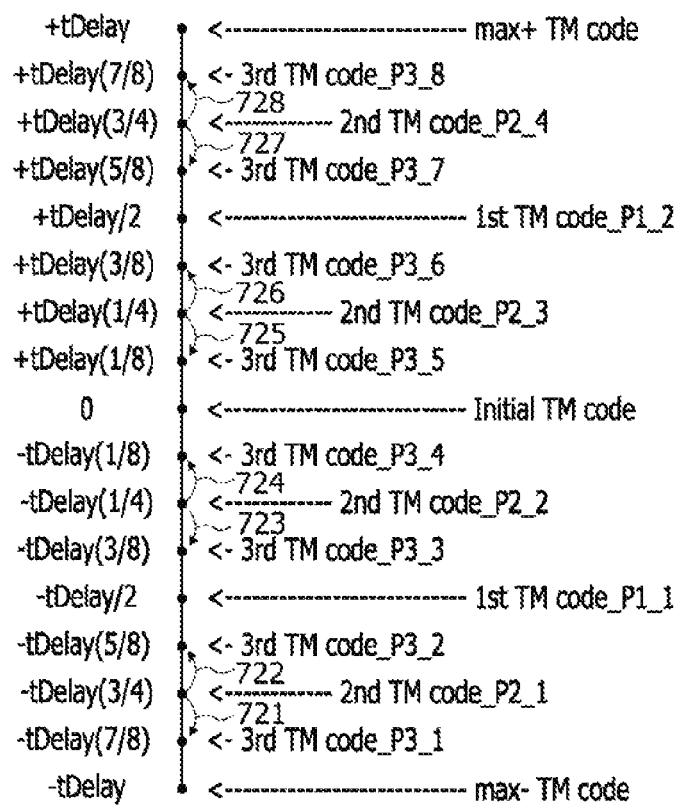

FIGS. 43 to 45 illustrate a process of selecting the test mode code using the SAR method at the step 630-6 or 630-7 of FIG. 42. First, as illustrated in FIG. 43, the test mode codes may include the initial test mode code, the test mode codes for reducing the delay time, and the test mode codes for increasing the delay time. The present embodiment will be described in conjunction with an example in which the delay time of the initial test mode code is zero. The test mode codes corresponding to the delay time greater than the delay time of the initial test mode code may include a test mode code representing a maximum delay time of "−tDelay", and this test mode code may be referred to as a maximum delay increase test mode code MAX-TM_code". In contrast, the test mode codes corresponding to the delay time less than the delay time of the initial test mode code may include a test mode code representing a maximum delay time of "+ tDelay", and this test mode code may be referred to as a maximum delay decrease test mode code MAX+TM_code".

At the step 630-5 of FIG. 42, if the first sampling circuit output signal SCO2_1 of the first data strobe signal DQS2_1 of the first non-representative memory device 110-2 having the delay time corresponding to the initial test mode code Initial_TM_code is a high level signal, it means that the first data strobe signal DQS2_1 is transmitted to the controller 420 earlier than a point in time when the internal delay clock signal Internal_CKD of the controller 420 is generated. Thus, in such a case, a test mode code corresponding to a delay time "−tDelay(½)" among the test mode codes for increasing the delay time greater than the delay time of the initial test mode code may be designated as a first test mode code $1^{ST}$ TM_code_P1_1, as indicated by an arrow 701 in FIG. 43. The delay time "−tDelay(½)" of the first test mode code $1^{ST}$ TM_code_P1_1 may be a half of the delay time "−tDelay" of the maximum delay increase test mode code MAX-TM_code".

In contrast, if the first sampling circuit output signal SCO2_1 of the first data strobe signal DQS2_1 of the first non-representative memory device 110-2 having the delay time corresponding to the initial test mode code Initial_TM_code is a low level signal at the step 630-5 of FIG. 42, it means that the first data strobe signal DQS2_1 is transmitted to the controller 420 later than a point in time when the internal delay clock signal Internal_CKD of the controller 420 is generated. Thus, in such a case, a test mode code corresponding to a delay time "+ tDelay(½)" among the test mode codes for reducing the delay time may be designated as a first test mode code $1^{ST}$ TM_code_P1_2, as indicated by an arrow 702 in FIG. 43. The delay time "+ tDelay(½)" of the first test mode code $1^{ST}$ TM_code_P1_2 may be a half of the delay time "+ tDelay" of the maximum delay decrease test mode code MAX+TM_code".

Next, as illustrated in FIG. 44, if the second sampling circuit output signal SCO2_2 of the second data strobe signal DQS2_2 of the first non-representative memory device 110-2 having the delay time "−tDelay(½)" corresponding to the first test mode code $1^{ST}$ TM_code_P1_1 is a high level signal at the step 630-5 of FIG. 42 when the first test mode code $1^{ST}$ TM_code_P1_1 is designated in the previous process, it still means that the second data strobe signal DQS2_2 is transmitted to the controller 420 earlier than a point in time when the internal delay clock signal Internal_CKD of the controller 420 is generated. Thus, in such a case, a test mode code corresponding to a delay time "−tDelay(¾)" among the test mode codes having the delay time greater than the delay time of the initial test mode code may be designated as a second test mode code $2^{nd}$ TM_code_P2_1, as indicated by an arrow 711 in FIG. 44. The delay time "−tDelay(¾)" of the second test mode code $2^{nd}$ TM_code_P2_1 may be a half of a sum of the delay time "−tDelay(½)" of the first test mode code $1^{ST}$ TM_code_P1_1 and the delay time "−tDelay" of the maximum delay increase test mode code MAX-TM_code".

In the previous process, if the first test mode code $1^{ST}$ TM_code_P1_1 is designated and the second sampling circuit output signal SCO2_2 of the second data strobe signal DQS2_2 of the first non-representative memory device 110-2 having the delay time "−tDelay(½)" corresponding to the first test mode code $1^{ST}$ TM_code_P1_1 is a low level signal at the step 630-5 of FIG. 42, it means that the second data strobe signal DQS2_2 is transmitted to the controller 420 later than a point in time when the internal delay clock signal Internal_CKD of the controller 420 is generated. Thus, in such a case, a test mode code corresponding to a delay time "−tDelay(¼)" among the test mode codes having the delay time less than the first test mode code $1^{ST}$ TM_code_P1_1 may be designated as a second test mode code $2^{nd}$ TM_code_P2_2, as indicated by an arrow 712 in FIG. 44. The delay time "−tDelay(¼)" of the second test mode code $2^{nd}$ TM_code_P2_2 may be a half of the delay time "−tDelay(½)" of the first test mode code $1^{ST}$ TM_code_P1_1.

In the previous process, if the second sampling circuit output signal SCO2_2 of the second data strobe signal DQS2_2 of the first non-representative memory device 110-2 having the delay time "+ tDelay(½)" corresponding to the first test mode code $1^{ST}$ TM_code_P1_2 is a high level signal at the step 630-5 of FIG. 42 when the first test mode code $1^{ST}$ TM_code_P1_2 is designated, it means that the second data strobe signal DQS2_2 is transmitted to the controller 420 earlier than a point in time when the internal delay clock signal Internal_CKD of the controller 420 is generated. Thus, in such a case, a test mode code corresponding to a delay time "+ tDelay(¼)" among the test mode codes having the delay time greater than the delay time of the first test mode code $1^{ST}$ TM_code_P1_2 may be designated as a second test mode code $2^{nd}$ TM_code_P2_3, as indicated by an arrow 713 in FIG. 44. The delay time "+ tDelay(¼)" of the second test mode code $2^{nd}$ TM_code_P2_3 may be a half of the delay time "+ tDelay (½)" of the first test mode code $1^{ST}$ TM_code_P1_2.

In the previous process, if the second sampling circuit output signal SCO2_2 of the second data strobe signal DQS2_2 of the first non-representative memory device 110-2 having the delay time "+ tDelay(½)" corresponding to the first test mode code $1^{ST}$ TM_code_P1_2 is a low level signal at the step 630-5 of FIG. 42 when the first test mode code $1^{ST}$ TM_code_P1_2 is designated, it still means that the second data strobe signal DQS2_2 is transmitted to the controller 420 later than a point in time when the internal delay clock signal Internal_CKD of the controller 420 is generated. Thus, in such a case, a test mode code corresponding to a delay time "+ tDelay(¾)" among the test mode codes having the delay time less than the delay time of the first test mode code $1^{ST}$ TM_code_P1_2 may be designated as a second test mode code $2^{nd}$ TM_code_P2_4, as indicated by an arrow 714 in FIG. 44. The delay time "+ tDelay(¾)" of the second test mode code $2^{nd}$ TM_code_P2_4 may be a half of a sum of the delay time "+ tDelay(½)" of the first test mode code $1^{ST}$ TM_code_P1_2 and the delay time "+ tDelay" of the maximum delay decrease test mode code MAX+TM_code.

Next, as illustrated in FIG. 45, if the third sampling circuit output signal SCO2_3 of the third data strobe signal DQS2_3 of the first non-representative memory device 110-2 having the delay time "−tDelay(¾)" corresponding to the second test mode code $2^{nd}$ TM_code_P2_1 is a high level signal at the step 630-5 of FIG. 42 when the first test mode code $1^{ST}$ TM_code_P1_1 and the second test mode code $2^{nd}$ TM_code_P2_1 are designated in the previous process, it means that the third data strobe signal DQS2_3 is transmitted to the controller 420 earlier than a point in time when the internal delay clock signal Internal_CKD of the controller 420 is generated. Thus, in such a case, a test mode code corresponding to a delay time "−tDelay(⅞)" among the test mode codes having the delay time greater than the delay time of the second test mode code $2^{nd}$ TM_code_P2_1 may be designated as a third test mode code $3^{rd}$ TM_code_P3_1, as indicated by an arrow 721 in FIG. 45. The delay time "−tDelay(⅞)" of the third test mode code $3^{rd}$ TM_code_P3_1 may be a half of a sum of the delay time "−tDelay(¾)" of the second test mode code $2^{nd}$ TM_code_P2_1 and the delay time "−tDelay" of the maximum delay increase test mode code MAX−TM_code".

In the previous process, if the first test mode code $1^{ST}$ TM_code_P1_1 and the second test mode code $2^{nd}$ TM_code_P2_1 are designated and the third sampling circuit output signal SCO2_3 of the third data strobe signal DQS2_3 of the first non-representative memory device 110-2 having the delay time "−tDelay(¾)" corresponding to the second test mode code $2^{nd}$ TM_code_P2_1 is a low level signal at the step 630-5 of FIG. 42, it means that the third data strobe signal DQS2_3 is transmitted to the controller 420 later than a point in time when the internal delay clock signal Internal_CKD of the controller 420 is generated. Thus, in such a case, a test mode code corresponding to a delay time "−tDelay(⅝)" among the test mode codes having the delay time less than the second test mode code $2^{nd}$ TM_code_P2_1 may be designated as a third test mode code $3^{rd}$ TM_code_P3_2, as indicated by an arrow 722 in FIG. 45. The delay time "−tDelay(⅝)" of the third test mode code $3^{rd}$ TM_code_P3_2 may be a half of a sum of the delay time "−tDelay(¾)" of the second test mode code $2^{nd}$ TM_code_P2_1 and the delay time "−tDelay(½)" of the first test mode code $1^{ST}$ TM_code_P1_1.

In the previous process, if the third sampling circuit output signal SCO2_3 of the third data strobe signal DQS2_3 of the first non-representative memory device 110-2 having the delay time "−tDelay(¼)" corresponding to the second test mode code $2^{nd}$ TM_code_P2_2 is a high level signal at the step 630-5 of FIG. 42 when the first test mode code $1^{ST}$ TM_code_P1_1 and the second test mode code $2^{nd}$ TM_code_P2_2 are designated, it means that the third data strobe signal DQS2_3 is transmitted to the controller 420 earlier than a point in time when the internal delay clock signal Internal_CKD of the controller 420 is generated. Thus, in such a case, a test mode code corresponding to a delay time "−tDelay(⅜)" among the test mode codes having the delay time greater than the delay time of the second test mode code $2^{nd}$ TM_code_P2_2 may be designated as a third test mode code $3^{rd}$ TM_code_P3_3, as indicated by an arrow 723 in FIG. 45. The delay time "−tDelay(⅜)" of the third test mode code $3^{rd}$ TM_code_P3_3 may be a half of a sum of the delay time "−tDelay(¼)" of the second test mode code $2^{nd}$ TM_code_P2_2 and the delay time "−tDelay(½)" of the first test mode code $1^{ST}$ TM_code_P1_1.

In the previous process, if the third sampling circuit output signal SCO2_3 of the third data strobe signal DQS2_3 of the first non-representative memory device 110-2 having the delay time "−tDelay(¼)" corresponding to the second test mode code $2^{nd}$ TM_code_P2_2 is a low level signal at the step 630-5 of FIG. 42 when the first test mode code $1^{ST}$ TM_code_P1_2 and the second test mode code $2^{nd}$ TM_code_P2_2 are designated, it means that the third data strobe signal DQS2_3 is transmitted to the controller 420 later than a point in time when the internal delay clock signal Internal_CKD of the controller 420 is generated. Thus, in such a case, a test mode code corresponding to a delay time "−tDelay(⅛)" among the test mode codes having the delay time less than the delay time of the second test mode code $2^{nd}$ TM_code_P2_2 may be designated as a third test mode code $3^{rd}$ TM_code_P3_4, as indicated by an arrow 724 in FIG. 45. The delay time "−tDelay(⅛)" of the third test mode code $3^{rd}$ TM_code_P3_4 may be a half of the delay time "−tDelay(¼)" of the second test mode code $2^{nd}$ TM_code_P2_2.

In the previous process, if the third sampling circuit output signal SCO2_3 of the third data strobe signal DQS2_3 of the first non-representative memory device 110-2 having the delay time "+ tDelay(¼)" corresponding to the second test mode code $2^{nd}$ TM_code_P2_3 is a high level signal at the step 630-5 of FIG. 42 when the first test mode code $1^{ST}$ TM_code_P1_2 and the second test mode code $2^{nd}$ TM_code_P2_3 are designated, it means that the third data strobe signal DQS2_3 is transmitted to the controller 420 earlier than a point in time when the internal delay clock signal Internal_CKD of the controller 420 is generated. Thus, in such a case, a test mode code corresponding to a delay time "+ tDelay(⅛)" among the test mode codes having the delay time greater than the delay time of the second test mode code $2^{nd}$ TM_code_P2_3 may be designated as a third test mode code $3^{rd}$ TM_code_P3_5, as indicated by an arrow 725 in FIG. 45. The delay time "+ tDelay(⅛)" of the third test mode code $3^{rd}$ TM_code_P3_5 may be a half of the delay time "+ tDelay(¼)" of the second test mode code $2^{nd}$ TM_code_P2_3.

In the previous process, if the first test mode code $1^{ST}$ TM_code_P1_2 and the second test mode code $2^{nd}$ TM_code_P2_3 are designated and the third sampling circuit output signal SCO2_3 of the third data strobe signal DQS2_3 of the first non-representative memory device 110-2 having the delay time "+ tDelay(¼)" corresponding to the second test mode code $2^{nd}$ TM_code_P2_3 is a low level signal at the step 630-5 of FIG. 42, it means that the third data strobe signal DQS2_3 is transmitted to the controller 420 later than a point in time when the internal delay clock signal Internal_CKD of the controller 420 is generated. Thus, in such a case, a test mode code corresponding to a delay time "+ tDelay(⅜)" among the test mode codes having the delay time less than the delay time of the second test mode code $2^{nd}$ TM_code_P2_3 may be designated as a third test mode code $3^{rd}$ TM_code_P3_6, as indicated by an arrow 726 in FIG. 45. The delay time "+ tDelay(⅜)" of the third test mode code $3^{rd}$ TM_code_P3_6 may be a half of a sum of the delay time "+ tDelay(¼)" of the second test mode code $2^{nd}$ TM_code_P2_3 and the delay time "+ tDelay(½)" of the first test mode code $1^{st}$ TM_code_P1_2.

In the previous process, if the third sampling circuit output signal SCO2_3 of the third data strobe signal DQS2_3 of the first non-representative memory device 110-2 having the delay time "+ tDelay(¾)" corresponding to the second test mode code $2^{nd}$ TM_code_P2_4 is a high level signal at the step 630-5 of FIG. 42 when the first test mode code $1^{ST}$ TM_code_P1_2 and the second test mode code $2^{nd}$ TM_code_P2_4 are designated, it means that the third data strobe signal DQS2_3 is transmitted to the controller 420 earlier than a point in time when the internal delay clock signal Internal_CKD of the controller 420 is generated. Thus, in such a case, a test mode code corresponding to a delay time "+ tDelay(⅝)" among the test mode codes having the delay time greater than the delay time of the second test mode code $2^{nd}$ TM_code_P2_4 may be designated as a third test mode code $3^{rd}$ TM_code_P3_7, as indicated by an arrow 727 in FIG. 45. The delay time "+ tDelay(⅝)" of the third test mode code $3^{rd}$ TM_code_P3_7 may be a half of a sum of the delay time "+ tDelay(¾)" of the second test mode code $2^{nd}$ TM_code_P2_4 and the delay time "+ tDelay(½)" of the first test mode code $1^{st}$ TM_code_P1_2.

In the previous process, if the first test mode code $1^{ST}$ TM_code_P1_2 and the second test mode code $2^{nd}$ TM_code_P2_4 are designated and the third sampling circuit output signal SCO2_3 of the third data strobe signal DQS2_3 of the first non-representative memory device 110-2 having the delay time "+ tDelay(¾)" corresponding to the second test mode code $2^{nd}$ TM_code_P2_4 is a low level signal at the step 630-5 of FIG. 42, it means that the third data strobe signal DQS2_3 is transmitted to the controller 420 later than a point in time when the internal delay clock signal Internal_CKD of the controller 420 is generated. Thus, in such a case, a test mode code corresponding to a delay time "+ tDelay(⅞)" among the test mode codes having the delay time less than the delay time of the second test mode code $2^{nd}$ TM_code_P2_4 may be designated as a third test mode code $3^{rd}$ TM_code_P3_8, as indicated by an arrow 728 in FIG. 45. The delay time "+ tDelay(⅞)" of the third test mode code $3^{rd}$ TM_code_P3_8 may be a half of a sum of the delay time "+ tDelay(¾)" of the second test mode code $2^{nd}$ TM_code_P2_4 and the delay time "+ tDelay" of the maximum delay decrease test mode code MAX+ TM_code.

As described above, a delay time of a data strobe signal of a first non-representative memory device may be determined by iteratively executing the same process until one test mode code is finally designated, thereby synchronizing the data strobe signal with an internal delay clock signal of a controller. In general, when the number of bits included in a binary stream of each of test mode codes is "K", the number of the test mode codes may be "$2^K$" and the test mode code finally trained by the SAR method may be designated by iteratively executing a process from the step 630-3 to the step 630-9 of FIG. 42 "K" times. That is, a training process of a memory system including a plurality of non-representative memory devices may be finished by iteratively executing the steps 630-3 to 630-9 of FIG. 42 "K" times for each of the non-representative memory devices.

Figure 46:
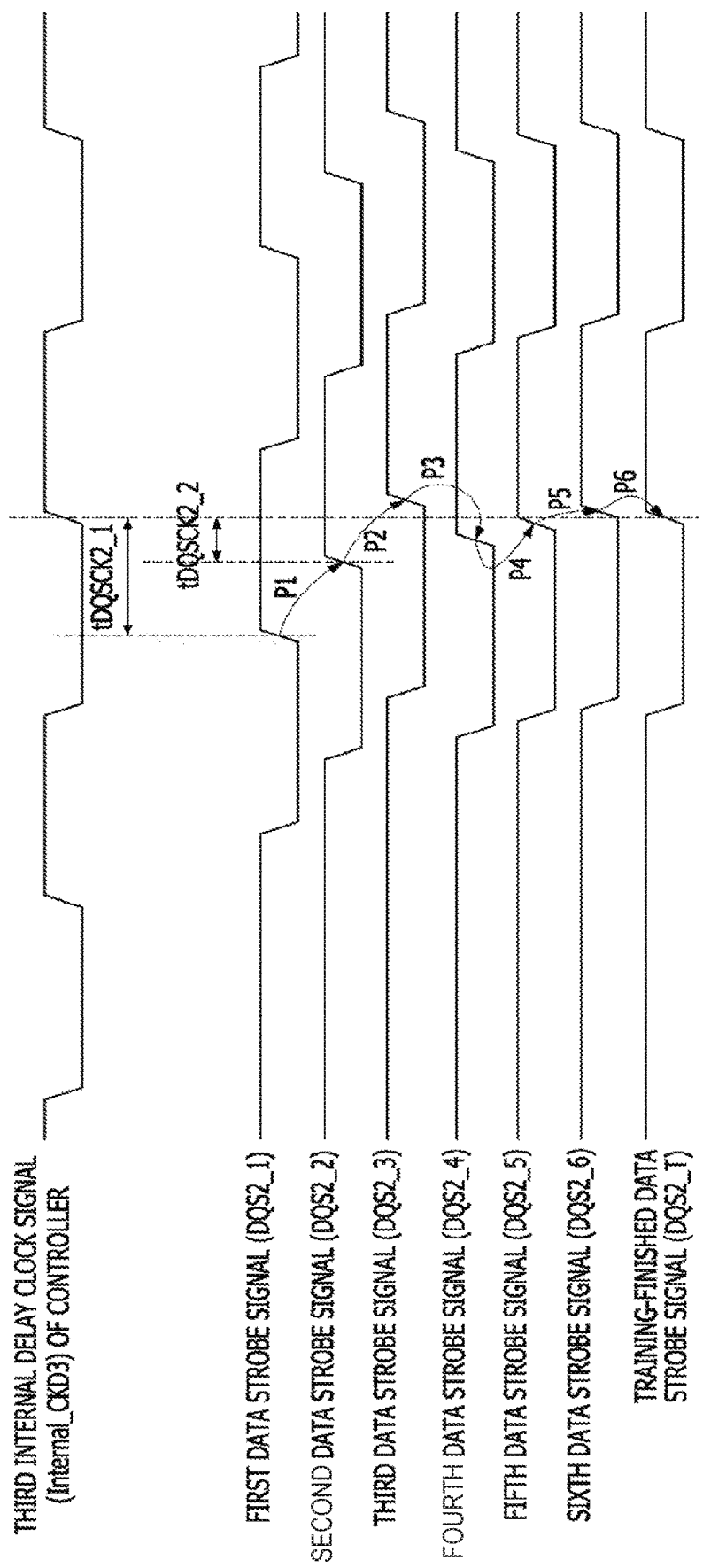
FIG. 46 is a timing diagram illustrating an example of variation of a delay time of the data strobe signal of the first non-representative memory device together with an internal delay clock signal during a training operation of the first non-representative memory device.

FIG. 46 is a timing diagram illustrating an example of variation of a delay time of the data strobe signal of the first non-representative memory device 110-2 together with the internal delay clock signal of the controller during a training operation of the first non-representative memory device 110-2, and FIGS. 47 to 53 illustrate a process of selecting a test mode code using the SAR method. The training operation of the first non-representative memory device 110-2 according to the present embodiment may be performed by first to sixth processes P1, . . . , and P6. First, referring to FIG. 46, the first process P1 of the training operation of the first non-representative memory device 110-2 may be defined as a process that generates a second data strobe signal DQS2_2 whose delay time is controlled by performing a sampling operation of a first data strobe signal DQS2_1 having a delay time corresponding to an initial test mode code Initial_TM_code and by transmitting a first test mode code selected by the SAR method according to a result of the sampling operation to the first non-representative memory device 110-2. Specifically, the first data strobe signal DQS2_1 of the first non-representative memory device 110-2 having a replica delay time corresponding to the initial test mode code of "100000" may have a timing skew of "tDQSCK2_1" when a rising edge of the third internal delay clock signal Internal_CKD3 is used as a reference point in time. That is, as described with reference to FIG. 27, the first data strobe signal DQS2_1 of the first non-representative memory device 110-2 transmitted from the representative memory device 110-1 to the controller 420 may exhibit the real delay time of "tRealDelay2_1" which is less than the replica delay time of "tReplicaDelay2_1". This may correspond to a case that a delay time in the representative memory device 110-1 is less than a delay time in the first non-representative memory device 110-2, as described with reference to FIG. 10. Thus, the first data strobe signal DQS2_1 of the first non-representative memory device 110-2 transmitted from the representative memory device 110-1 to the controller 420 may be a signal preceding by the timing skew of "tDQSCK2_1" when a rising edge of the third internal delay clock signal Internal_CKD3 is used as a reference point in time.

Because the first data strobe signal DQS2_1 of the first non-representative memory device 110-2 is a high level signal at a rising edge of the third internal delay clock signal Internal_CKD3 inputted to the sampling circuit 424, the sampling circuit 424 may output a high level signal as the first sampling circuit output signal SCO2_1. Thus, as described with reference to FIG. 40, the test mode code generating circuit 427-1 of the SAR controller 427 may output a binary stream of "100000". The SAR control circuit 427-2 may receive the binary stream of "100000" from the test mode code generating circuit 427-1, and may output a control signal for selecting one of the test mode codes whose MSB signals (TM<5>) have a logic "high" level to the test mode code table 427-3. One of the test mode codes whose MSB signals (TM<5>) have a logic "high" level may be selected using the SAR method. Specifically, as illustrated in FIG. 46, the test mode codes in the test mode code table 427-3 may be categorized as either a first group of test mode codes or a second group of test mode codes. The first group of test mode codes may include the test mode codes whose MSB signals (TM<5>) have a logic "low" level, and the second group of test mode codes may include the test mode codes whose MSB signals (TM<5>) have a logic "high" level. In the present embodiment, because the MSB signals (TM<5>) are high level signals having a logic "high" level, on the second group of test mode codes may be selected as the first test mode code.

The second group of test mode codes, the MSB signals (TM<5>) of which are high level signals, among all of the test mode codes listed in the table of FIG. 47 are listed in FIG. 48. In an embodiment, the SAR control circuit 427-2 may select a test mode code located at a mid-position of the second group of test mode codes as the first test mode code, as illustrated in FIG. 48. In the present embodiment, a delay time corresponding to the first test mode code may be "−300 picoseconds". The delay time corresponding to the first test mode code may be greater than a delay time corresponding to the initial test mode code Initial_TM_code. Accordingly, a timing skew with the third internal delay clock signal Internal_CKD3 of the controller 420 may also be reduced. Alternatively, the first test mode code may be selected by designating bits other than the bit having the determined value. That is, in the first process P1, the SAR control circuit 427-2 may select a test mode code (i.e., "110000") corresponding to a binary stream, a second high-order bit (TM<4>) of which has a logic "high" level and the remaining low-order bits (TM<0:3>) of which have a logic "low" level, among the second group of test mode codes as the first test mode code.

Referring again to FIG. 46, the second process P2 of the training operation of the first non-representative memory device 110-2 may be defined as a process that generates a third data strobe signal DQS2_3 whose delay time is controlled by performing a sampling operation of the second data strobe signal DQS2_2 having a delay time corresponding to the first test mode code and by transmitting a second test mode code selected by the SAR method according to a result of the sampling operation of the second data strobe signal DQS2_2 to the first non-representative memory device 110-2. Specifically, the second data strobe signal DQS2_2 of the first non-representative memory device 110-2 having a delay time of −330 picoseconds corresponding to the first test mode code of "110000" may have a timing skew of "tDQSCK2_2" when a rising edge of the third internal delay clock signal Internal_CKD3 is used as a reference point in time. Because a delay time of the second data strobe signal DQS2_2 becomes more increased as compared with first data strobe signal DQS2_1 by the first process P1, the timing skew "tDQSCK2_2" of the second data strobe signal DQS2_2 may become less than the timing skew "tDQSCK2_1" of the first data strobe signal DQS2_1.

Because the second data strobe signal DQS2_2 of the first non-representative memory device 110-2 is a high level signal at a rising edge of the third internal delay clock signal Internal_CKD3 inputted to the sampling circuit 424, the sampling circuit 424 may output a high level signal as the second sampling circuit output signal SCO2_2. Thus, as described with reference to FIG. 40, the test mode code generating circuit 427-1 of the SAR controller 427 may output a binary stream of "010000". Thus, the fifth test mode signal TM<4> corresponding to the fifth bit signal of the test mode code may be determined to be a high level signal having a logic "high" level. As the fifth test mode signal TM<4> of the test mode code is determined to be a high level signal, the SAR control circuit 427-2 receiving the binary stream of "010000" from the test mode code generating circuit 427-1 may generate a control signal for selecting a test mode code having an increased delay time as the second test mode code. Specifically, the SAR control circuit 427-2 may perform a control operation to select one of the test mode codes, each of which includes the MSB (TM<5>) determined to be a high level signal in the first process P1 and the second MSB (TM<4>) determined to be a high level signal in the second process P2, using the SAR method.

As illustrated in FIG. 49, because a delay time corresponding to the second test mode code has to be greater than a delay time corresponding to the first test mode code, a test mode code (having a binary stream of "111000") located at a mid-position of the test mode codes between the first test mode and the maximum delay increase test mode code MAX-TM_code (i.e., −630 picoseconds) among the second group of test mode codes may be selected as the second test mode code. Alternatively, the SAR control circuit 427-2 may select a test mode code (i.e., "111000") corresponding to a binary stream, a third high-order bit (TM<3>) of which has a logic "high" level and the remaining low-order bits (TM<0:2>) of which have a logic "low" level, among the test mode codes including the MSB (TM<5>) determined to be a high level signal in the first process P1 and the second MSB (TM<4>) determined to be a high level signal in the second process P2 as the second test mode code.

Referring again to FIG. 46, the third process P3 of the training operation of the first non-representative memory device 110-2 may be defined as a process that generates a fourth data strobe signal DQS2_4 whose delay time is controlled by performing a sampling operation of the third data strobe signal DQS2_3 having a delay time corresponding to the second test mode code and by transmitting a third test mode code selected by the SAR method according to a result of the sampling operation of the third data strobe signal DQS2_3 to the first non-representative memory device 110-2. Specifically, the third data strobe signal DQS2_3 of the first non-representative memory device 110-2 having a delay time of −490 picoseconds corresponding to the second test mode code of "111000" may have a logic "low" level at a rising edge of the third internal delay clock signal Internal_CKD3 inputted to the sampling circuit 424. Accordingly, the sampling circuit 424 may output a low level signal as the third sampling circuit output signal SCO2_3. Thus, as described with reference to FIG. 40, the test mode code generating circuit 427-1 of the SAR controller 427 may output a binary stream of "000000". As a result, the fourth test mode signal is TM<3> corresponding to the fourth bit signal of the test mode code may be determined to be a low level signal having a logic "low" level. As the fourth test mode signal TM<3> of the test mode code is determined to be a low level signal, the SAR control circuit 427-2 receiving the binary stream of "000000" from the test mode code generating circuit 427-1 may generate a control signal for selecting a test mode code having a reduced delay time as the third test mode code. Specifically, the SAR control circuit 427-2 may perform a control operation to select one of the test mode codes, each of which includes the MSB (TM<5>) determined to be a high level signal in the first process P1, the second MSB (TM<4>) determined to be a high level signal in the second process P2, and the third MSB (TM<3>) determined to be a low level signal in the third process P3, using the SAR method.

As illustrated in FIG. 50, because a delay time corresponding to the third test mode code has to be less than a delay time corresponding to the second test mode code, a test mode code (having a binary stream of "110100") located at a mid-position of the test mode codes between the first test mode and the second test mode code among the second group of test mode codes may be selected as the third test mode code. Alternatively, the SAR control circuit 427-2 may select a test mode code (i.e., "110100") corresponding to a binary stream, a fourth high-order bit (TM<2>) of which has a logic "high" level and the remaining low-order bits is (TM<0:1>) of which have a logic "low" level, among the test mode codes including the MSB (TM<5>) determined to be a high level signal in the first process P1, the second MSB (TM<4>) determined to be a high level signal in the second process P2, and the third MSB (TM<3>) determined to be a low level signal in the third process P3, as the third test mode code.

Referring again to FIG. 46, the fourth process P4 of the training operation of the first non-representative memory device 110-2 may be defined as a process that generates a fifth data strobe signal DQS2_5 whose delay time is controlled by performing a sampling operation of the fourth data strobe signal DQS2_4 having a delay time corresponding to the third test mode code and by transmitting a fourth test mode code selected by the SAR method according to a result of the sampling operation of the fourth data strobe signal DQS2_4 to the first non-representative memory device 110-2. Specifically, the fourth data strobe signal DQS2_4 of the first non-representative memory device 110-2 having a delay time of −410 picoseconds corresponding to the third test mode code of "110100" may have a logic "high" level at a rising edge of the third internal delay clock signal Internal_CKD3 inputted to the sampling circuit 424. Accordingly, the sampling circuit 424 may output a high level signal as the fourth sampling circuit output signal SCO2_4. Thus, as described with reference to FIG. 40, the test mode code generating circuit 427-1 of the SAR controller 427 may output a binary stream of "000100". As a result, the third test mode signal TM<2> corresponding to the third bit signal of the test mode code may be determined to be a high level signal having a logic "high" level. As the third test mode signal TM<2> of the test mode code is determined to be a high level signal, the SAR control circuit 427-2 receiving the binary stream of "000100" from the test mode code generating circuit 427-1 may generate a control signal for selecting a test mode code having an increased delay time as the fourth test mode code. Specifically, the SAR control circuit 427-2 may perform a control operation to select one of the test mode codes, each of which includes the MSB (TM<5>) determined to be a high level signal in the first process P1, the second MSB (TM<4>) determined to be a high level signal in the second process P2, the third MSB (TM<3>) determined to be a low level signal in the third process P3, and the fourth MSB (TM<2>) determined to be a high level signal in the fourth process P4, using the SAR method.

As illustrated in FIG. 51, because a delay time corresponding to the fourth test mode code has to be greater than a delay time corresponding to the third test mode code, a test mode code (having a binary stream of "110110") located at a mid-position of the test mode codes between the second test mode and the third test mode code among the second group of test mode codes may be selected as the fourth test mode code. Alternatively, the SAR control circuit 427-2 may select a test mode code (i.e., "110110") corresponding to a binary stream, a fifth high-order bit (TM<1>) of which has a logic "high" level and the remaining low-order bit (TM<0>) of which has a logic "low" level, among the test mode codes including the MSB (TM<5>) determined to be a high level signal in the first process P1, the second MSB (TM<4>) determined to be a high level signal in the second process P2, the third MSB (TM<3>) determined to be a low level signal in the third process P3, and the fourth MSB (TM<2>) determined to be a high level signal in the fourth process P4, as the fourth test mode code.

Referring again to FIG. 46, the fifth process P5 of the training operation of the first non-representative memory device 110-2 may be defined as a process that generates a sixth data strobe signal DQS2_6 whose delay time is controlled by performing a sampling operation of the fifth data strobe signal DQS2_5 having a delay time corresponding to the fourth test mode code and by transmitting a fifth test mode code selected by the SAR method according to a result of the sampling operation of the fifth data strobe signal DQS2_5 to the first non-representative memory device 110-2. Specifically, the fifth data strobe signal DQS2_5 of the first non-representative memory device 110-2 having a delay time of −450 picoseconds corresponding to the fourth test mode code of "110110" may have a logic "high" level at a rising edge of the third internal delay clock signal Internal_CKD3 inputted to the sampling circuit 424. Accordingly, the sampling circuit 424 may output a high level signal as the fifth sampling circuit output signal SCO2_5. Thus, as described with reference to FIG. 40, the test mode code generating circuit 427-1 of the SAR controller 427 may output a binary stream of "000010". As a result, the second test mode signal TM<1> corresponding to the second bit signal of the test mode code may be determined to be a high level signal having a logic "high" level. As the second test mode signal TM<1> of the test mode code is determined to be a high level signal, the SAR control circuit 427-2 receiving the binary stream of "000010" from the test mode code generating circuit 427-1 may generate a control signal for selecting a test mode code having an increased delay time as the fifth test mode code. Specifically, the SAR control circuit 427-2 may perform a control operation to select one of the test mode codes, each of which includes the MSB (TM<5>) determined to be a high level signal in the first process P1, the second MSB (TM<4>) determined to be a high level signal in the second process P2, the third MSB (TM<3>) determined to be a low level signal in the third process P3, the fourth MSB (TM<2>) determined to be a high level signal in the fourth process P4, and the fifth MSB (TM<1>) determined to be a high level signal in the fifth process P5, using the SAR method.

As illustrated in FIG. 52, because a delay time corresponding to the fifth test mode code has to be greater than a delay time corresponding to the fourth test mode code, a test mode code (having a binary stream of "110111") located at a mid-position of the test mode codes between the second test mode and the fourth test mode code among the second group of test mode codes may be selected as the fifth test mode code. Alternatively, the SAR control circuit 427-2 may select a test mode code (i.e., "110111") corresponding to a binary stream, the LSB (TM<0>) of which has a logic "high" level, among the test mode codes including the MSB (TM<5>) determined to be a high level signal in the first process P1, the second MSB (TM<4>) determined to be a high level signal in the second process P2, the third MSB (TM<3>) determined to be a low level signal in the third process P3, the fourth MSB (TM<2>) determined to be a high level signal in the fourth process P4, and the fifth MSB (TM<1>) determined to be a high level signal in the fifth process P5, as the fifth test mode code.

Referring again to FIG. 46, the sixth process P6 of the training operation of the first non-representative memory device 110-2 may be defined as a process that generates a training-finished data strobe signal DQS2_T by performing a sampling operation of the sixth data strobe signal DQS2_6 having a delay time corresponding to the fifth test mode code and by transmitting a sixth test mode code selected by the SAR method according to a result of the sampling operation of the sixth data strobe signal DQS2_6 to the first non-representative memory device 110-2. Specifically, the sixth data strobe signal DQS2_6 of the first non-representative memory device 110-2 having a delay time of −470 picoseconds corresponding to the fifth test mode code of "110111" may have a logic "low" level at a rising edge of the third internal delay clock signal Internal_CKD3 inputted to the sampling circuit 424. Accordingly, the sampling circuit 424 may output a low level signal as the sixth sampling circuit output signal SCO2_6. Thus, as described with reference to FIG. 40, the test mode code generating circuit 427-1 of the SAR controller 427 may output a binary stream of "000000". As a result, the first test mode signal TM<0> corresponding to the first bit signal of the test mode code may be determined to be a low level signal having a logic "low" level. As the first test mode signal TM<0> of the test mode code is determined to be a low level signal, the SAR control circuit 427-2 receiving the binary stream of "000010" from the test mode code generating circuit 427-1 may generate a control signal for selecting a test mode code having a reduced delay time as the sixth test mode code for terminating the training process. Specifically, the SAR control circuit 427-2 may perform a control operation to select one of the test mode codes, each of which includes the MSB (TM<5>) determined to be a high level signal in the first process P1, the second MSB (TM<4>) determined to be a high level signal in the second process P2, the third MSB (TM<3>) determined to be a low level signal in the third process P3, the fourth MSB (TM<2>) determined to be a high level signal in the fourth process P4, the fifth MSB (TM<1>) determined to be a high level signal in the fifth process P5, and the LSB (TM<0>) determined to be a low level signal in the sixth process P6, using the SAR method.

As illustrated in FIG. 53, because a delay time corresponding to the sixth test mode code has to be less than a delay time corresponding to the fifth test mode code, a test mode code (having a binary stream of "110110") located at a level lower than the fifth test mode code by one step may be selected as the sixth test mode code. Alternatively, the SAR control circuit 427-2 may select a test mode code (i.e., "110110") corresponding to a binary stream which is comprised of the MSB (TM<5>) determined to be a high level signal in the first process P1, the second MSB (TM<4>) determined to be a high level signal in the second process P2, the third MSB (TM<3>) determined to be a low level signal in the third process P3, the fourth MSB (TM<2>) determined to be a high level signal in the fourth process P4, the fifth MSB (TM<1>) determined to be a high level signal in the fifth process P5, and the LSB (TM<0>) determined to be a low level signal in the sixth process P6, as the sixth test mode code. As the sixth test mode code is determined, the first non-representative memory device 110-2 may generate the data strobe signal DQS2 whose delay time is increased by a period (i.e., 450 picoseconds) corresponding to the sixth test mode code.

According to the various embodiments described above, in a memory system including a representative memory device independently operating and a plurality of non-representative memory devices dependently operating, a training operation of each of the plurality of non-representative memory devices may be performed such that a data strobe signal of each non-representative memory device has a phase which is consistent with a phase of an internal clock signal of a controller included in the memory system. Thus, it may be unnecessary to dispose a plurality of delay blocks for synchronizing data strobe signals of the plurality of non-representative memory devices in the controller. As a result, it may prevent an area of the controller from increasing due to the plurality of delay blocks for training the plurality of non-representative memory devices.

The embodiments of the disclosed technology have been disclosed above for illustrative purposes. Those of ordinary skill in the art will appreciate that various modifications, additions, and substitutions are possible. While this patent document contains many specifics, these should not be construed as limitations on the scope of the present disclosure, but rather as descriptions of features that may be specific to particular embodiments of the present disclosure. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

What is claimed is:

1. A memory system comprising:
a representative memory device configured to directly output a representative data strobe signal;
at least one non-representative memory device configured to output a non-representative data strobe signal through the representative memory device; and
a controller configured to generate an internal delay clock signal which is synchronized with the representative data strobe signal,
wherein the controller is configured to output a test mode code defining a delay time using the internal delay clock signal as a reference signal,
wherein the at least one non-representative memory device adjusts a phase of the non-representative data strobe signal such that the non-representative data strobe signal has a delay time corresponding to the test mode code, and
wherein each of the representative memory device and the at least one non-representative memory device includes:
a delay lock loop (DLL) circuit configured to output a DLL clock signal having a delay time corresponding to the test mode code outputted from the controller; and
a trigger circuit configured to generate the representative data strobe signal or the non-representative data strobe signal synchronized with the DLL clock signal.

2. The memory system of claim 1, wherein the representative memory device and the at least one non-representative memory device are vertically stacked on a substrate to form a memory package.

3. The memory system of claim 1, wherein each of the representative memory device and the at least one non-representative memory device further includes a rupture circuit that receives memory repair data from the controller to perform a rupture operation.

4. The memory system of claim 3,
wherein the representative memory device further includes a first chip pad through which the representative data strobe signal or the non-representative data strobe signal is outputted to the controller; and
wherein the at least one non-representative memory device further includes a second chip pad to which the test mode code outputted from the controller is inputted and a third chip pad to which the memory repair data outputted from the controller are inputted.

5. The memory system of claim 4, wherein the at least one non-representative memory device transmits the non-representative data strobe signal generated by the trigger circuit of the at least one non-representative memory device to the controller through the first chip pad of the representative memory device.

6. The memory system of claim 1, wherein the DLL circuit includes:
a main delay circuit configured to include a plurality of unit delay circuits, wherein each of the plurality of unit delay circuits delays an input clock signal by a first delay time to output the delayed input clock signal as an output clock signal; and
an additional delay circuit configured to include a first group of tri-state inverters additionally delaying the output clock signal in response to a first enablement signal to output the additionally delayed output clock signal and a second group of tri-state inverters outputting the output clock signal in response to a second enablement signal.

7. The memory system of claim 6,
wherein the plurality of unit delay circuits are coupled in series;
wherein the input clock signal is inputted to a first unit delay circuit of the plurality of unit delay circuits;
wherein the output clock signal is outputted from a last unit delay circuit of the plurality of unit delay circuits; and
wherein the plurality of unit delay circuits are configured to receive one group of bit signals among two groups of bit signals constituting a binary stream corresponding to the test mode code, respectively.

8. The memory system of claim 6,
wherein the test mode code includes a first group of bit signals and a second group of bit signals;
wherein the additional delay circuit further includes an additional unit delay circuit that delays the output clock signal by a second delay time to output the delayed output clock signal to the first group of tri-state inverters;
wherein the first group of tri-state inverters are configured to receive the second group of bit signals, respectively; and
wherein the second group of tri-state inverters are configured to receive inverted signals of the second group of bit signals, respectively.

9. The memory system of claim 1, wherein the controller includes:
a sampling circuit configured to perform a sampling operation of the representative data strobe signal or the non-representative data strobe signal;
a first delay control block configured to generate a first control signal for determining a delay of an internal clock signal of the controller according to a level of a first sampling circuit output signal outputted from the sampling circuit;
a delay circuit configured to output the internal delay clock signal, generated by delaying the internal clock signal in response to the first control signal, to the sampling circuit;
a second delay control block configured to generate a second control signal according to a level of a second sampling circuit output signal outputted from the sampling circuit; and
a delay code register including a test mode code table storing a plurality of test mode codes and configured to output one of the plurality of test mode codes in response to the second control signal.

10. The memory system of claim 9, wherein the sampling circuit includes a D-flip-flop.

11. The memory system of claim 9,
wherein the first sampling circuit output signal is obtained by sampling the representative data strobe signal; and
wherein the second sampling circuit output signal is obtained by sampling the non-representative data strobe signal.

12. The memory system of claim 11, wherein the sampling circuit is configured to:
output a high level signal as the first and second sampling circuit output signals when the representative data strobe signal or the non-representative data strobe signal inputted in synchronization with a rising edge of the internal delay clock signal is a high level signal; and
output a low level signal as the first and second sampling circuit output signals when the representative data strobe signal or the non-representative data strobe signal inputted in synchronization with a rising edge of the internal delay clock signal is a low level signal.

13. The memory system of claim 9,
wherein the controller transmits a read signal to the representative memory device after generating the internal delay clock signal whose delay time is controlled according to the first sampling circuit output signal; and
wherein the controller transmits the read signal to the non-representative memory device after outputting the test mode code according to the second sampling circuit output signal.

14. The memory system of claim 9, wherein the plurality of test mode codes includes:
a default test mode code having delay information on a replica delay time of the non-representative memory device;
negative test mode codes for reducing a delay time corresponding to the default test mode code by a predetermined time; and
positive test mode codes for increasing a delay time corresponding to the default test mode code by a predetermined time.

15. The memory system of claim 9, further comprising a first switch configured to:
electrically connect the sampling circuit to the first delay control block until the internal delay clock signal is generated; and
electrically connect the sampling circuit to the second delay control block after the internal delay clock signal is generated.

16. The memory system of claim 1, wherein the controller includes:
- a sampling circuit configured to perform a sampling operation of the representative data strobe signal or the non-representative data strobe signal;
- a delay control block configured to generate a first control signal for determining a delay of an internal clock signal of the controller according to a level of a first sampling circuit output signal outputted from the sampling circuit;
- a delay circuit configured to output the internal delay clock signal, generated by delaying the internal clock signal in response to the first control signal, to the sampling circuit; and
- a successive approximation register (SAR) controller configured to perform a control operation for outputting a plurality of test mode codes, which are determined according to a level of a second sampling circuit output signal outputted from the sampling circuit, using an SAR method.

17. The memory system of claim 16, wherein the SAR controller includes:
- a test mode code generating circuit configured to generate an output signal corresponding to a bit signal of bit signals of a binary stream constituting each of the plurality of test mode codes according to the second sampling circuit output signal;
- an SAR control circuit configured to receive the output signal of the test mode code generating circuit to generate a control signal for selectively outputting one of the plurality of test mode codes using the SAR method; and
- a test mode code table configured to output one of the plurality of test mode codes in response to the control signal generated by the SAR control circuit.

18. The memory system of claim 17, wherein the test mode code generating circuit includes:
- a first D-flip-flop including a data input terminal receiving a power supply voltage and a clock signal input terminal receiving an SAR clock signal;
- an inverter configured to invert an output signal of the first D-flip-flop to output the inverted signal of the output signal of the first D-flip-flop;
- a shift register including a plurality of second D-flip-flops which are coupled in series and configured to sequentially shift output signals of the plurality of second D-flip-flops in synchronization with the SAR clock signal; and
- a sampling unit including a plurality of third D-flip-flops receiving an output signal of the sampling circuit,
- wherein clock signal input terminals of the plurality of third D-flip-flops are connected to output terminals of the plurality of second D-flip-flops, respectively.

19. The memory system of claim 17,
wherein the test mode code table includes the plurality of test mode codes; and
wherein when the number of bits included in the binary stream is "K", and the number of the test mode codes in the test mode code table is "$2^K$", wherein "K" is a natural number.

20. The memory system of claim 19, wherein the plurality of test mode codes includes:
- an initial test mode code;
- a first group of test mode codes disposed such that delay times of the first group of test mode codes become sequentially less than a delay time of the initial test mode code; and
- a second group of test mode codes disposed such that delay times of the second group of test mode codes become sequentially greater than a delay time of the initial test mode code.

21. The memory system of claim 20, wherein the SAR controller is configured to generate a control signal for outputting a test mode code located at a mid-position of the test mode codes having a bit signal determined by the output signal of the test mode code generating circuit.

* * * * *